United States Patent
Shin et al.

(10) Patent No.: US 12,382,826 B2
(45) Date of Patent: Aug. 5, 2025

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Ji-Cheol Shin, Paju-si (KR); Jeong-Dae Seo, Paju-si (KR); Shin-Han Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 828 days.

(21) Appl. No.: 17/548,158

(22) Filed: Dec. 10, 2021

(65) Prior Publication Data
US 2022/0199909 A1    Jun. 23, 2022

(30) Foreign Application Priority Data
Dec. 21, 2020 (KR) .................. 10-2020-0179672

(51) Int. Cl.
| | |
|---|---|
| *H10K 50/19* | (2023.01) |
| *H10K 85/60* | (2023.01) |
| *H10K 50/11* | (2023.01) |
| *H10K 50/13* | (2023.01) |
| *H10K 50/15* | (2023.01) |
| *H10K 101/30* | (2023.01) |
| *H10K 101/40* | (2023.01) |

(52) U.S. Cl.
CPC ......... *H10K 85/626* (2023.02); *H10K 85/624* (2023.02); *H10K 85/633* (2023.02); *H10K 85/6572* (2023.02); *H10K 50/11* (2023.02); *H10K 50/13* (2023.02); *H10K 50/15* (2023.02); *H10K 2101/30* (2023.02); *H10K 2101/40* (2023.02)

(58) Field of Classification Search
None
See application file for complete search history.

(56) References Cited

U.S. PATENT DOCUMENTS

| | | | | |
|---|---|---|---|---|
| 10,270,052 B2 * | 4/2019 | Voges | .................. | H10K 50/16 |
| 10,658,593 B2 | 5/2020 | Kim et al. | | |
| 2015/0155490 A1 * | 6/2015 | Ryu | .................. | H10K 85/611 |
| | | | | 558/426 |
| 2016/0141543 A1 * | 5/2016 | Gao | .................. | H10K 50/15 |
| | | | | 257/40 |
| 2017/0162792 A1 * | 6/2017 | Kim | .................. | H10K 85/621 |
| 2019/0051834 A1 | 2/2019 | Liu et al. | | |
| 2020/0144552 A1 | 5/2020 | Kim et al. | | |
| 2020/0303651 A1 | 9/2020 | Kim et al. | | |
| 2022/0285626 A1 | 9/2022 | Montenegro et al. | | |
| 2023/0389415 A1 | 11/2023 | Kim et al. | | |

FOREIGN PATENT DOCUMENTS

| | | | | |
|---|---|---|---|---|
| CN | 104114672 A | 10/2014 | | |
| CN | 107017349 A | 8/2017 | | |
| CN | 107394051 A | 11/2017 | | |
| CN | 110495005 A | 11/2019 | | |
| CN | 112094261 A | * 12/2020 | .......... | C07D 405/14 |
| KR | 10-2017-0066194 A | 6/2017 | | |
| KR | 10-2017-0111802 A | 10/2017 | | |
| KR | 10-2017-0134132 A | 12/2017 | | |
| KR | 10-2018-0131100 A | 12/2018 | | |
| KR | 10-2019-0118137 A | 10/2019 | | |

OTHER PUBLICATIONS

Machine translation of CN-112094261-A, translation generated Oct. 2024, 12 pages. (Year: 2024).*
Office Action issued in corresponding Korean Patent Application No. 10-2020-0179672, dated Sep. 13, 2024.
Office Action dated Nov. 23, 2024 corresponding China Patent Application No. 202111527469.7.

* cited by examiner

*Primary Examiner* — Robert S Loewe
(74) *Attorney, Agent, or Firm* — Morgan, Lewis & Bockius LLP

(57) ABSTRACT

The present disclosure relates to an organic light emitting diode including a first electrode; a second electrode facing the first electrode; a first emitting part positioned between the first and second electrodes and including a first emitting material layer, a hole injection layer between the first electrode and the first emitting material layer and a first hole transporting layer between the hole injection layer and the first emitting material layer, wherein the hole injection layer includes a hole injection material, and the first hole transporting layer includes at least one of a first hole transporting material and a second hole transporting material, and wherein the first hole transporting material and the second hole transporting material are fluorene derivatives having different structures.

18 Claims, 4 Drawing Sheets

ORGANIC LIGHT EMITTING DIODE AND ORGANIC LIGHT EMITTING DEVICE INCLUDING THE SAME

CROSS-REFERENCE TO RELATED APPLICATIONS

The present application claims the benefit of Korean Patent Application No. 10-2020-0179672 filed in the Republic of Korea on Dec. 21, 2020, which is hereby incorporated by reference in its entirety.

BACKGROUND

Technical Field

The present disclosure relates to an organic light emitting diode (OLED), and more particularly, to an OLED having low driving voltage and high emitting efficiency and lifespan and an organic light emitting device including the OLED.

Discussion of the Related Art

Recently, requirement for flat panel display devices having small occupied area is increased. Among the flat panel display devices, a technology of an organic light emitting display device, which includes an OLED, is rapidly developed.

The OLED emits light by injecting electrons from a cathode as an electron injection electrode and holes from an anode as a hole injection electrode into an organic emitting layer, combining the electrons with the holes, generating an exciton, and transforming the exciton from an excited state to a ground state. A flexible transparent substrate, for example, a plastic substrate, can be used as a base substrate where elements are formed. In addition, the OLED can be operated at a voltage (e.g., 10V or below) lower than a voltage required to operate other display devices and has low power consumption. Moreover, the light from the OLED has excellent color purity.

The OLED may include a first electrode as an anode, a second electrode as cathode facing the first electrode and an organic emitting layer between the first and second electrodes.

To improve the emitting efficiency of the OLED, the organic emitting layer may include a hole injection layer (HIL), a hole transporting layer (HTL), an emitting material layer (EML), an electron transporting layer (ETL) and an electron injection layer (EIL) sequentially stacked on the first electrode.

In the OLED, the hole from the first electrode as the anode is transferred into the EML through the HIL and the HTL, and the electron from the second electrode as the cathode is transferred into the EML through the EIL and the ETL. The hole and the electron are combined in the EML to form the exciton, and the exciton is transformed from an excited state to a ground state to emit the light.

To provide low driving voltage and sufficient emitting efficiency and lifespan of the OLED, sufficient hole injection efficiency and sufficient hole transporting efficiency are required.

SUMMARY

The embodiments of the present disclosure are directed to an OLED and an organic light emitting device that substantially obviate one or more of the problems associated with the limitations and disadvantages of the related conventional art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages in accordance with the purpose of the embodiments of the present disclosure, as embodied and broadly described herein, an organic light emitting diode comprises a first electrode; a second electrode facing the first electrode; and a first emitting part positioned between the first and second electrodes and including a first emitting material layer, a hole injection layer between the first electrode and the first emitting material layer and a first hole transporting layer between the hole injection layer and the first emitting material layer, wherein the hole injection layer includes a hole injection material, and the hole injection material is an organic compound represented in Formula 1-1: [Formula 1-1]

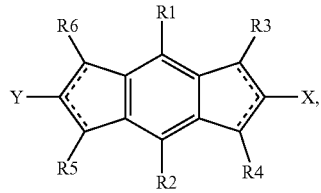

wherein each of R1 and R2 is independently selected from the group consisting of hydrogen (H), deuterium (D), halogen and cyano, wherein each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile, wherein each of X and Y is independently phenyl substituted with at least one of C1 to C10 alkyl group, halogen, cyano, malononitrile, C1 to C10 haloalkyl group and C1 to C10 haloalkoxy group, wherein the first hole transporting layer includes at least one of a first hole transporting material represented in Formula 2 and a second hole transporting material represented in Formula 3:

[Formula 2]

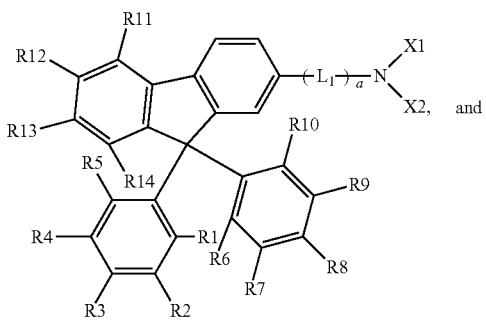

and

-continued

[Formula 3]

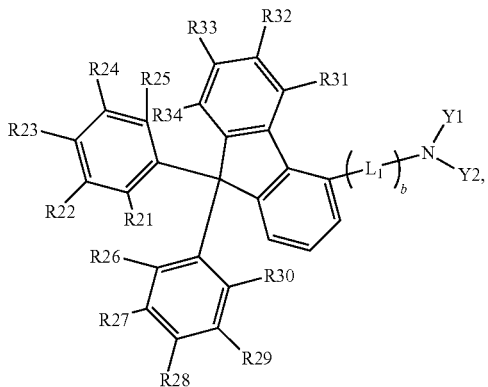

wherein in Formula 2, each of X1 and X2 is independently selected from the group consisting of C6 to C30 aryl group and C5 to C30 heteroaryl group, and L1 is selected from the group consisting of C6 to C30 arylene group and C5 to C30 heteroarylene group, wherein a is 0 or 1, wherein each of R1 to R14 is independently selected from the group consisting of H, D, C1 to C10 alkyl group, C6 to C30 aryl group and C5 to C30 heteroaryl group, or adjacent two of R1 to R14 are connected to each other to form a fused ring, wherein in Formula 3, each of Y1 and Y2 is independently selected from the group consisting of C6 to C30 aryl group and C5 to C30 heteroaryl group, L1 is selected from the group consisting of C6 to C30 arylene group and C5 to C30 heteroarylene group, wherein b is 0 or 1, and wherein each of R21 to R34 is independently selected from the group consisting of H, D, C1 to C10 alkyl group, C6 to C30 aryl group and C5 to C30 heteroaryl group, or adjacent two of R21 to R34 are connected to each other to form a fused ring.

Another aspect of the present disclosure is an organic light emitting device comprising a substrate; the above organic light emitting diode positioned on the substrate; and an encapsulation film covering the organic light emitting diode.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain principles of the present disclosure.

DETAILED DESCRIPTION

Reference will now be made in detail to some of the examples and preferred embodiments, which are illustrated in the accompanying drawings.

The present disclosure relates an OLED and an organic light emitting device including the OLED. For example, the organic light emitting device may be an organic light emitting display device or an organic lightening device. As an example, an organic light emitting display device, which is a display device including the OLED of the present disclosure, will be mainly described.

Figure 1:
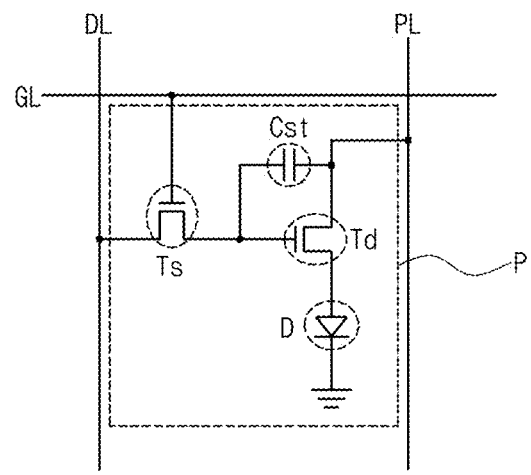
FIG. 1 is a schematic circuit diagram of an organic light emitting display device of the present disclosure.

FIG. 1 is a schematic circuit diagram illustrating an organic light emitting display device of the present disclosure.

As illustrated in FIG. 1, a gate line GL and a data line DL, which cross each other to define a pixel (pixel) P, and a power line PL are formed in an organic light display device. A switching thin film transistor (TFT) Ts, a driving TFT Td, a storage capacitor Cst and an OLED D are formed in the pixel P. The pixel P may include a red pixel, a green pixel and a blue pixel. In addition, the pixel P may further include a white pixel.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Tr. The OLED D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
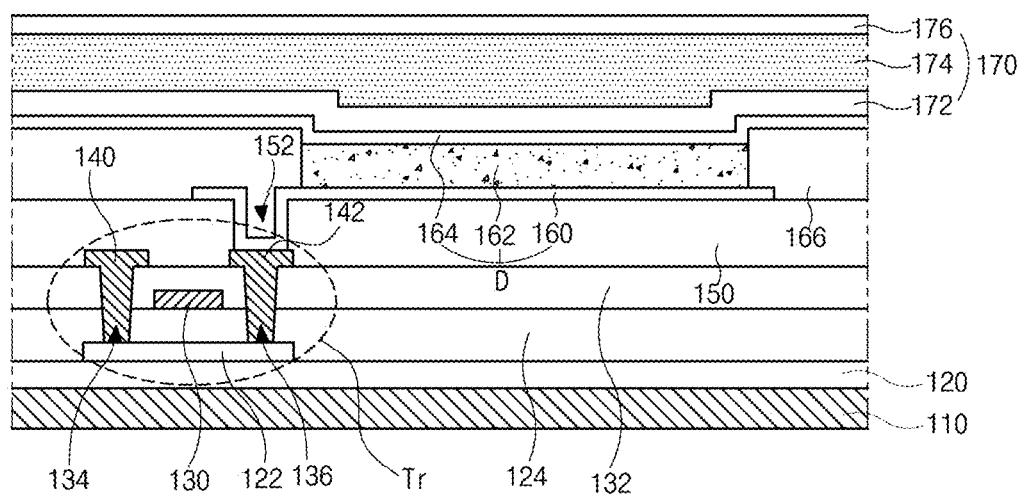
FIG. 2 is a schematic cross-sectional view of an organic light emitting device according to a first embodiment of the present disclosure.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D disposed on a planarization layer 150 and connected to the TFT Tr. For example, the organic light emitting display device 100 may include a red pixel, a green pixel and a blue pixel, and the OLED D may be formed in each of the red, green and blue pixels. Namely, the OLEDs D emitting red light, green light and blue light may be provided in the red, green and blue pixels, respectively.

The substrate 110 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 are formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel and on the planarization layer 150. The first electrode 160 may be an anode and may be formed of a conductive material, e.g., a transparent conductive oxide (TCO), having a relatively high work function. For example, the first electrode 160 may be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc-oxide (Al:ZnO, AZO).

When the organic light emitting display device 100 is operated in a bottom-emission type, the first electrode 160 may have a single-layered structure of the transparent conductive oxide. When the organic light emitting display device 100 is operated in a top-emission type, a reflection electrode or a reflection layer may be formed under the first electrode 160. For example, the reflection electrode or the reflection layer may be formed of silver (Ag) or aluminum-palladium-copper (APC) alloy. In this instance, the first electrode 160 may have a triple-layered structure of ITO/Ag/ITO or ITO/APC/ITO.

A bank layer 166 is formed on the planarization layer 150 to cover an edge of the first electrode 160. Namely, the bank layer 166 is positioned at a boundary of the pixel and exposes a center of the first electrode 160 in the pixel.

An organic emitting layer 162 is formed on the first electrode 160. The organic emitting layer 162 includes an emitting material layer (EML) including a light emitting material, a hole injection layer (HIL) under the EML and a hole transporting layer (HTL) between the EML and the HIL. In addition, the organic emitting layer 162 may further include at least one of an electron blocking layer (EBL), a hole blocking layer (HBL), an electron transporting layer (ETL) and an electron injection layer (EIL).

As described below, the HIL includes an indacene derivative (e.g., indacene compound) substituted with malononitrile group as a hole injection material, and the HTL includes fluorene derivatives having different structures as first and second hole transporting materials. As a result, the hole is efficiently injected and transported from the anode into the EML.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg), silver (Ag) or their alloy, e.g., Al—Mg alloy (AlMg) or Ag—Mg alloy (MgAg). In the top-emission type organic light emitting display device 100, the second electrode 164 may have a thin profile (small thickness) to provide a light transmittance property (or a semi-transmittance property).

Namely, one of the first and second electrodes 160 and 164 is a transparent (or semi-transparent) electrode, and the other one of the first and second electrodes 160 and 164 is a reflection electrode.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

The organic light emitting display device 100 may further include a color filter layer (not shown). The color filter layer may include a red color filter, a green color filter and a blue color filter respectively corresponding to the red pixel, the green pixel and the blue pixel. The color purity of the organic light emitting display device 100 may be improved by the color filter layer.

The organic light emitting display device 100 may further include a polarization plate (not shown) for reducing an ambient light reflection. For example, the polarization plate may be a circular polarization plate. In the bottom-emission type organic light emitting display device 100, the polarization plate may be disposed under the substrate 110. In the top-emission type organic light emitting display device 100, the polarization plate may be disposed on or over the encapsulation film 170.

In addition, in the top-emission type organic light emitting display device 100, a cover window (not shown) may be attached to the encapsulation film 170 or the polarization plate. In this instance, the substrate 110 and the cover window have a flexible property such that a flexible organic light emitting display device may be provided.

Figure 3:
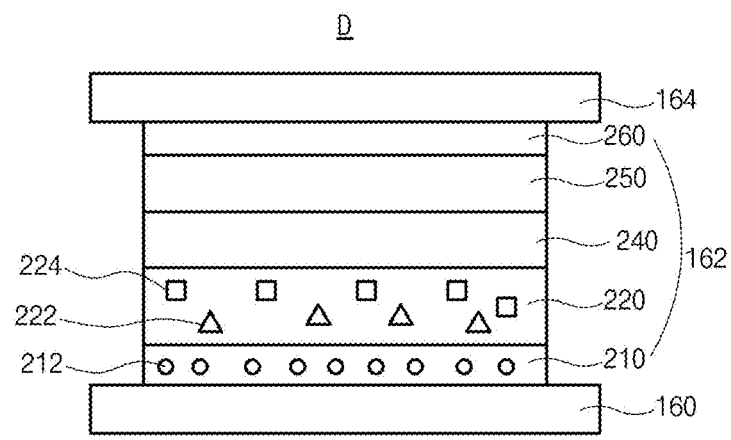
FIG. 3 is a schematic cross-sectional view of an OLED according to a second embodiment of the present disclosure.

FIG. 3 is a schematic cross-sectional view illustrating an OLED according to a second embodiment.

As shown in FIG. 3, the OLED D includes the first and second electrodes 160 and 164 facing each other and the organic emitting layer 162 between the first and second electrodes 160 and 164. The organic emitting layer 162 includes an EML 240 between the first and second electrodes 160 and 164, an HIL 210 between the first electrode 160 and the EML 240 and an HTL 220 between the HIL 210 and the EML 240.

The first electrode 160 is an anode, and the second electrode 164 is a cathode. One of the first and second electrodes 160 and 164 is a transparent electrode (or a semi-transparent electrode), and the other one of the first and second electrodes 160 and 164 is a reflection electrode.

The hole is injected and transported from the first electrode 160 into the EML 240 through the HIL 210 and the HTL 220, and the electron is transported from the second electrode 164 into the EML.

The organic emitting layer 162 may further include at least one of the EIL 260 between the second electrode 164 and the EML 240 and the ETL 250 between the EML 240 and the EIL 260.

Although not shown, the organic emitting layer 162 may further include at least one of the EBL between the HTL 220 and the EML 240 and the HBL between the ETL 250 and the EML 240.

For example, the EBL may include at least one compound selected from the group consisting of tris(4-carbazoyl-9-yl-phenyl)amine (TCTA), tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, 4,4',4"-tris(3-methylphenylamino)triphenylamine (MTDATA), 1,3-bis(carbazol-9-yl)benzene (mCP), 3,3'-bis(N-carbazolyl)-1,1'-biphenyl (mCBP), copper phthalocyanine (CuPc), N,N'-bis[4-[bis(3-methylphenyl)amino]phenyl]-N,N'-diphenyl-[1,1'-biphenyl]-4,4'-diamine (DNTPD), 1,3,5-tris[4-(diphenylamino)phenyl]benzene (TDAPB), DCDPA, and 2,8-bis(9-phenyl-9H-carbazol-3-yl)dibenzo[b,d]thiophene), but it is not limited thereto. The EBL may have a thickness of 10 to 350 Å, preferably 100 to 200 Å.

The HBL may include at least one compound selected from the group consisting of tris-(8-hydroxyquinoline) aluminum (Alq3), 2-biphenyl-4-yl-5-(4-t-butylphenyl)-1,3,4-oxadiazole (PBD), spiro-PBD, lithium quinolate (Liq), 2,2',2"-(1,3,5-benzinetriyl)-tris(1-phenyl-1-H benzimidazole) (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-trip-pyrid-3-yl-phenyl)benzene (TpPyPB), 2,4,6-tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorenel-alt-2,7-(9,9-dioctylfluorene)] (PFNBr), tris(phenylquinoxaline (TPQ), and diphenyl-4-triphenylsilyl-phenylphosphine oxide (TSPO1), but it is not limited thereto. For example, the HBL may have a thickness of 10 to 350 Å, preferably 100 to 200 Å.

The ETL 250 may include at least one compound selected from the group consisting of 1,3,5-tri(m-pyridin-3-ylphenyl)benzene (TmPyPB), 2,2',2"-(1,3,5-benzinetriyl)-tris(1-phenyl-1-H benzimidazole)(TPBi), tris(8-hydroxy-quinolinato) aluminum (Alq$_3$), 2-(4-biphenyl)-5-(4-tert-butylphenyl)-1,3,4-oxadiazole (PBD), 3-(4-biphenyl)-4-phenyl-5-tert-butylphenyl-1,2,4-triazole (TAZ), 2-biphenyl-4-yl-4,6-bis-(4-pyridin-2-yl-biphenyl-4-yl)-[1,3,5]triazine (DPT), and bis(2-methyl-8-quinolinolate)-4- (phenylphenolato)aluminum (BAlq), but it is not limited thereto. For example, the ETL 250 may include an azine-based compound, e.g., TmPyPB, or an imidazole-based compound, e.g., TPBi, and may have a thickness of 50 to 350 Å, preferably 100 to 300 Å.

The EIL 260 may include at least one of an alkali metal, e.g., Li, an alkali halide compound, such as LiF, CsF, NaF, or BaF$_2$, and an organo-metallic compound, such as Liq, lithium benzoate, or sodium stearate, but it is not limited thereto. For example, the EIL 260 may have a thickness of 1 to 50 Å, preferably 5 to 20 Å.

The EML 240 in the red pixel includes a host and a red dopant, the EML 240 in the green pixel includes a host and a green dopant, and the EML 240 in the blue pixel includes a host and a blue dopant. Each of the red, green and blue dopants may be one of a fluorescent compound, a phosphorescent compound and a delayed fluorescent compound.

For example, in the EML 240 in the red pixel, the host may be 4,4'-bis(carbazol-9-yl)biphenyl (CBP), and the red dopant may be selected from the group consisting of bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP). The EML 240 in the red pixel may provide the light having a wavelength range (e.g., an emission wavelength range) of about 600 to 650 nm.

In the EML 240 in the green pixel, the host may be CBP, and the green dopant may be fac-tris(2-phenylpyridine) iridium (Ir(ppy)$_3$) or tris(8-hydroxyquinolino)aluminum (Alq$_3$). However, it is not limited thereto. The EML 240 in the green pixel may provide the light having a wavelength range of about 510 to 570 nm.

In the EML 240 in the blue pixel, the host may be an anthracene derivative, and the blue dopant may be a pyrene derivative. However, it is not limited thereto. For example, the host may be 9,10-di(naphtha-2-yl)anthracene, and the blue dopant may be 1,6-bis(diphenylamino)pyrene. In the EML 240 in the blue pixel, the blue dopant may have a weight % of 0.1 to 20, preferably 1 to 10. The EML 240 in the blue pixel may have a thickness of 50 to 350 Å, preferably 100 to 300 Å and may provide the light having a wavelength range of about 440 to 480 nm.

The HIL 210 includes a hole injection material 212 being an indacene derivative (e.g., an indacene-based organic compound) substituted with malononitrile. The hole injection material 212 is represented by Formula 1-1.

[Formula 1-1]

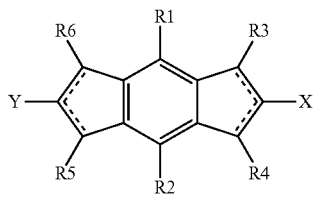

In Formula 1-1, each of R1 and R2 is independently selected from the group consisting of hydrogen (H), deuterium (D), halogen and cyano. Each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile. Each of X and Y is independently phenyl substituted with at least one of C1 to C10 alkyl group, halogen, cyano, malononitrile, C1 to C10 haloalkyl group and C1 to C10 haloalkoxy group.

For example, the C1 to C10 haloalkyl group may be trifluoromethyl, and the C1 to C10 haloalkoxy group may be trifluoromethoxy. In addition, halogen may be one of F, Cl, Br and I.

In Formula 1-1, one of R3 and R4 and one of R5 and R6 may be malononitrile, and the other one of R3 and R4 and the other one of R5 and R6 maybe cyano.

For example, in Formula 1-1, R3 and R6 may be malononitrile. Alternatively, in Formula 1-1, R4 and R6 may be malononitrile. Namely, the first hole injection material 212 in Formula 1-1 may be represented by Formula 1-2 or 1-3.

[Formula 1-2]

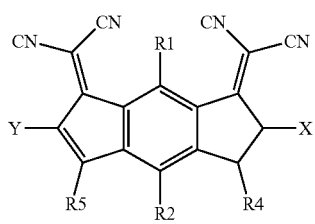

[Formula 1-3]

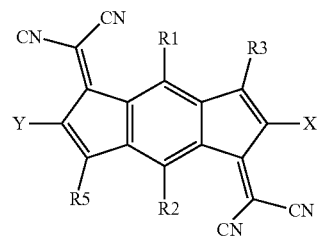

In Formula 1-1, the substituents at a first side of the indacene core may be different from the substituents at a second side of the indacene core so that the first hole injection material 212 in Formula 1-1 may have an asymmetric structure.

For example, each of X and Y may be independently phenyl substituted with at least one of C1 to C10 alkyl group, halogen, cyano, malononitrile, C1 to C10 haloalkyl group and C1 to C10 haloalkoxy group, and X and Y may have a difference in at least one of the substituent and the position of the substituent. Namely, a phenyl moiety being X and a phenyl moiety being Y may have different substituents and/or may have same substituent or different substituents at different positions.

For example, the first hole injection material 212 in Formula 1-1 may be represented by Formula 1-4.

[Formula 1-4]

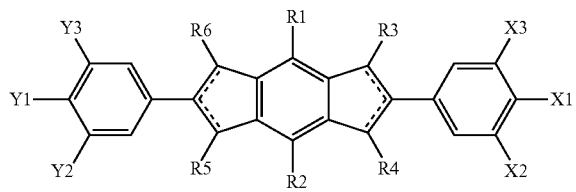

In Formula 1-4, each of X1 to X3 and each of Y1 to Y3 are independently selected from the group consisting of H, C1 to C10 alkyl group, halogen, cyano, malononitrile, C1 to C10 haloalkyl group and C1 to C10 haloalkoxy group and satisfy at least one of i) X1 and Y1 are different and ii) X2 is different from Y2 and Y3 or X3 is different from Y2 and Y3.

The hole injection material 212 has excellent hole injection property such that the hole injection property from the first electrode 160 as the anode is improved.

The HTL 220 contacts the HIL 210 and is disposed under the EML 240. The HTL 220 may have a thickness of about 500 to 1500 Å, preferably 700 to 1200 Å, but it is not limited thereto.

The HTL 220 includes at least one of a first hole transporting material 222 and a second hole transporting material 224. Namely, the HTL 220 may be formed of only the first hole transporting material 222, only the second hole transporting material, or a mixture of the first and second hole transporting materials 222 and 224. The first and second hole transporting materials 222 and 224 are fluorene-derivatives (or spiro-fluorene derivatives) having a difference in a structure and a property.

The first hole transporting material 222 may be represented by Formula 2.

[Formula 2]

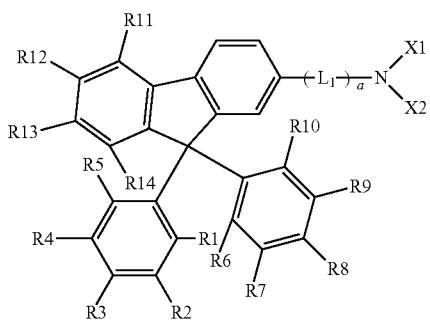

In Formula 2, each of X1 and X2 is independently selected from the group consisting of C6 to C30 aryl group and C5 to C30 heteroaryl group, L1 is selected from the group consisting of C6 to C30 arylene group and C5 to C30 heteroarylene group, and a is 0 or 1. Each of R1 to R14 is independently selected from the group consisting of H, D, C1 to C10 alkyl group, C6 to C30 aryl group and C5 to C30 heteroaryl group, or adjacent two of R1 to R14 are connected (combined or joined) to each other to form a fused ring.

In Formula 2 above and in Formula 3 below, C6 to C30 aryl (or arylene) may be selected from the group consisting of phenyl, biphenyl, terphenyl, naphthyl, anthracenyl, pentanenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetrasenyl, picenyl, pentaphenyl, pentacenyl, fluorenyl, indenofluorenyl and spiro-fluorenyl.

In Formula 2 above and in Formula 3 below, C5 to C30 heteroaryl (or heteroarylene) may be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinozolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphtharidinyl, furanyl, oxazinyl, oxazolyl, oxadiazolyl, triazolyl, dioxynyl, benzofuranyl, dibenzofuranyl, thiopyranyl, xantenyl, chromanyl, isochromanyl, thioazinyl, thiophenyl, benzothiophenyl, dibenzothiophenyl, difuropyrazinyl, benzofurodibenzofuranyl, benzothienobenzothiophenyl, benzothienodibenzothiophenyl, benzothienobenzofuranyl, and benzothienodibenzofuranyl.

In Formula 2 above and in Formula 3 below, each of C6 to C30 aryl and C5 to C30 heteroaryl may include substituted one and unsubstituted one. Namely, each of C6 to C30 aryl and C5 to C30 heteroaryl may be unsubstituted or substituted with C1 to C10 alkyl group, e.g., methyl, ethyl or tert-butyl.

In Formula 2, X1 and X2 may be same or different. Each of X1 and X2 may be selected from fluorenyl, spiro-fluorenyl, phenyl, biphenyl, terphenyl, tert-butyl phenyl, fluorenylphenyl, carbazolyl and carbazolylphenyl, and L1 may be phenylene. Each of R1 to R14 may be selected from H, D, C1 to C10 alkyl group, e.g., tert-butyl, and C6 to C30 aryl group, e.g., phenyl, and adjacent two of R1 to R14, e.g., R1 and R6, may be connected to form a fused ring. The fused ring may be one of aromatic ring, alicyclic ring and heteroaromatic ring.

The second hole transporting material 224 may be represented by Formula 3.

[Formula 3]

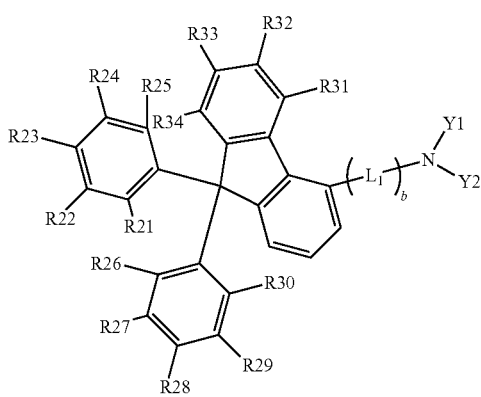

In Formula 3, each of Y1 and Y2 is independently selected from the group consisting of C6 to C30 aryl group and C5 to C30 heteroaryl group, L1 is selected from the group consisting of C6 to C30 arylene group and C5 to C30 heteroarylene group, and b is 0 or 1. Each of R21 to R34 is independently selected from the group consisting of H, D, C1 to C10 alkyl group, C6 to C30 aryl group and C5 to C30 heteroaryl group, or adjacent two of R21 to R34 are connected (combined or joined) to each other to form a fused ring.

In Formula 3, Y1 and Y2 may be same or different. Each of Y1 and Y2 may be selected from fluorenyl, spiro-fluorenyl, phenyl, biphenyl, terphenyl, tert-butyl phenyl, fluorenylphenyl, carbazolyl and carbazolylphenyl, and L1 may be phenylene. Each of R21 to R34 may be selected from H, D, C1 to C10 alkyl group, e.g., tert-butyl, and C6 to C30 aryl group, e.g., phenyl, and adjacent two of R21 to R34, e.g., R21 and R26, may be connected to form a fused ring. The fused ring may be one of aromatic ring, alicyclic ring and heteroaromatic ring.

The first and second hole transporting materials 222 and 224 have a difference in a linking position of an amine moiety (or an amino group) or a linker L1. Namely, the amine moiety is linked to a second position of a fluorene moiety (or a spiro-fluorene moiety) in the first hole transporting material 222, while the amino moiety is linked to a third position of a fluorene moiety (or a spiro-fluorene moiety) in the second hole transporting material 224.

A highest occupied molecular orbital (HOMO) energy level of the first hole transporting material 222 is lower than that of the second hole transporting material 224. For example, the first hole transporting material 222 may have the HOMO energy level being higher than −5.50 eV, and the second hole transporting material 224 may have the HOMO energy level being equal to or lower than −5.50 eV.

When the EBL including an electron blocking material is formed between the HTL 220 and the EML 240, the HOMO energy level of the second hole transporting material 224 is higher than that of the electron blocking material. A difference between the HOMO energy level of the second hole transporting material 224 and the electron blocking material may be 0.3 eV or less. For example, the electron blocking material may be TCTA.

An energy barrier between the HIL 210 and the HTL 220 is decreased by the first hole transporting material 222, and an energy barrier between the HTL 220 and the EML 240 is decreased by the second hole transporting material 224. Accordingly, the hole transporting efficiency from the HIL 210 is improved.

When the first and second hole transporting materials 222 and 224 are included in the HTL 220, the first and second hole transporting materials 222 and 224 have the same or different weight %. For example, the weight % of the first hole transporting material 222 may be equal to or greater than that of the second hole transporting material 224.

The hole injection material in Formula 1-1 may be one of the compounds in Formula 4.

[Formula 4]

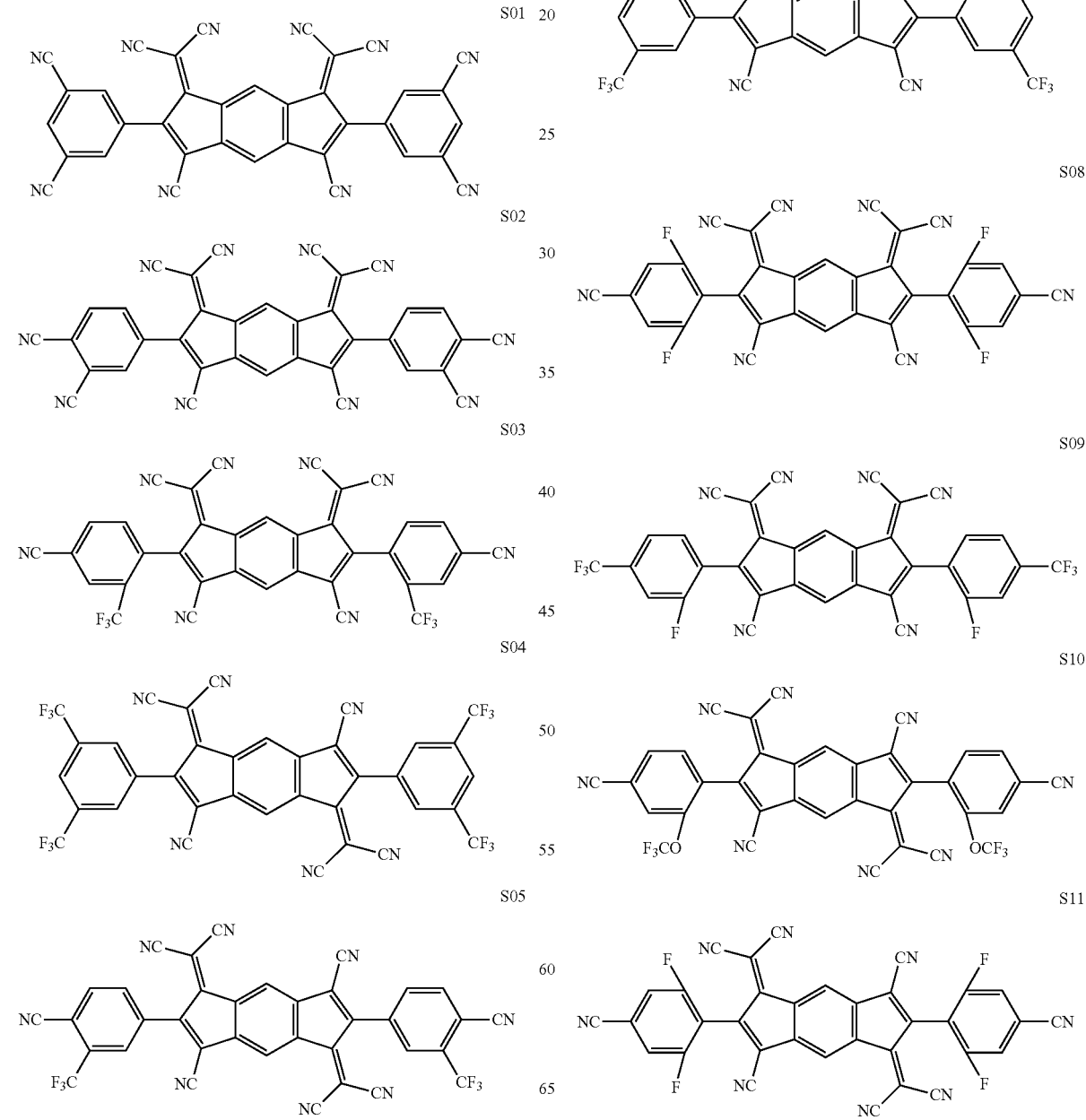

-continued
S12
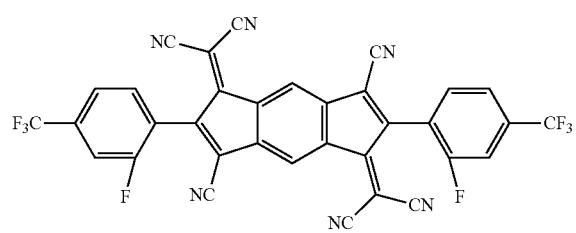
S13
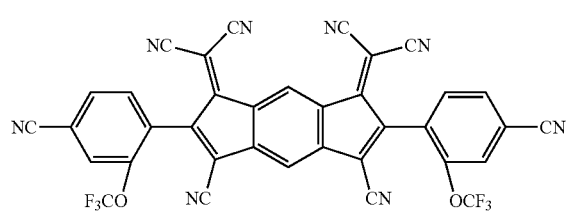
S14
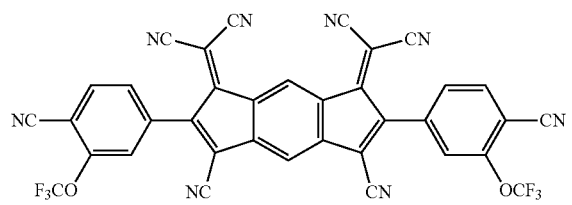
S15
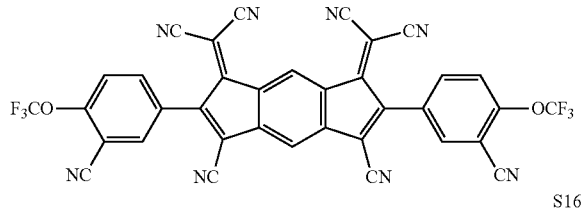
S16
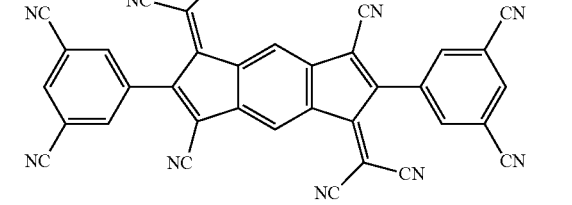
S17
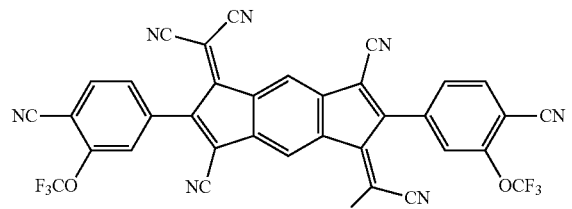
S18
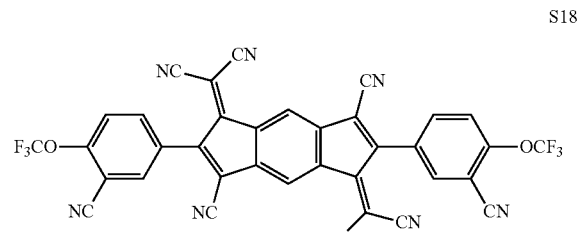
-continued
S19
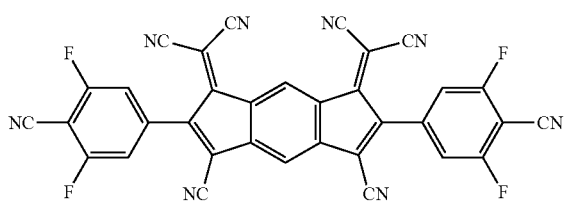
S20
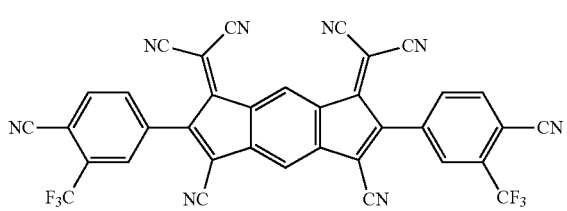
S21
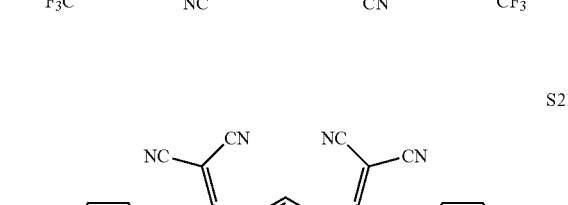
S22
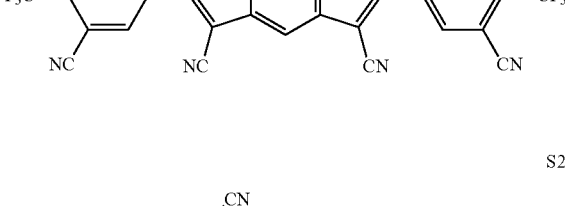
S23
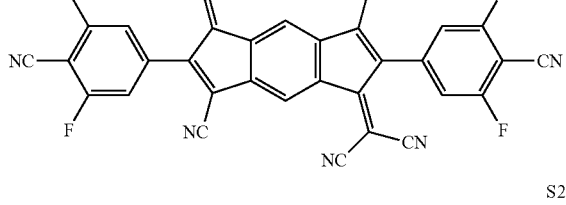
S24
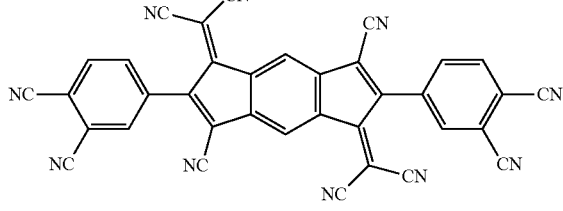
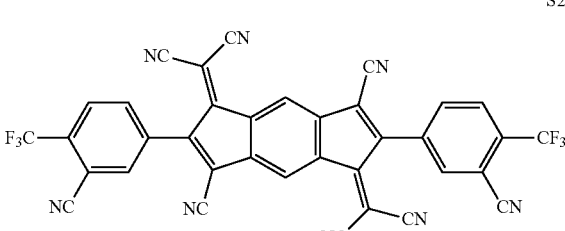

-continued
S25
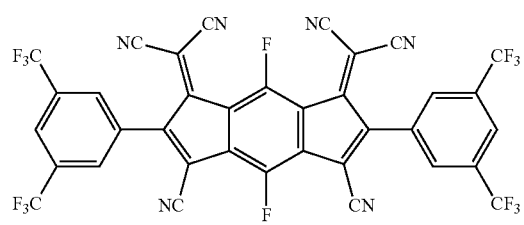
S26
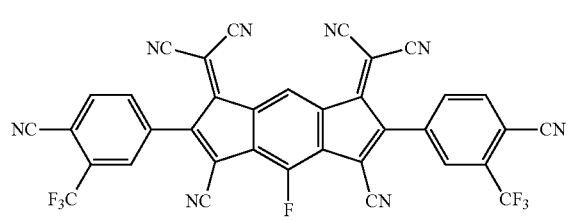
S27
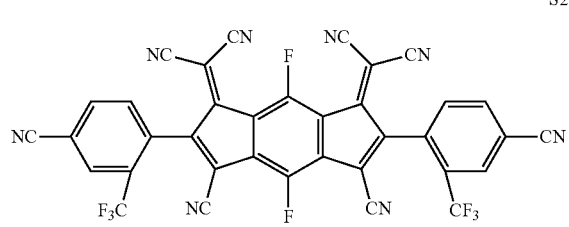
S28
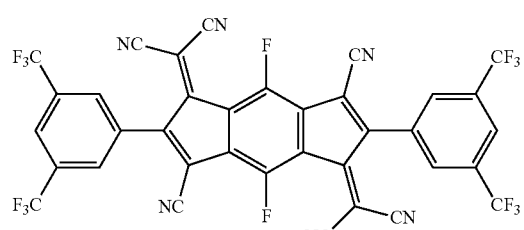
S29
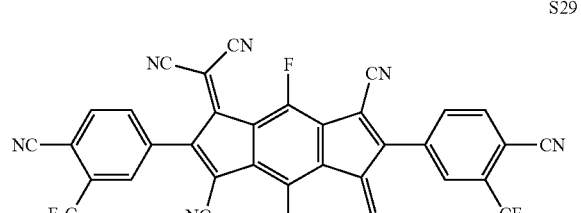
S30
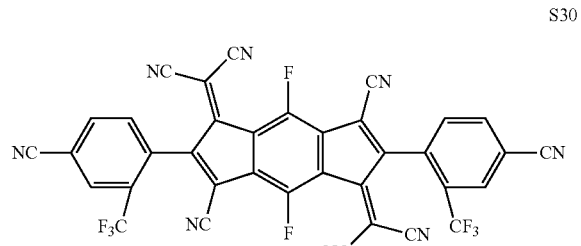
-continued
S31
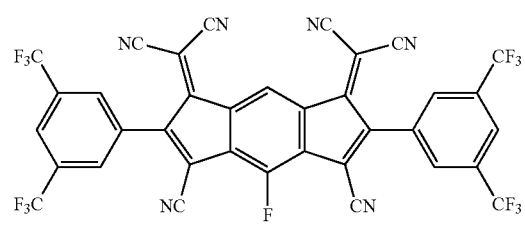
S32
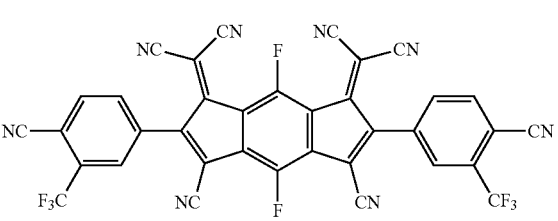
S33
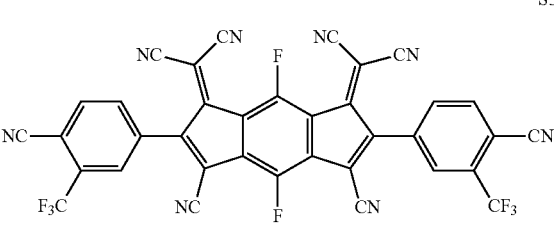
S34
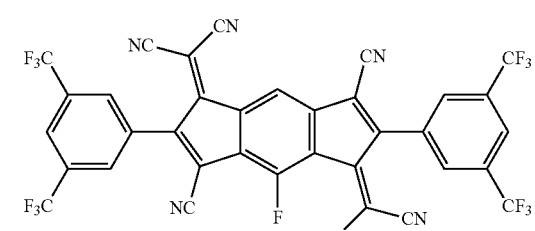
S35
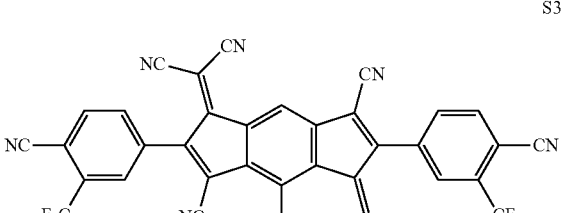
S36
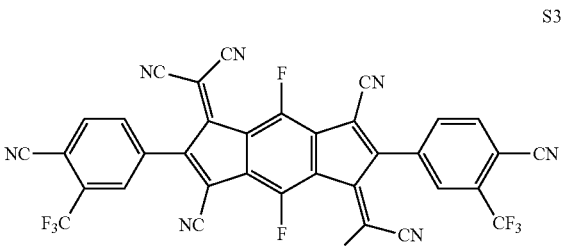

S38
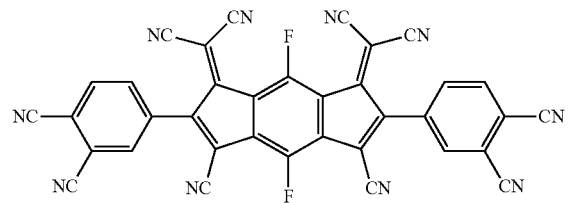
S39
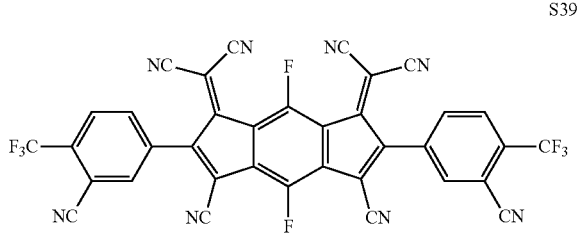
S40
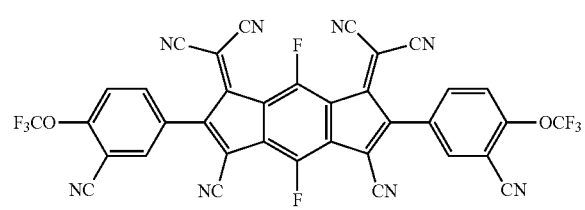
S41
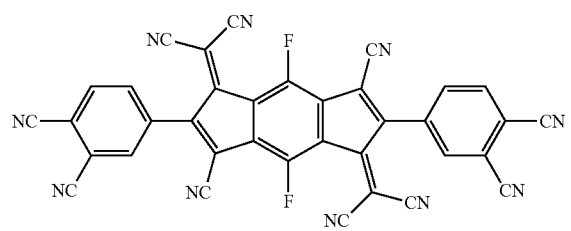
S42
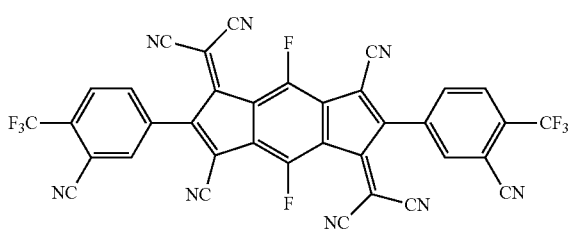
S43
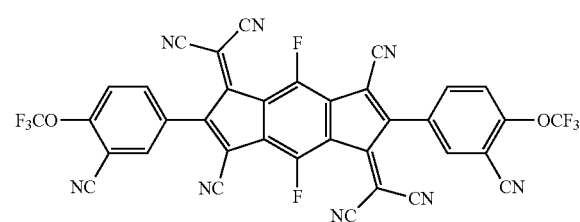
S44
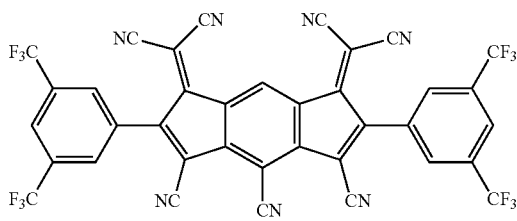
S45
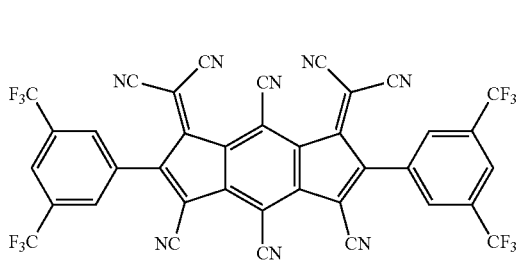
S46
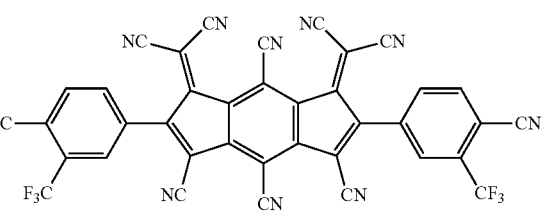
S47
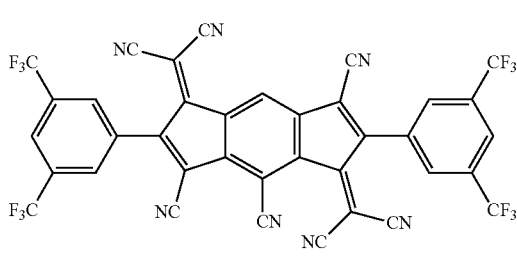
S48
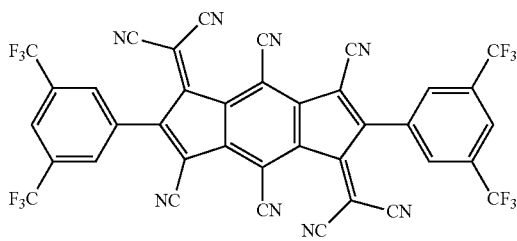
S49
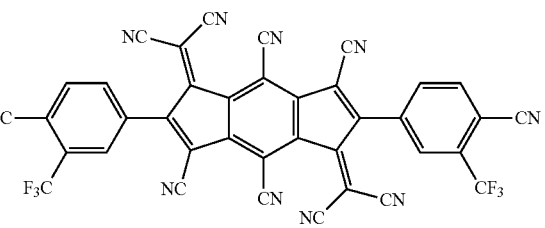

-continued
A01
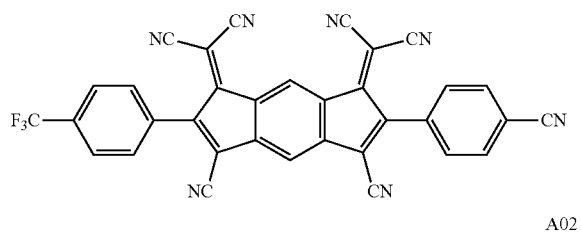
A02
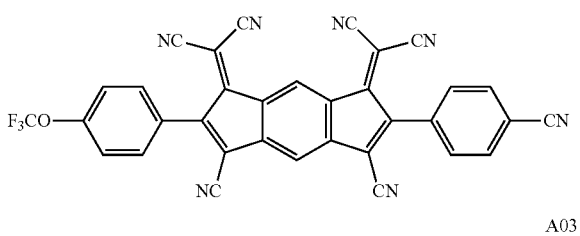
A03
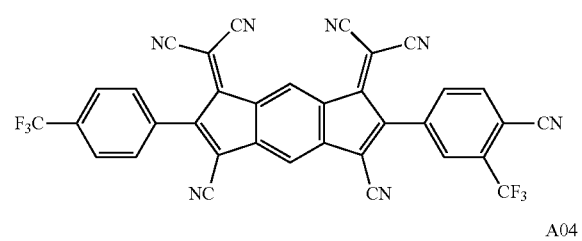
A04
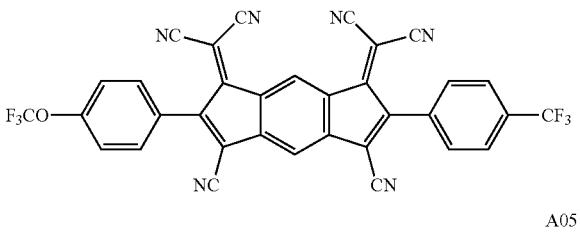
A05
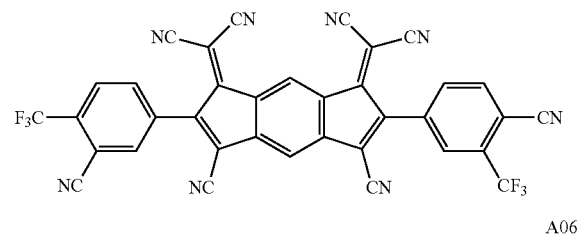
A06
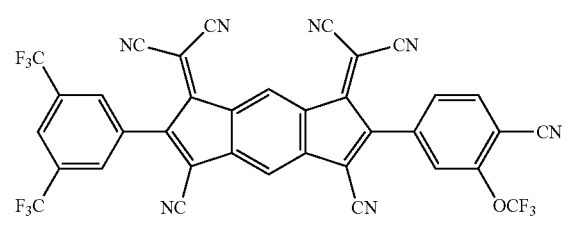
A07
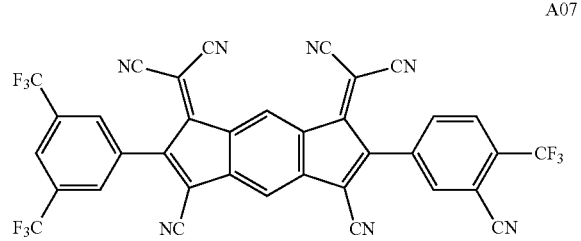
-continued
A08
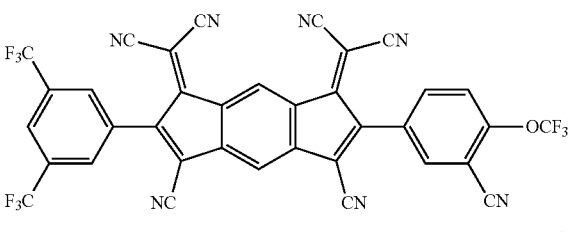
A09
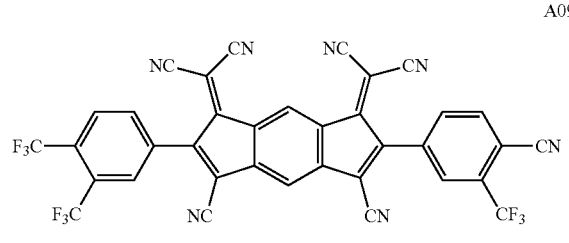
A10
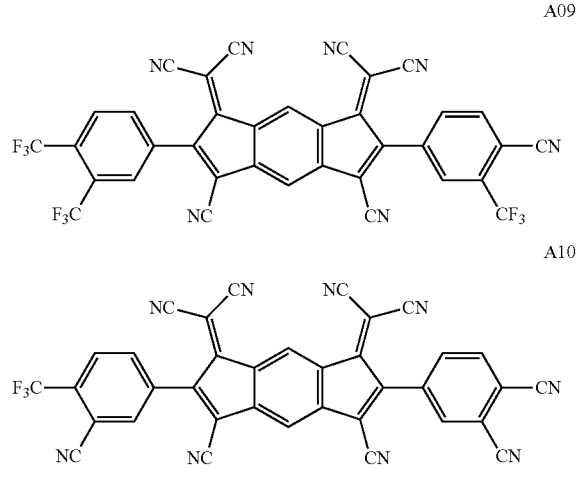
A11
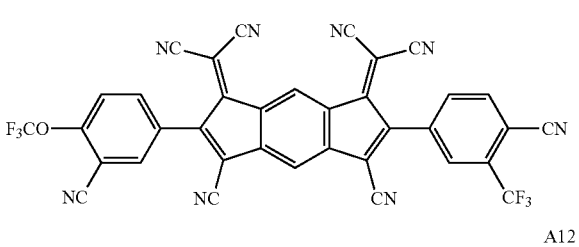
A12
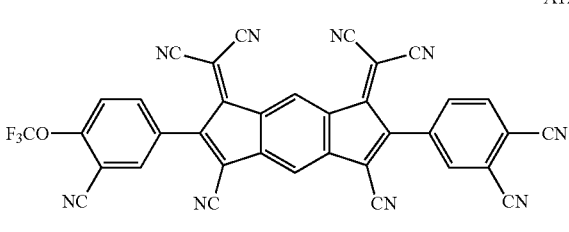
A13
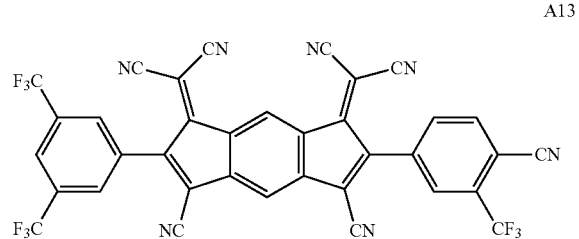
A14
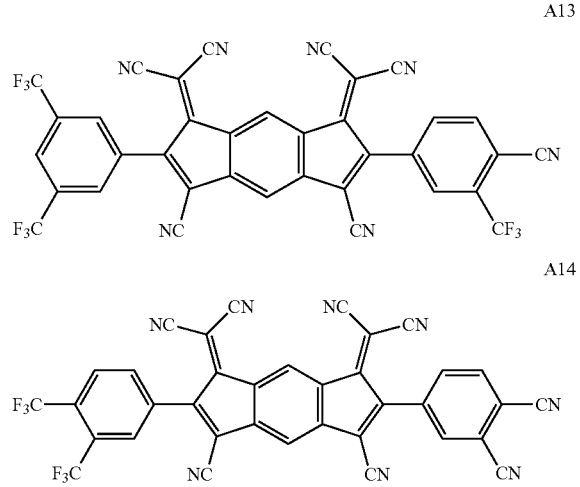

A15
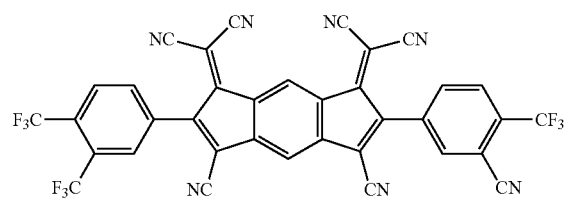
A16
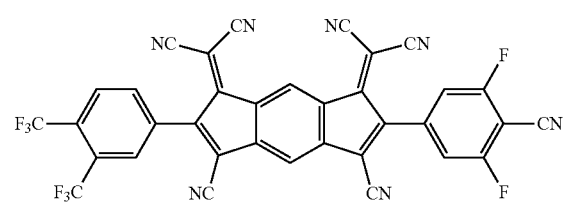
A17
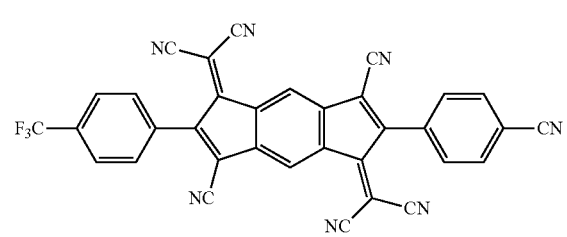
A18
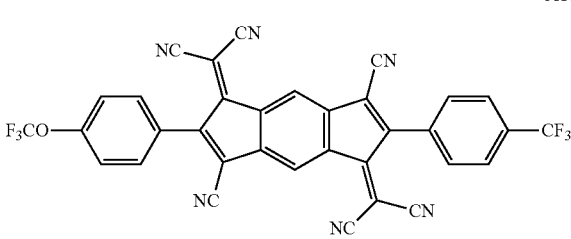
A19
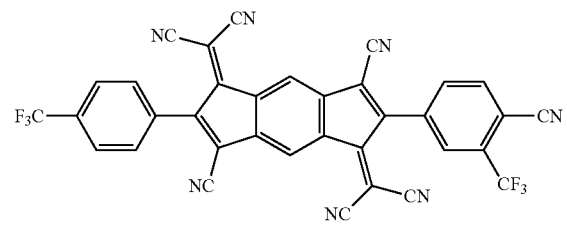
A20
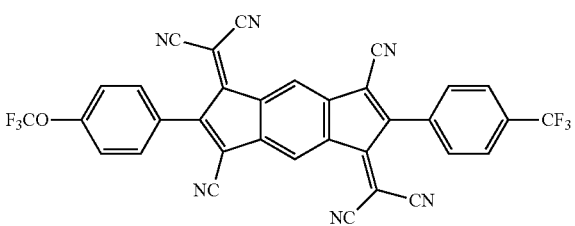
A21
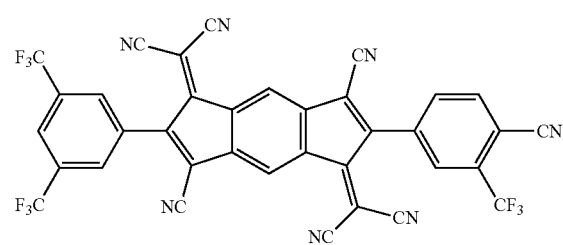
A22
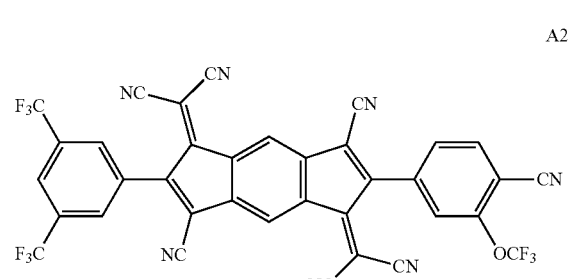
A23
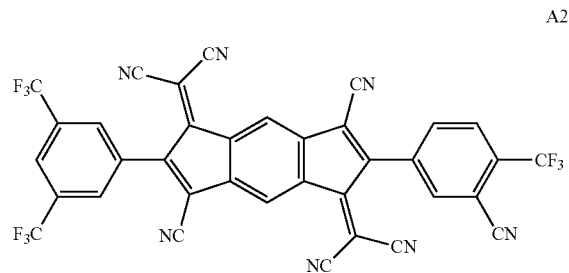
A24
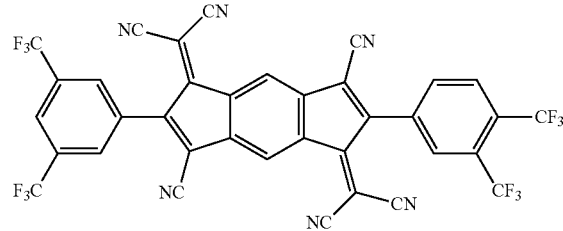
A25
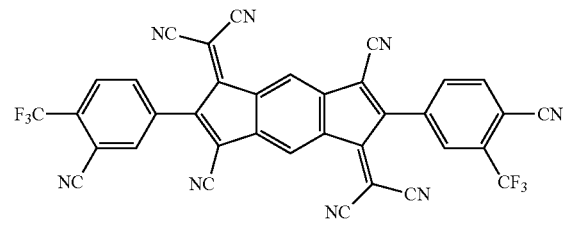
A26
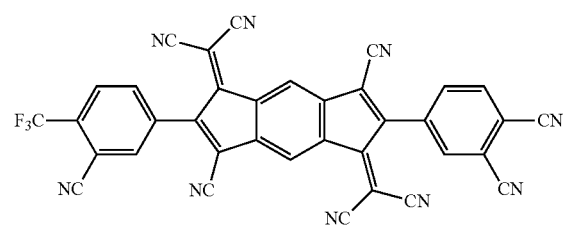

A27
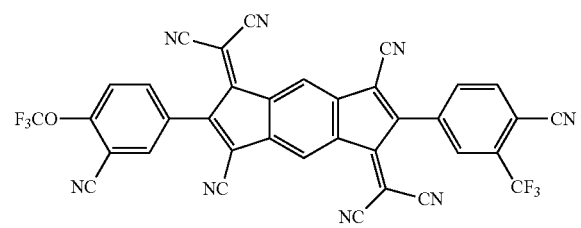
A28
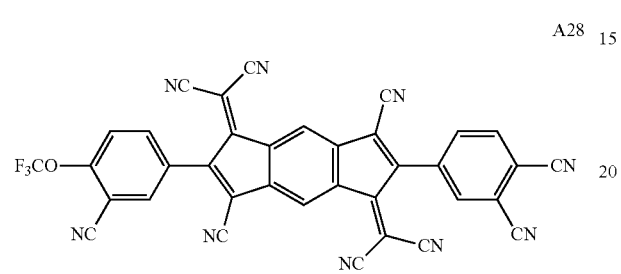
A29
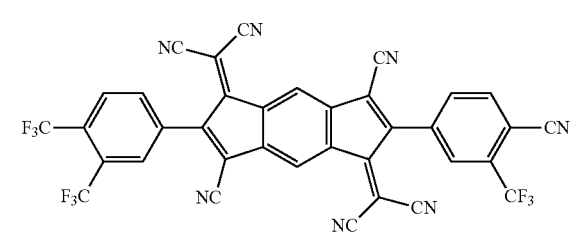
A30
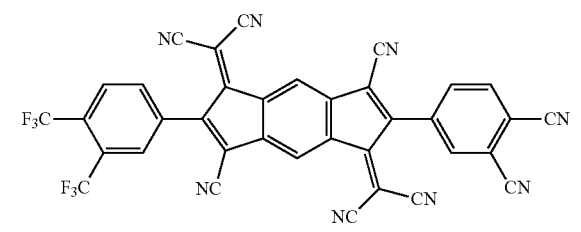
A31
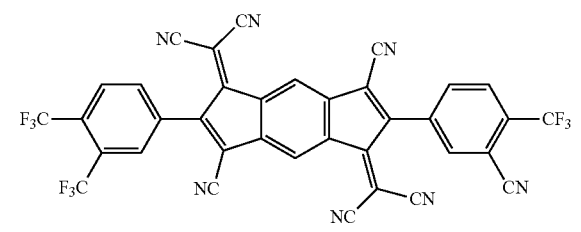
A32
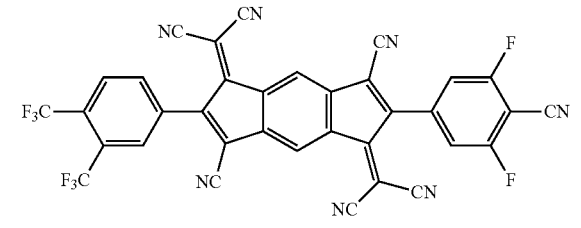
A33
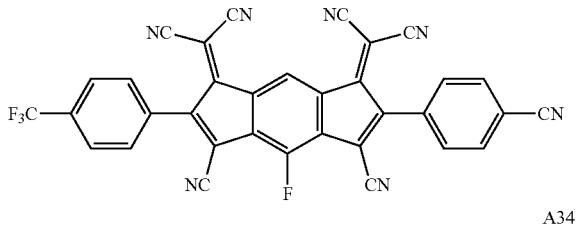
A34
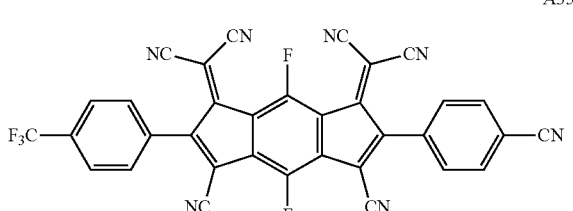
A35
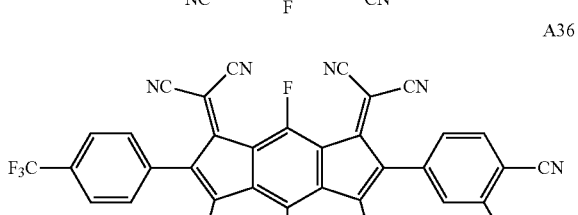
A36
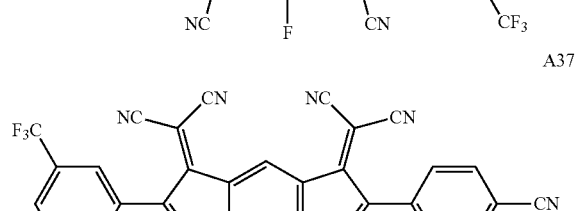
A37
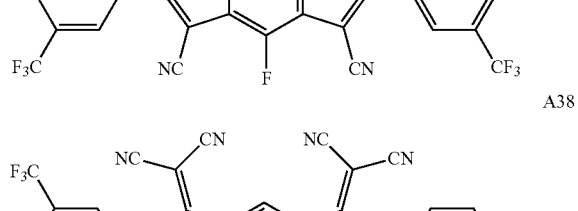
A38
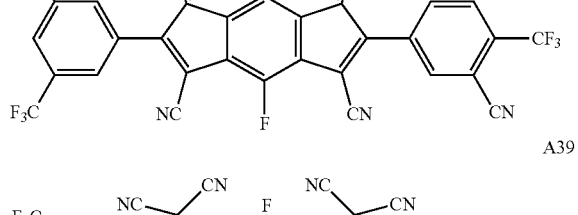
A39
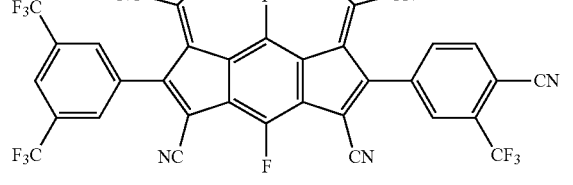

A40
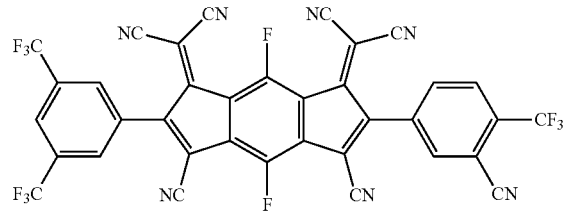
A41
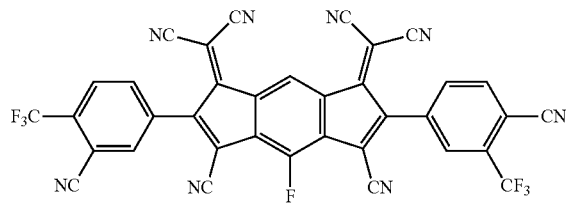
A42
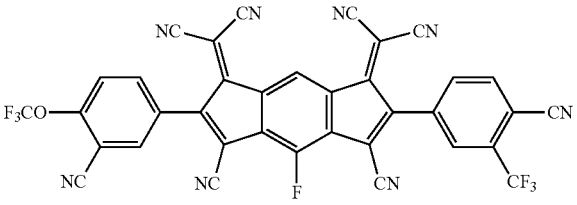
A43
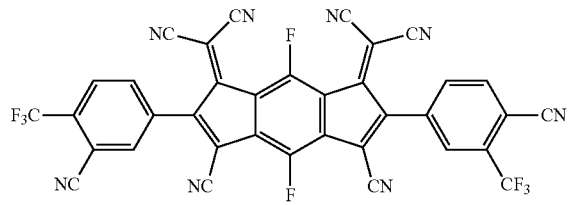
A44
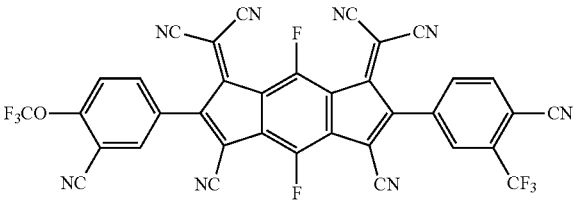
A45
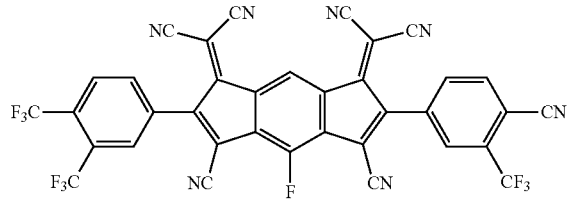
A46
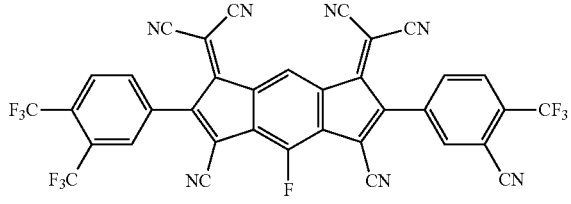
A47
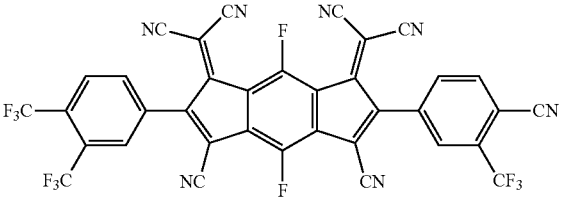
A48
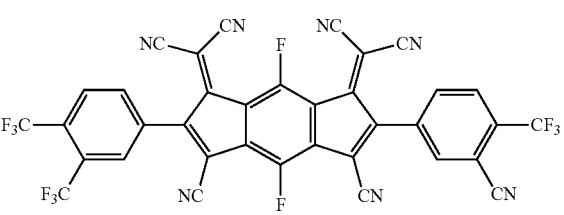
A49
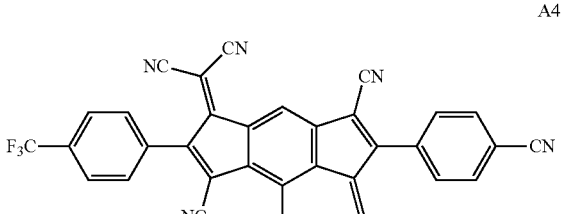
A50
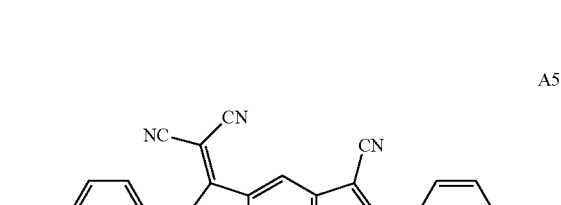
A51
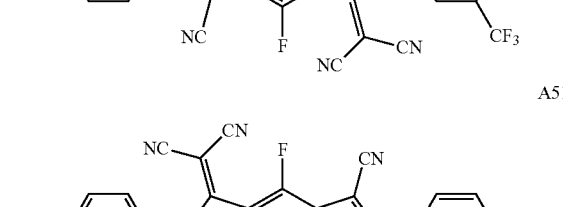
A52
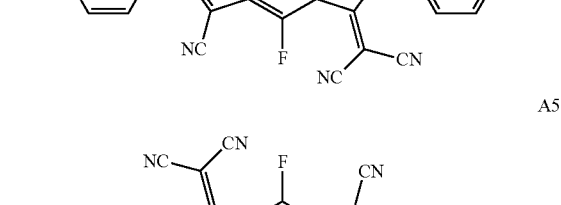
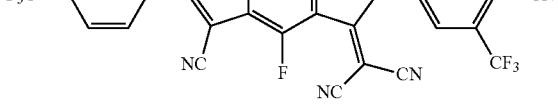

A53
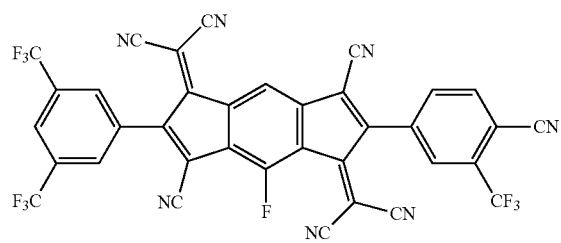
A54
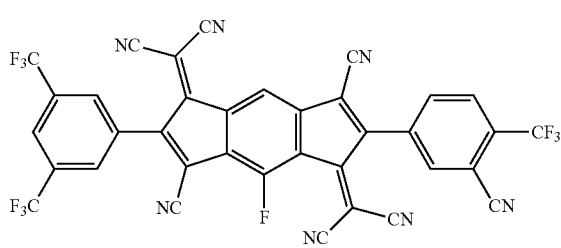
A55
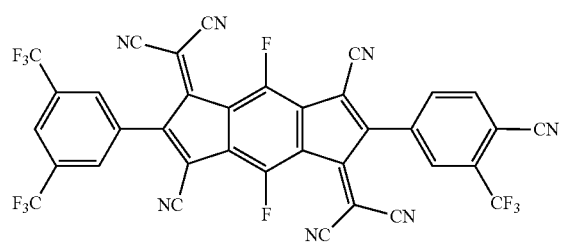
A56
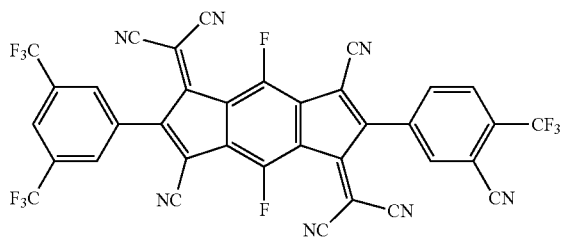
A57
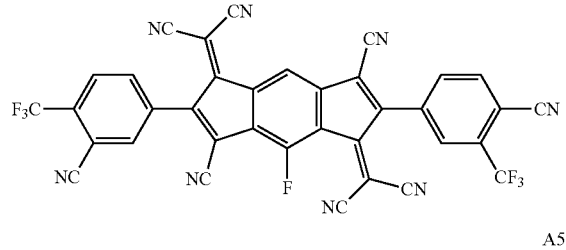
A58
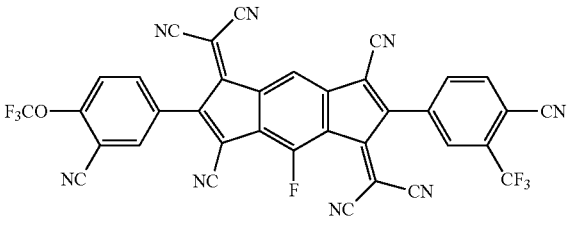
A59
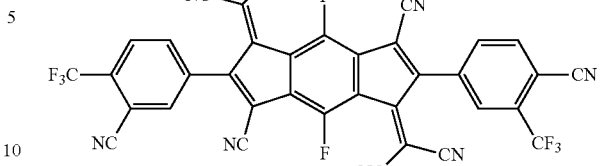
A60
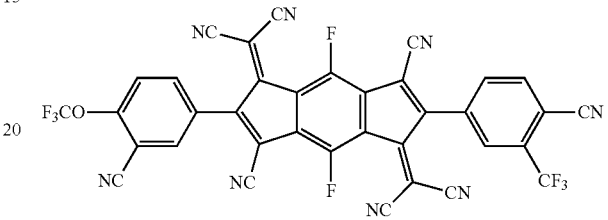
A61
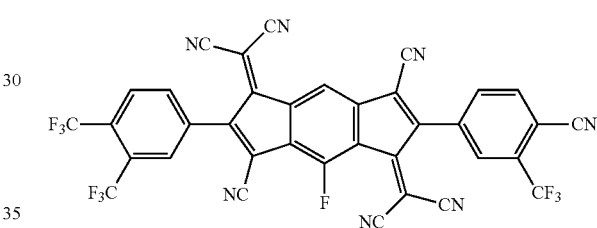
A62
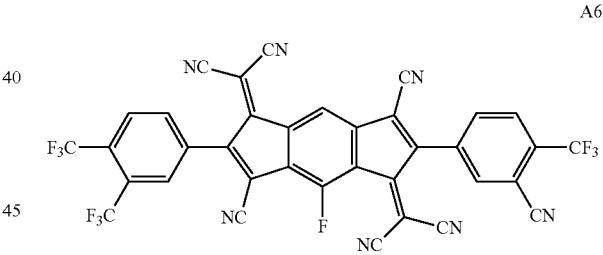
A63
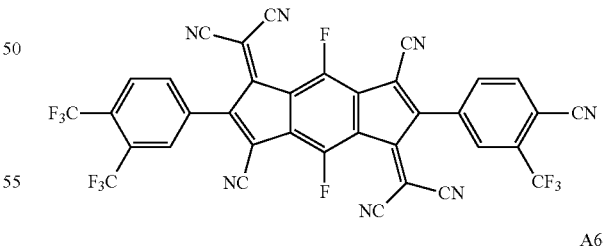
A64
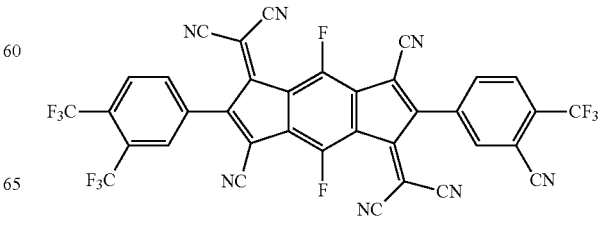

-continued
A65
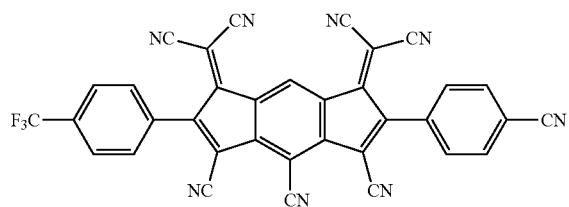
A66
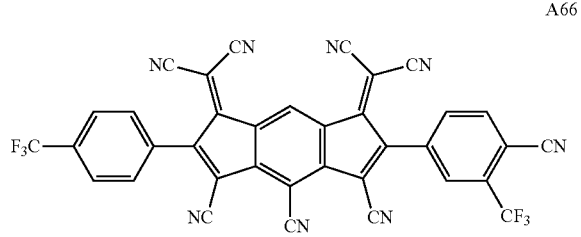
A67
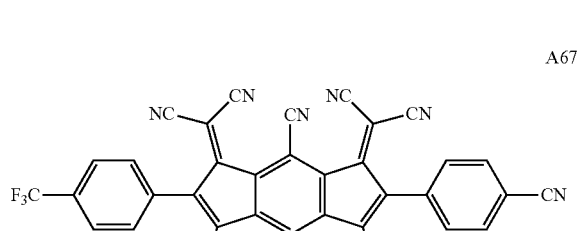
A68
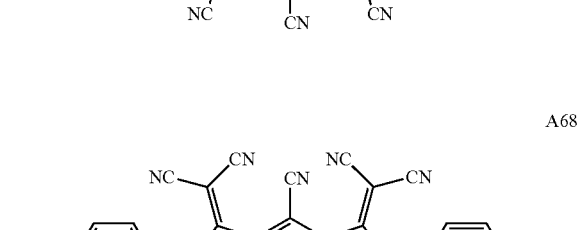
A69
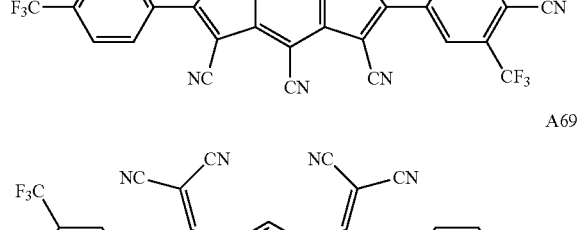
A70
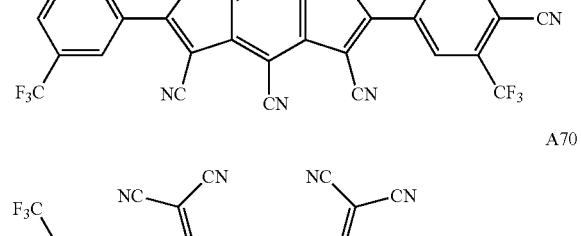
-continued
A71
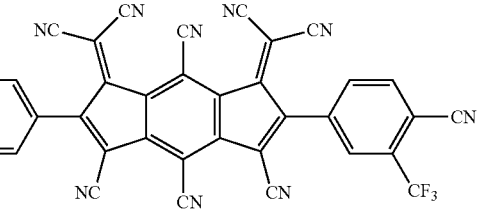
A72
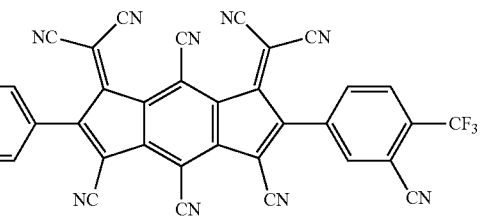
A73
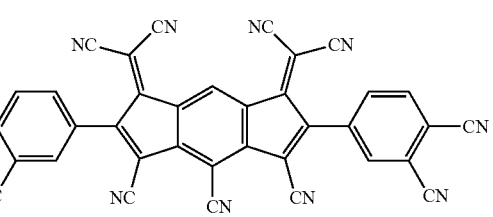
A74
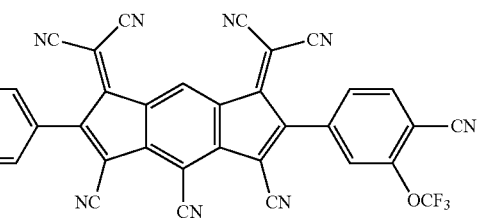
A75
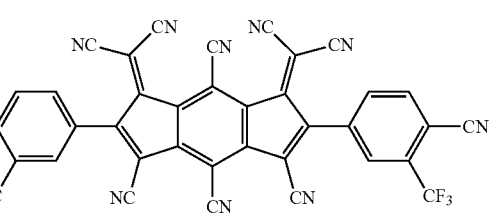
A76
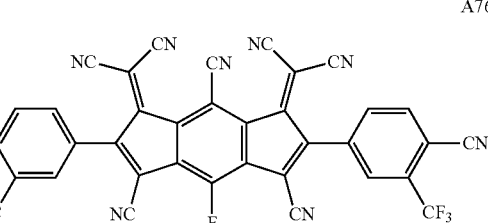
A77
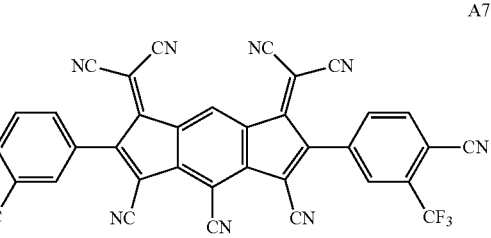

A78
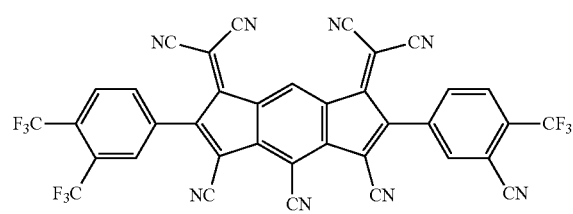
A79
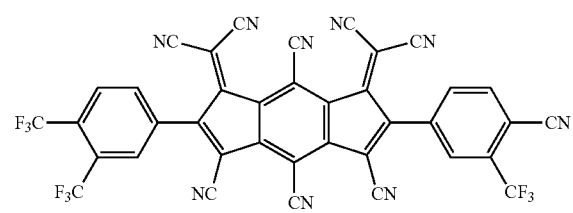
A80
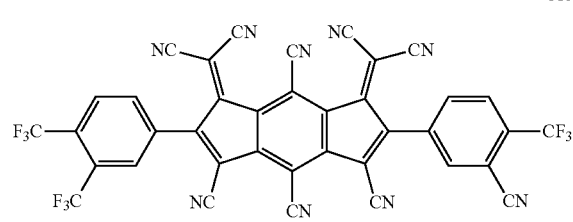
A81
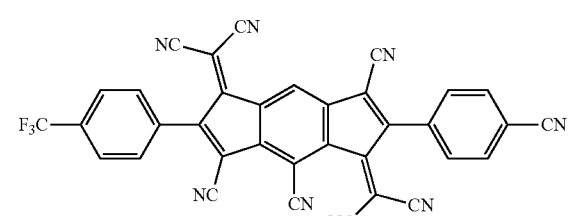
A82
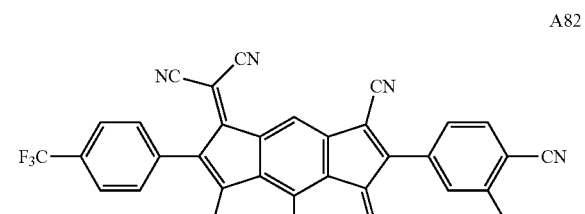
A83
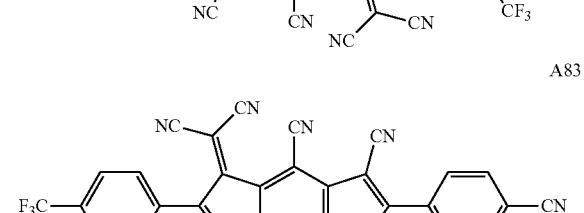
A84
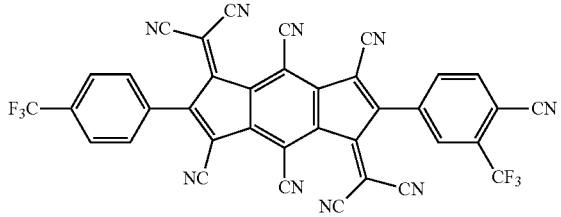
A85
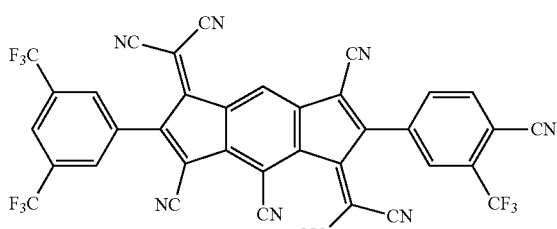
A86
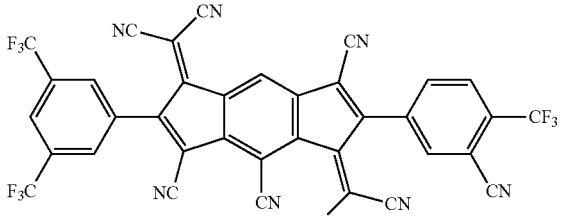
A87
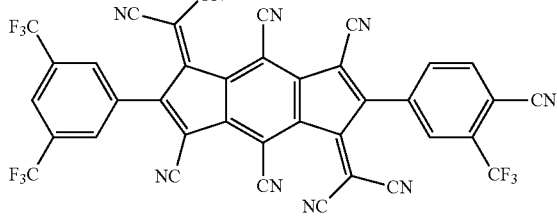
A88
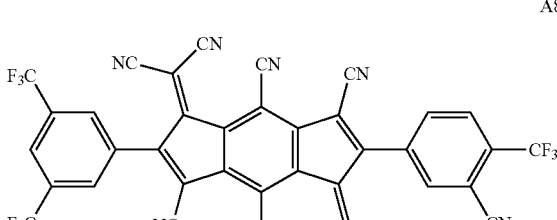
A89
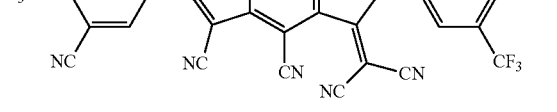

A90
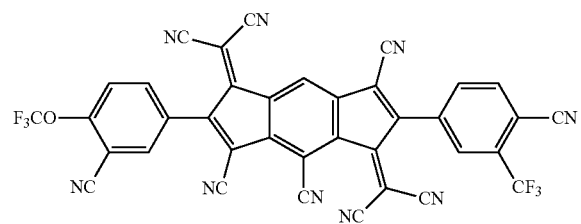
A91
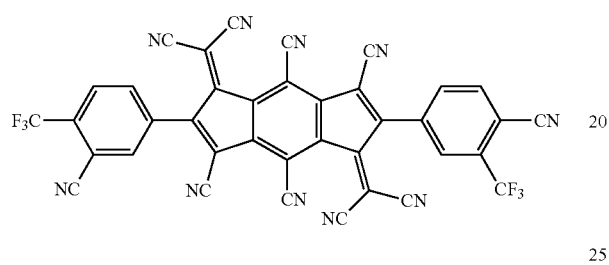
A92
A93
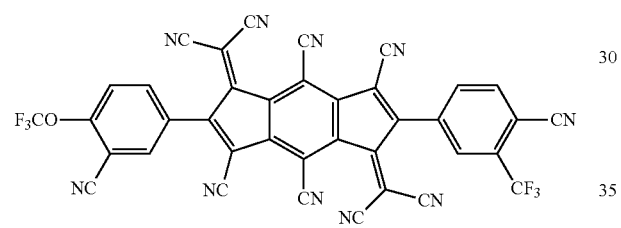
A94
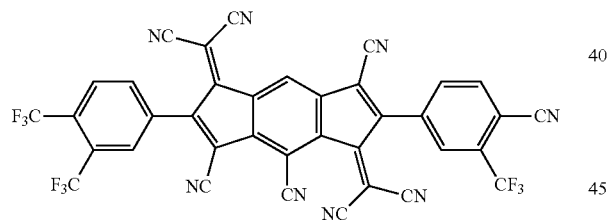
A95
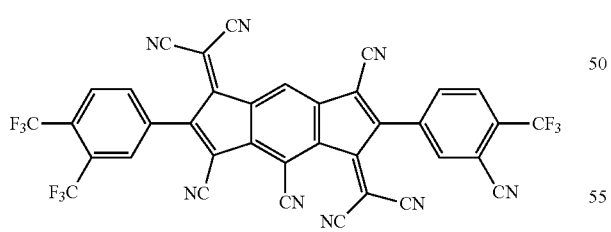
A96
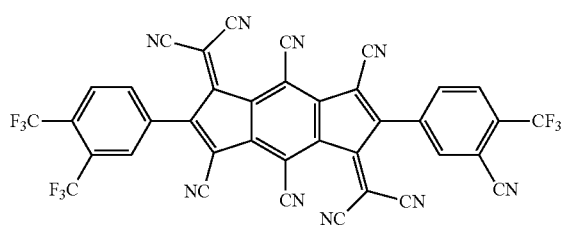
The first hole transporting material 222 in Formula 2 may be one of the compounds in Formula 5.
[Formula 5]
H01
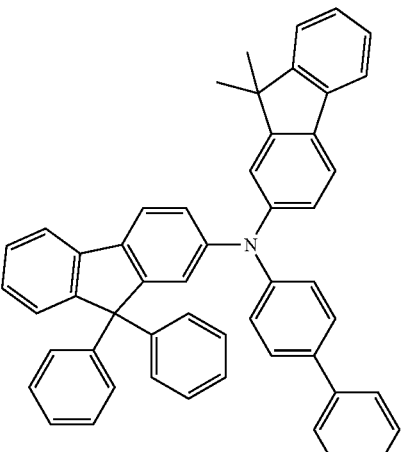
H02
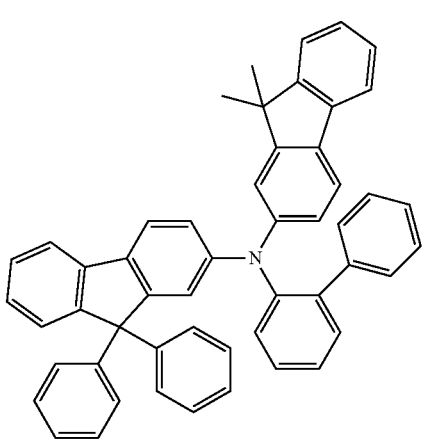
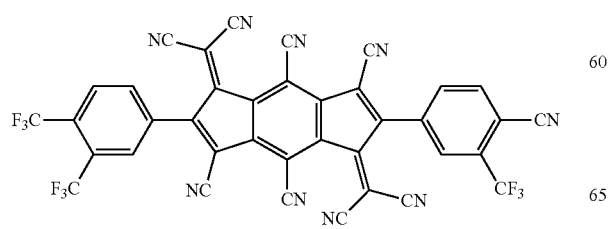

H03
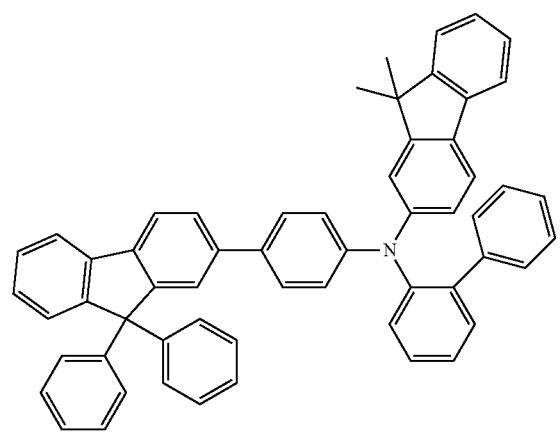
H04
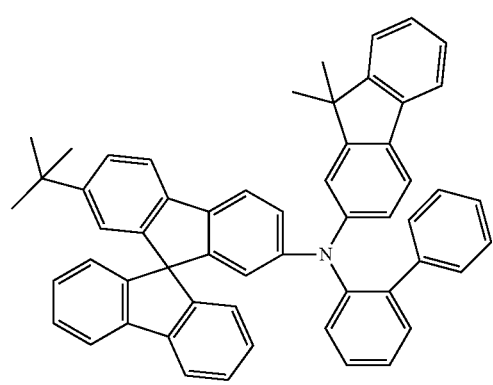
H05
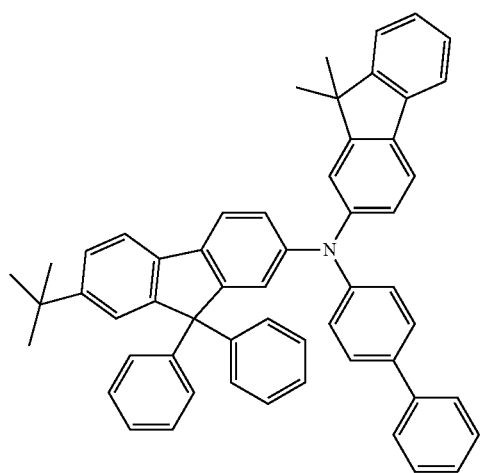
H06
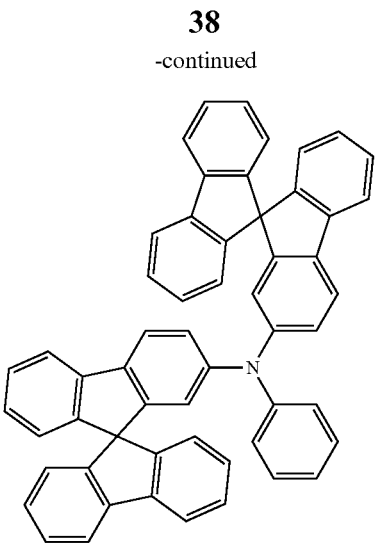
H07
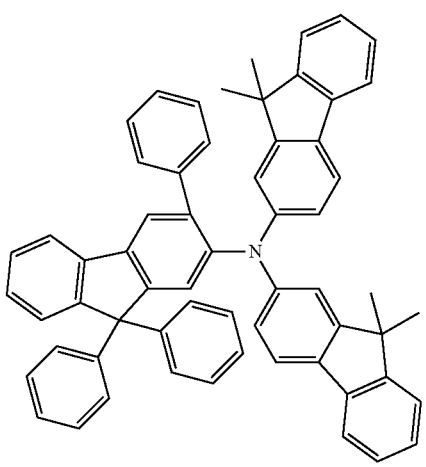
H08
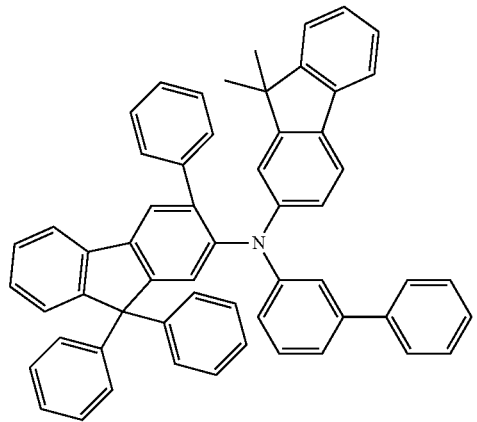

H09
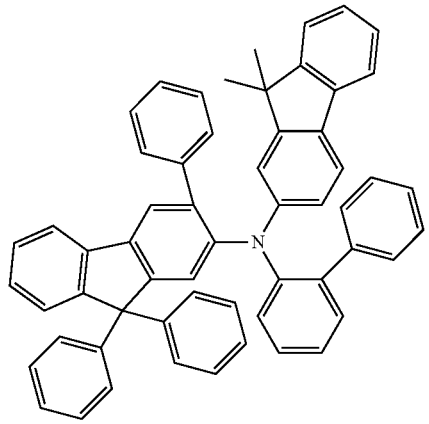
H10
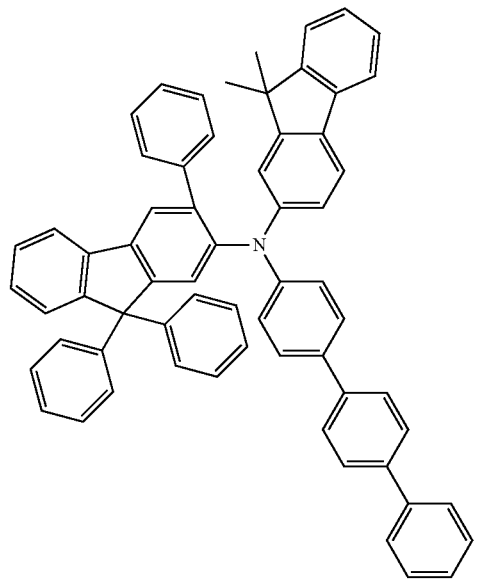
H11
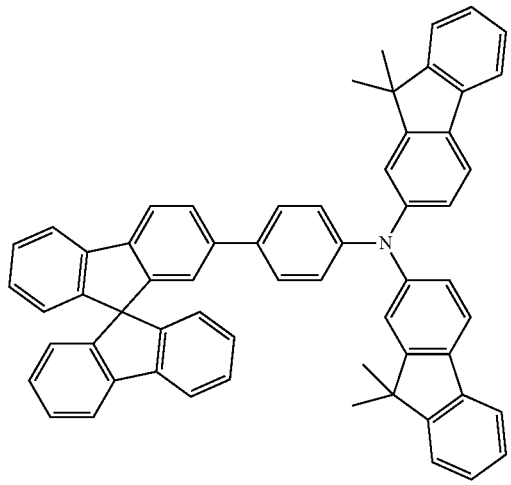
H12
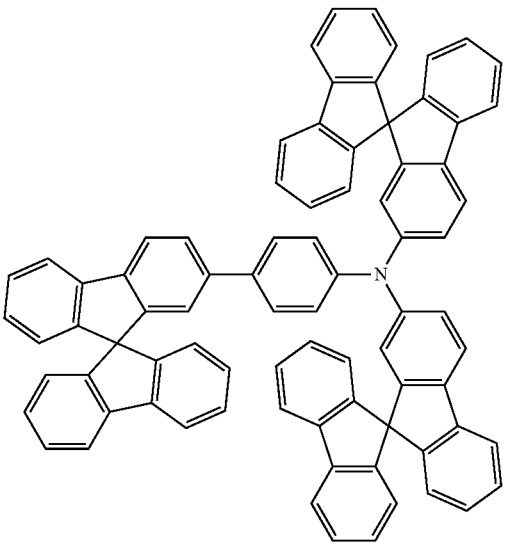
H13
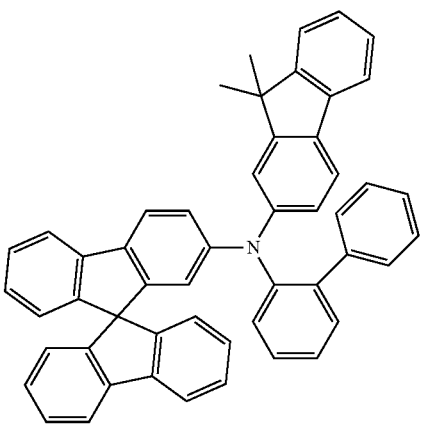
H14
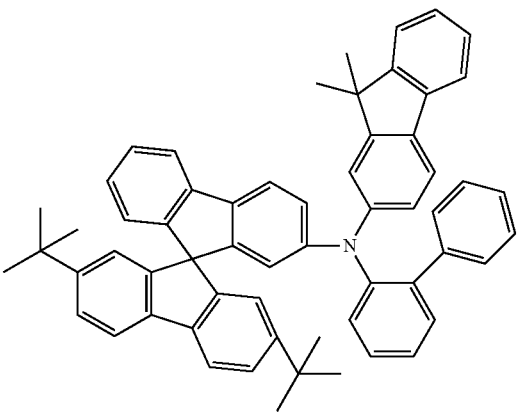

H15
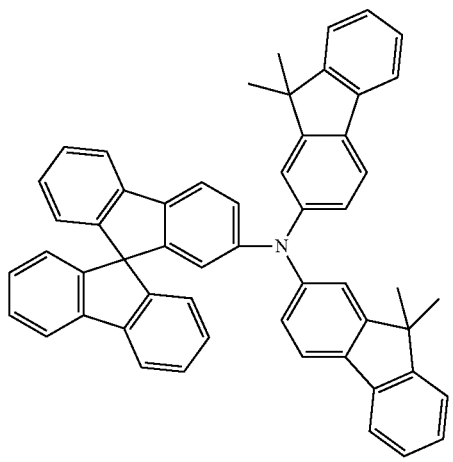
H16
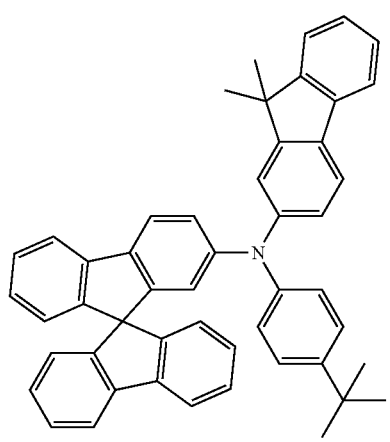
H17
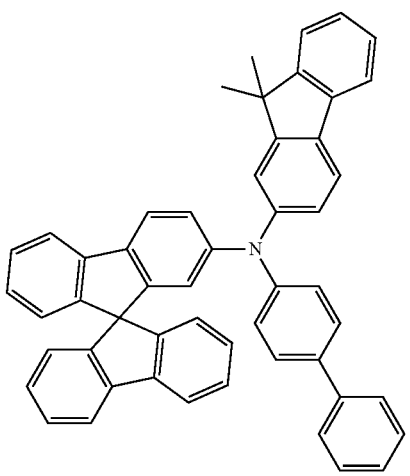
H18
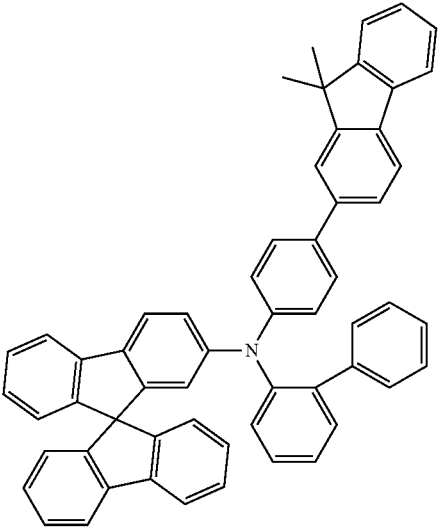
H19
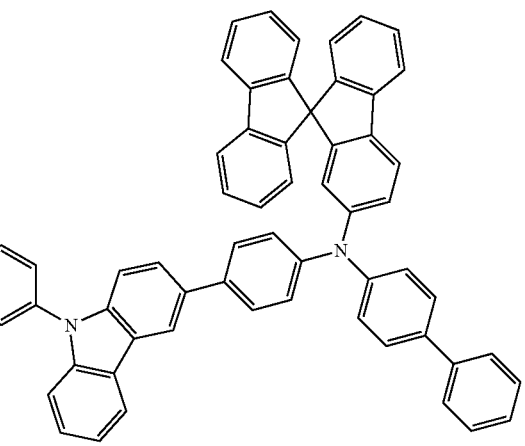
H20
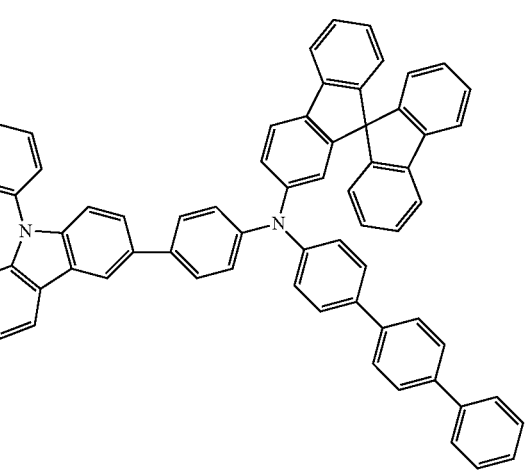

H21
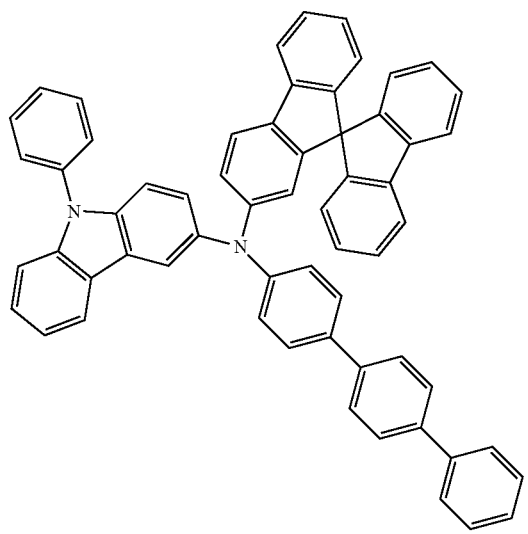
The second hole transporting material 224 in Formula 3 may be one of the compounds in Formula 6.
[Formula 6]
H26
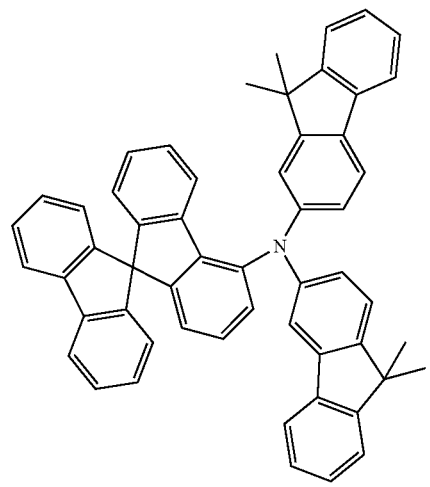
H27
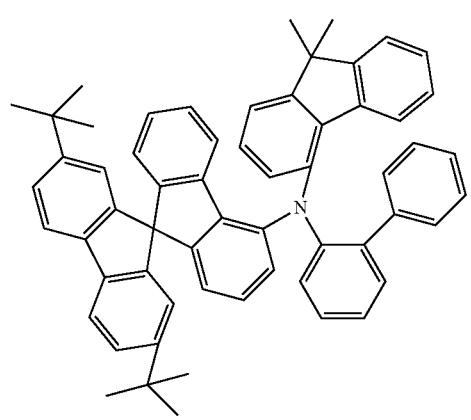
H28
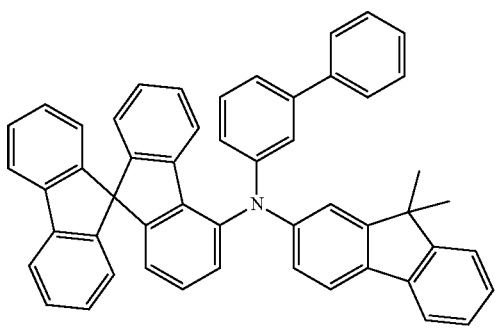
H29
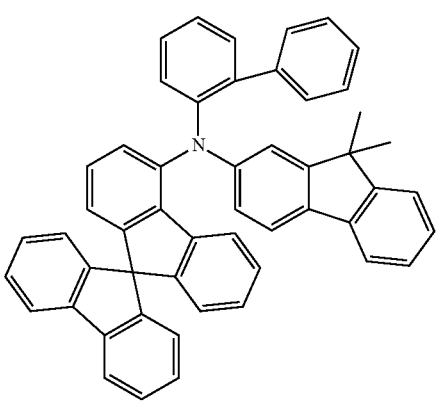
H30
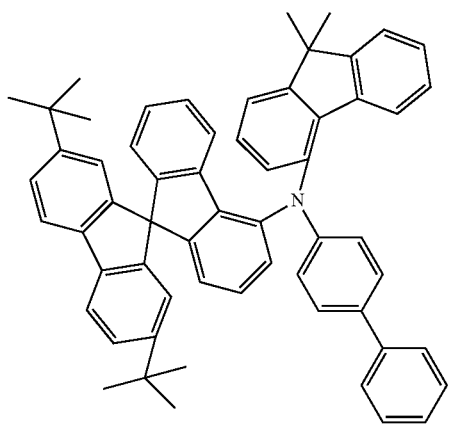
H31
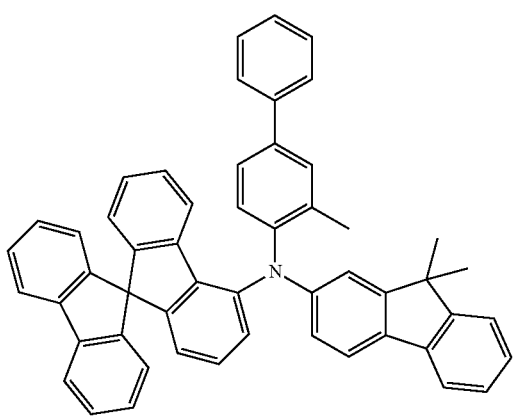

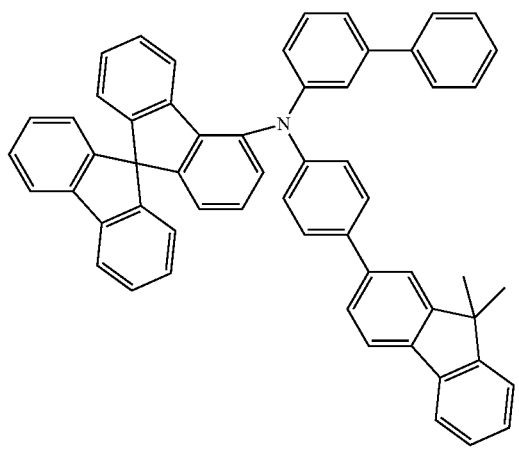
H32
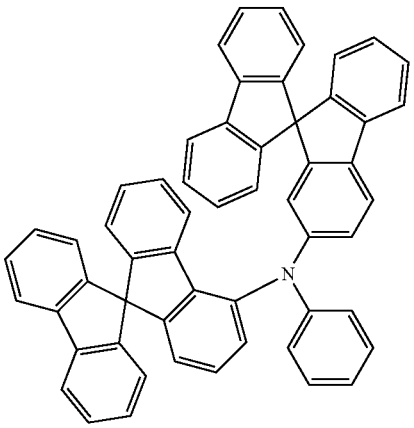
H35
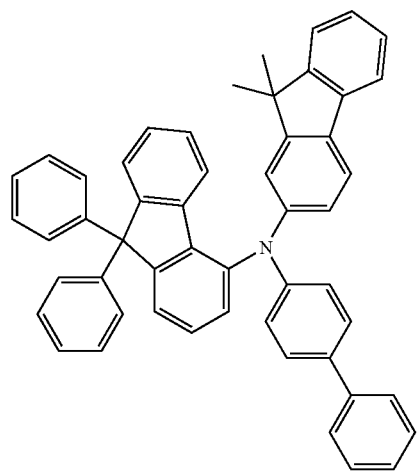
H33
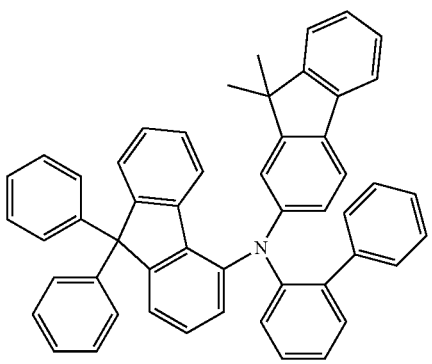
H36
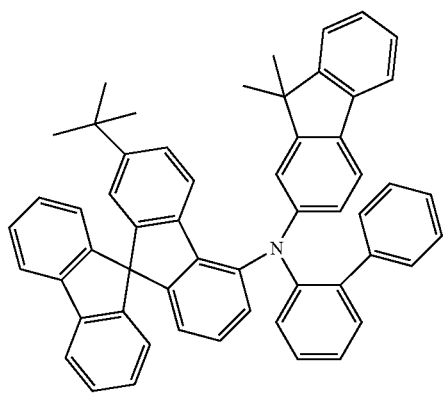
H34
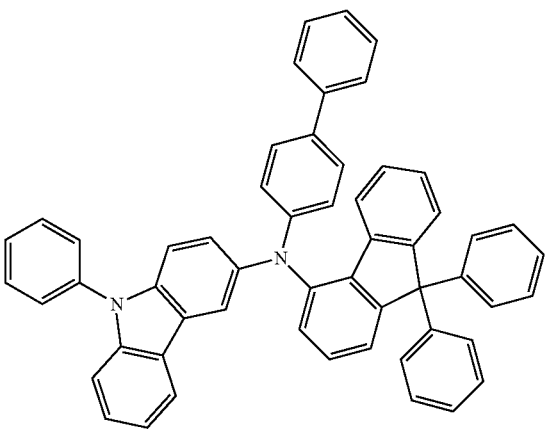
H37

-continued

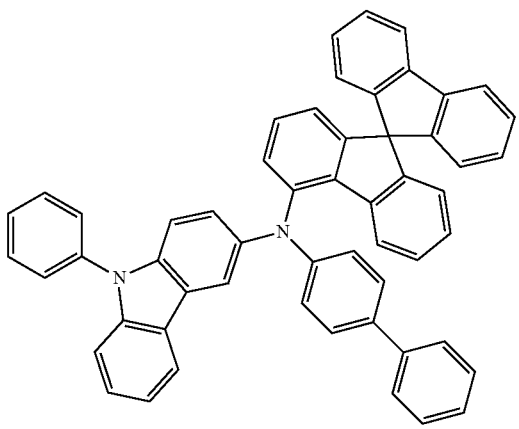

H38

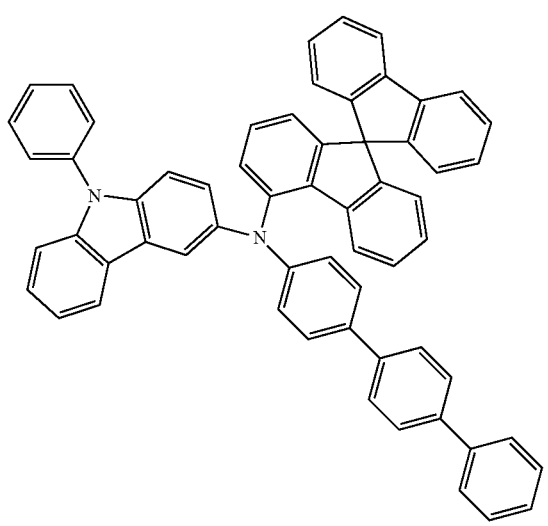

H39

Synthesis

1. Synthesis of the Compound A04
(1) Compound 4-A

[Reaction Formula 1-1]

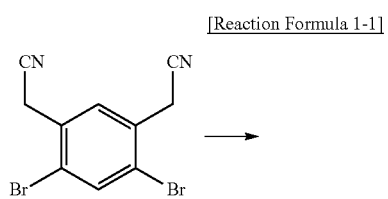

2,2'-(4,6-dibromo-1,3-phenylene)diacetonitrile (180 g, 573 mmol), toluene (6 L), copperiodide (CuI, 44 mmol), tetrakis(triphenylphosphine)palladium (44 mmol), diisopropylamine (2885 mmol) and 1-ethynyl-4-(trifluoromethyl)benzene (637 mmol) were mixed and heated to 100° C. After the reaction, the solvent (5 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 4-A (104 g). (yield 45%, MS[M+H]+=403)

(2) Compound 4-B

[Reaction Formula 1-2]

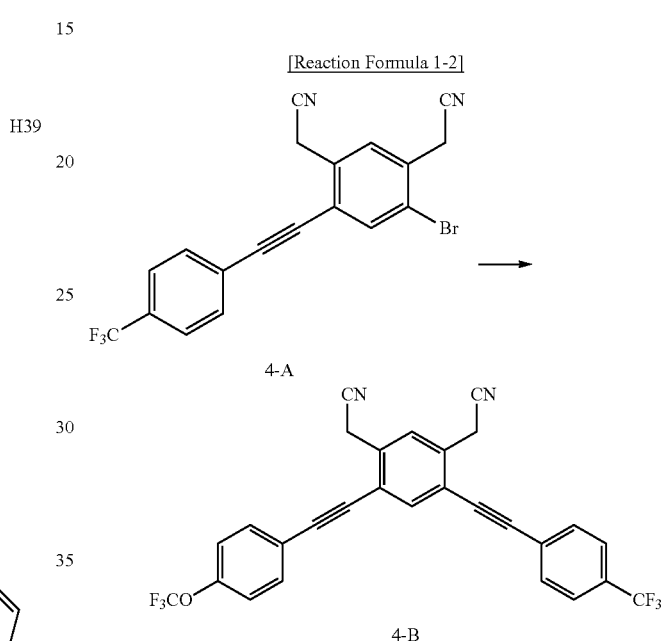

The compound 4-A (104 g, 258 mmol), toluene (3 L), CuI (21 mmol), tetrakis(triphenylphosphine)palladium (21 mmol), diisopropylamine (1290 mmol) and 1-ethynyl-4-(trifluoromethoxy)benzene (258 mmol) were mixed, heated to 100° C., and stirred for 2 hours. After the reaction, the solvent (2 L) was distilled off. The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 4-B (39.3 g). (yield 30%, MS[M+H]+=509).

(3) Compound 4-C

[Reaction Formula 1-3]

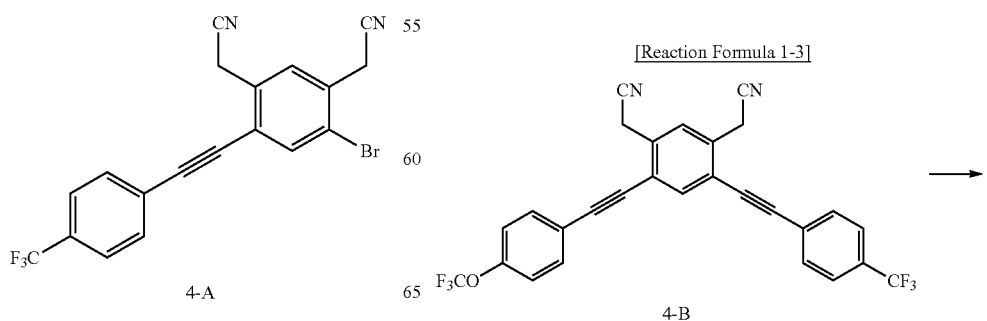

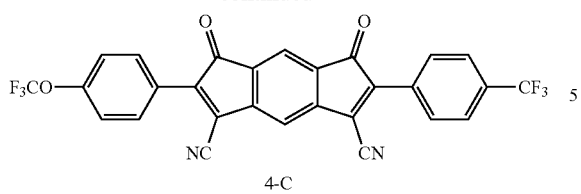

4-C

The compound 4-B (39 g, 77 mmol), 1,4-dioxane (520 mL), diphenyl sulfoxide (462 mmol), copper bromide (II) (CuBr(II), 15 mmol), palladium acetate (15 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 4-C (7 g). (yield 17%, MS[M+H]+=537)

(4) Compound A04

[Reaction Formula 1-4]

4-C

The compound 4-C (7 g, 13 mmol), dichloromethane (220 mL), and malononitrile (96 mmol) were added and cooled to 0° C. Titanium chloride (IV) (65 mmol) was slowly added and stirred for 1 hour while maintaining at 0° C. Pyridine (97.5 mmol) dissolved in dichloromethane (75 mL) was slowly added into the mixture at 0° C. and stirred for 1 hour. After the reaction was completed, acetic acid (130 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A04 (1.6 g). (yield 20%, MS[M+H]+=633)

2. Synthesis of the Compound A13
(1) Compound 13-A

[Reaction Formula 2-1]

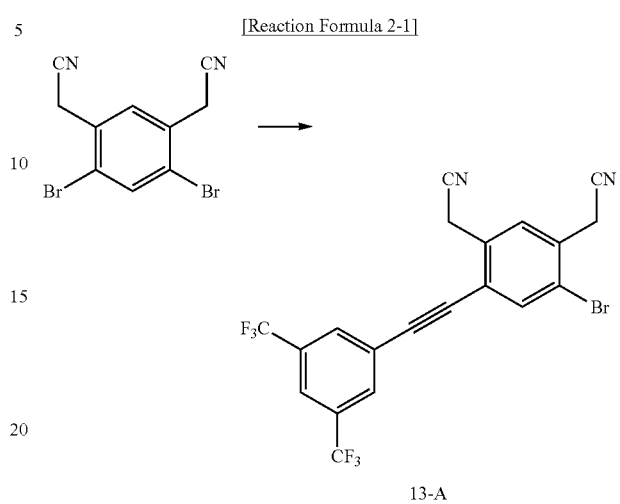

13-A 2,2'-(4,6-dibromo-1,3-phenylene)diacetonitrile (200 g, 637 mmol), toluene (6 L), copperiodide (CuI, 51 mmol), tetrakis(triphenylphosphine)palladium (51 mmol), diisopropylamine (3185 mmol) and 1-ethynyl-3,5-bis(trifluoromethyl)benzene (637 mmol) were mixed and heated to 100 ° C. . After the reaction, the solvent (5 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 13-A (105 g). (yield 35%, MS[M+H]+=471)

(2) Compound 13-B

[Reaction Formula 2-2]

13-A

13-B

The compound 13-A (105 g, 223 mmol), toluene (3 L), CuI (18 mmol), tetrakis(triphenylphosphine)palladium (18 mmol), diisopropylamine (1115 mmol) and 4-ethynyl-2-(trifluoromethyl)benzonitrile (223 mmol) were mixed, heated to 100° C., and stirred for 2 hours. After the reaction, the solvent (2 L) was distilled off The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 13-B (32.6 g). (yield 25%, MS[M+H]+=586)

(3) Compound 13-C

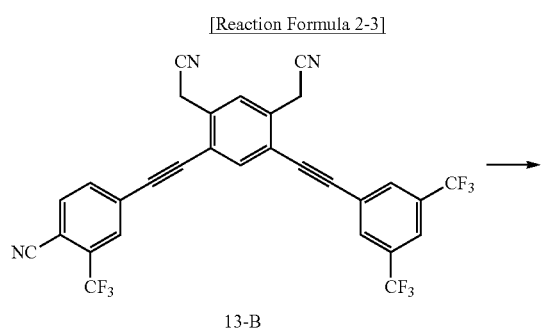

13-B

The compound 13-B (32 g, 55 mmol), 1,4-dioxane (480 mL), diphenyl sulfoxide (330 mmol), CuBr(II) (11 mmol), palladium acetate (11 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 13-C (5 g). (yield 15%, MS[M+H]+=614)

(4) Compound A13

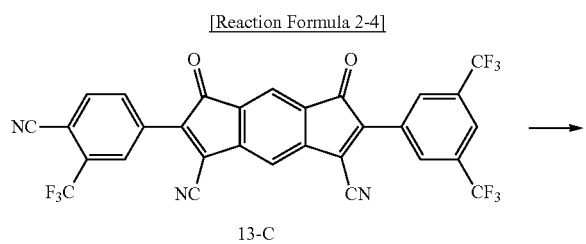

13-C

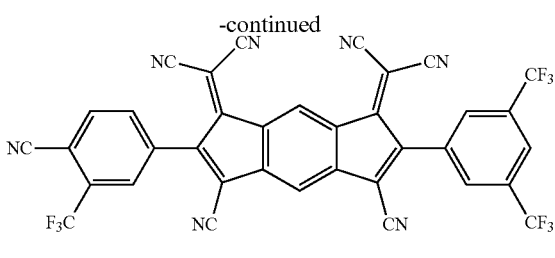

The compound 13-C (5 g, 8.2 mmol), dichloromethane (150 mL), and malononitrile (49.2 mmol) were added and cooled to 0° C. Titanium chloride (IV) (41 mmol) was slowly added and stirred for 1 hour while maintaining at 0° C. Pyridine (61.5 mmol) dissolved in dichloromethane (50 mL) was slowly added into the mixture at 0° C. and stirred for 1 hour. After the reaction was completed, acetic acid (82 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A13 (1 g). (yield 18%, MS[M+H]+=710)

3. Synthesis of the Compound A37

(1) Compound 37-A

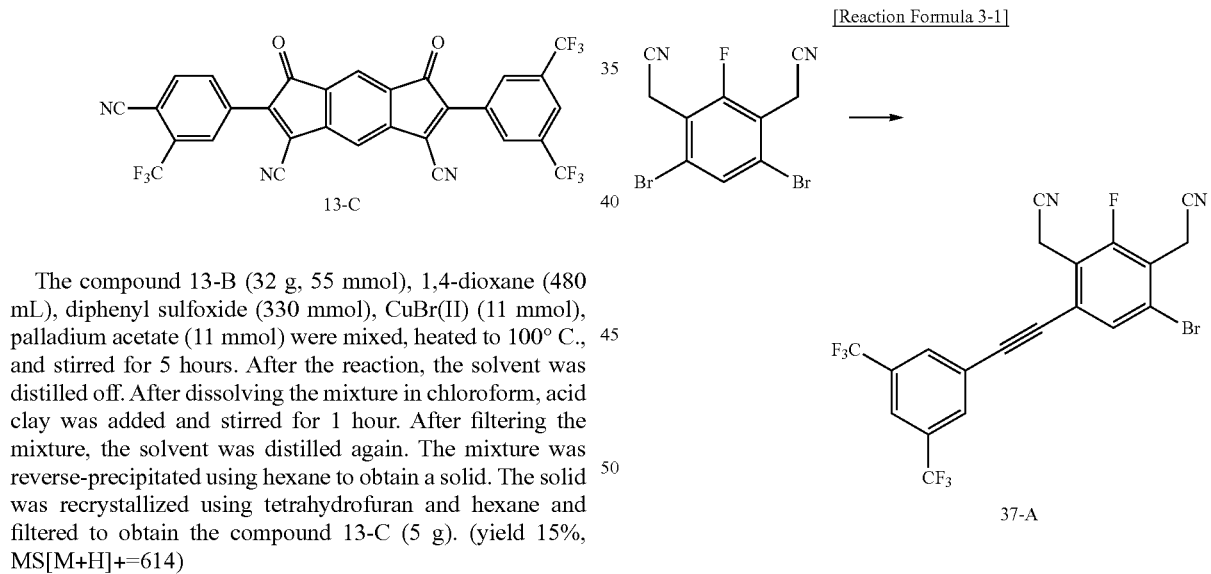

37-A 2,2'-(4,6-dibromo-2-fluoro-1,3-phenylene)diacetonitrile (300 g, 903.7 mmol), toluene (9 L), CuI (72.3 mmol), tetrakis(triphenylphosphine)palladium (72.3 mmol), diisopropylamine (4518 mmol) and 1-ethynyl-3,5-bis(trifluoromethyl)benzene (903.7 mmol) were mixed and heated to 100° C. After the reaction, the solvent (8 L) was distilled off. The mixture was cooled to room temperature and filtered to obtain a solid. After the solid was dissolved in chloroform and extracted with water, magnesium sulfate and acid clay were added and stirred for 1 hour. The mixture was filtered and the solvent was distilled again. The mixture was recrystallized using ethanol to obtain the compound 37-A (137 g). (yield 31%, MS[M+H]+=489)

(2) compound 37-B

[Reaction Formula 2-2]

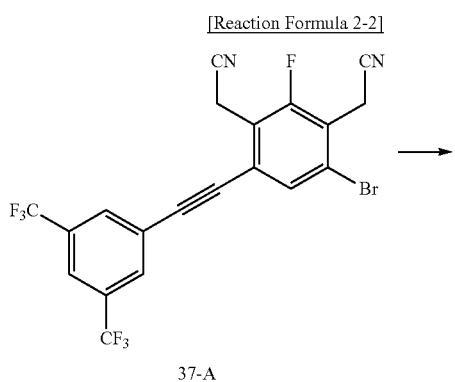

37-A

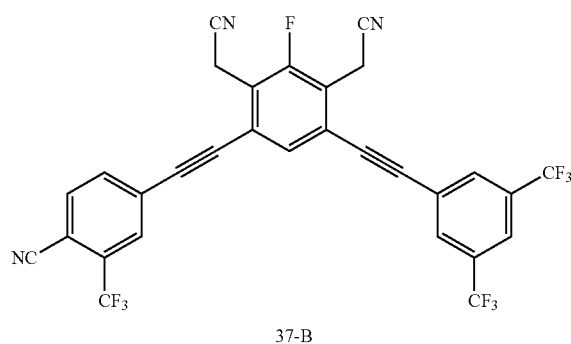

37-B

The compound 37-A (137 g, 280 mmol), toluene (4.1 L), CuI (22 mmol), tetrakis(triphenylphosphine)palladium (22 mmol), diisopropylamine (1400 mmol) and 4-ethynyl-2-(trifluoromethyl)benzonitrile (280 mmol) were mixed, heated to 100° C., and stirred for 2 hours. After the reaction, the solvent (3 L) was distilled off. The mixture was cooled to room temperature and filtered to obtain a solid. After the solid was dissolved in chloroform and extracted with water, magnesium sulfate and acid clay were added and stirred for 1 hour. After filtering the mixture, the solvent was distilled again. The mixture was recrystallized using tetrahydrofuran and ethanol to obtain the compound 37-B (33.8 g). (yield 20%, MS[M+H]+=603)

(3) Compound 37-C

[Reaction Formula 3-3]

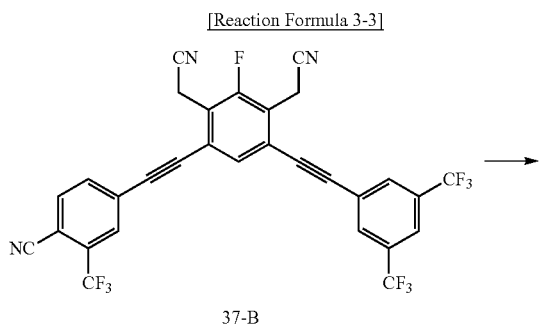

37-B

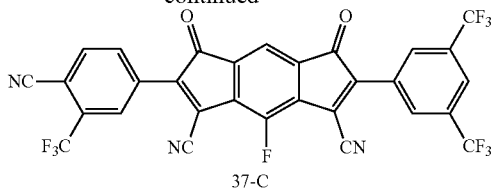

37-C

The compound 37-B (33 g, 54.7 mmol), 1,4-dioxane (500 mL), diphenyl sulfoxide (328.2 mmol), CuBr(II) (10.9 mmol), palladium acetate (10.9 mmol) were mixed, heated to 100° C., and stirred for 5 hours. After the reaction, the solvent was distilled off. After dissolving the mixture in chloroform, acid clay was added and stirred for 1 hour. After filtering the mixture, the solvent was distilled again. The mixture was reverse-precipitated using hexane to obtain a solid. The solid was recrystallized using tetrahydrofuran and hexane and filtered to obtain the compound 37-C (4.8 g). (yield 14%, MS[M+H]+=632)

(4) Compound 37

[Reaction Formula 3-4]

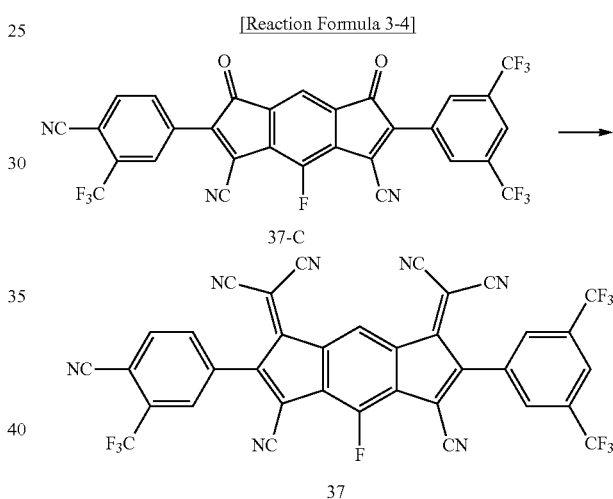

37

The compound 37-C (4.8 g, 7.6 mmol), dichloromethane (145 mL), and malononitrile (45.6 mmol) were added and cooled to 0° C. Titanium chloride (IV) (38 mmol) was slowly added and stirred for 1 hour while maintaining at 0° C. Pyridine (57 mmol) dissolved in dichloromethane (48 mL) was slowly added into the mixture at 0° C. and stirred for 1 hour. After the reaction was completed, acetic acid (76 mmol) was added and additionally stirred for 30 minutes. After the reaction solution was extracted with water, the organic layer was reverse-precipitated in hexane to obtain a solid. After filtering the solid through acetonitrile, magnesium sulfate and acid clay were added and stirred for 30 minutes. The solution was filtered, recrystallized using acetonitrile and toluene, and washed with toluene. The solid was recrystallized using acetonitrile and tert-butylmethylether and purified by sublimation to obtain the compound A37 (1.1 g). (yield 20%, MS[M+H]+=728)

The HIL 210 may further include a hole injection host material (not shown). Namely, the HIL 210 may be formed of only the hole injection material 212 being the organic compound in Formula 1-1 or may be formed of a mixture of the hole injection material 212 and the hole injection host material.

The hole injection host material may include at least one of 4,4',4"-tris(3-methylphenylamino)triphenylamine (MT-DATA), 4,4',4"-tris(N,N-diphenyl-amino)triphenylamine (NATA), 4,4',4"-tris(N-(naphthalene-1-yl)-N-phenyl-amino) triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPD), 1,4,5,8,9,11-hexaazatriphenylenehexacarbonitrile(dipyrazino[2,34:2'3'-h]quinoxaline-2,3,6,7,10, 11-hexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS) and N-(biphenyl-4-yl)-9,9-dimethyl-N-(4-(9-phenyl-9H-carbazol-3-yl)phenyl)-9H-fluoren-2-amine, but it is not limited thereto. For example, the hole injection host material may be NPD. In this instance, in the HIL 210, the hole injection material 212 may have a weight % of about 1 to 40, preferably about 5 to 20.

As described above, in the OLED of the present disclosure, the HIL 210 includes the hole injection material 212 being the organic compound in Formula 1-1, and the HTL 220 includes at least one of the first hole transporting material 222 being the organic compound in Formula 2 and the second hole transporting material 224 being the organic compound in Formula 3. As a result, the hole injection and transporting efficiency from the first electrode 160 into the EML 240 is improved. Accordingly, in the OLED D of the present disclosure, the driving voltage is reduced, and the emitting efficiency and the lifespan are improved.

Figure 4:
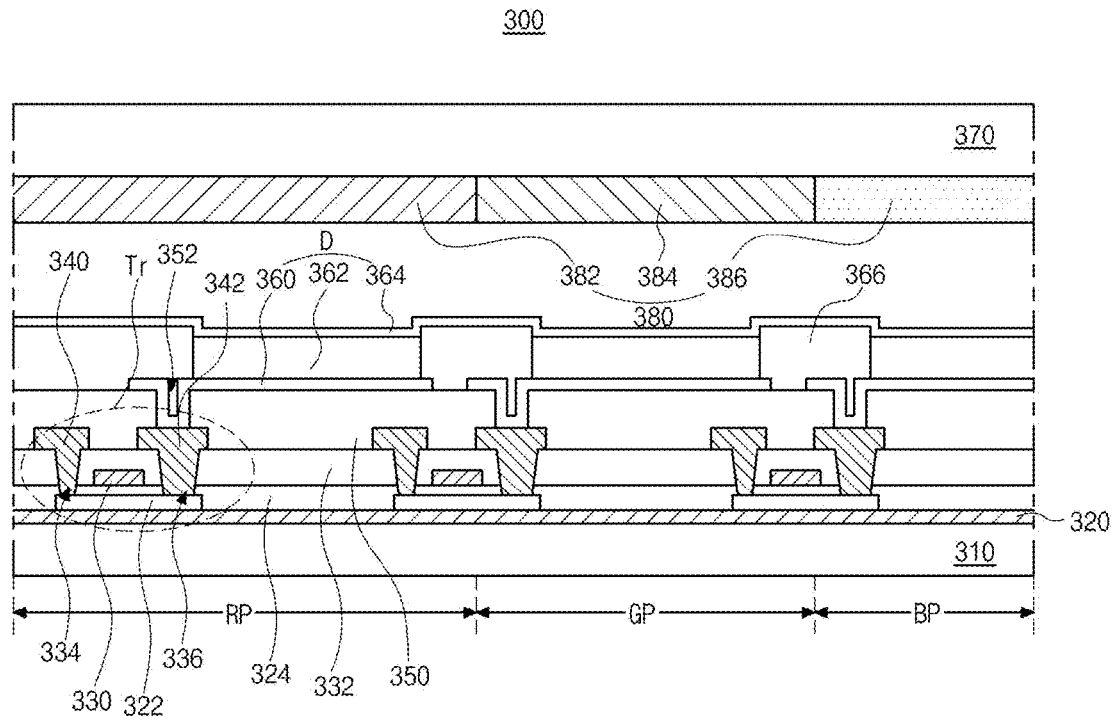
FIG. 4 is a schematic cross-sectional view of an organic light emitting device according to a third embodiment of the present disclosure.
Figure 5:
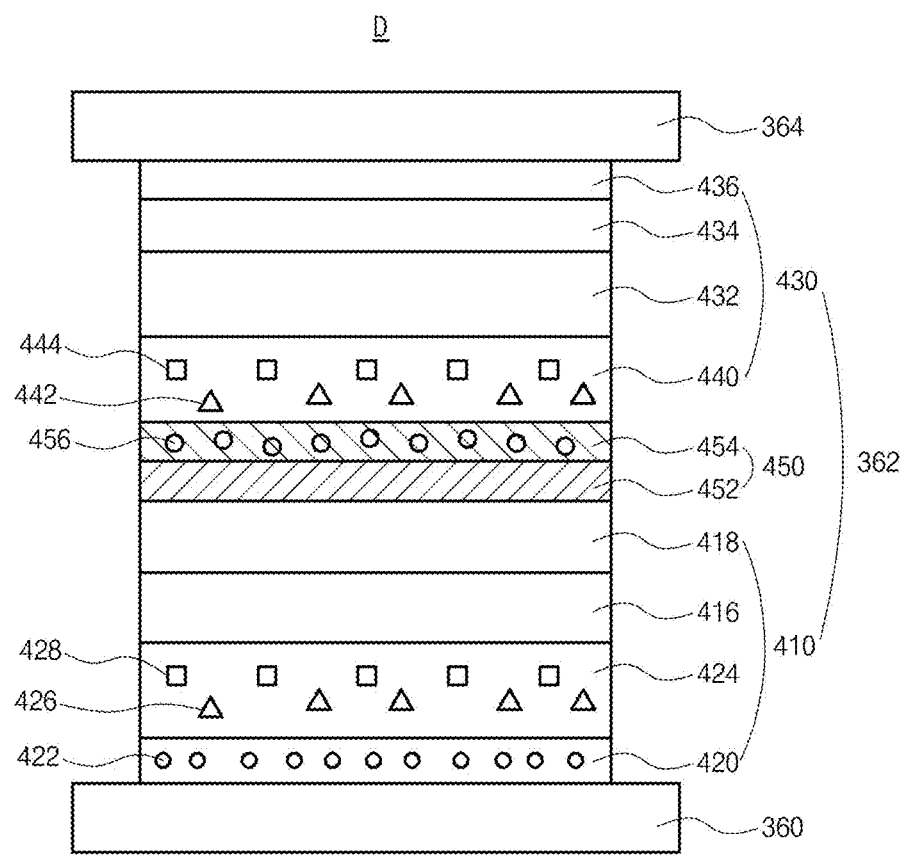
FIG. 5 is a schematic cross-sectional view of an OLED according to a fourth embodiment of the present disclosure.
Figure 6:
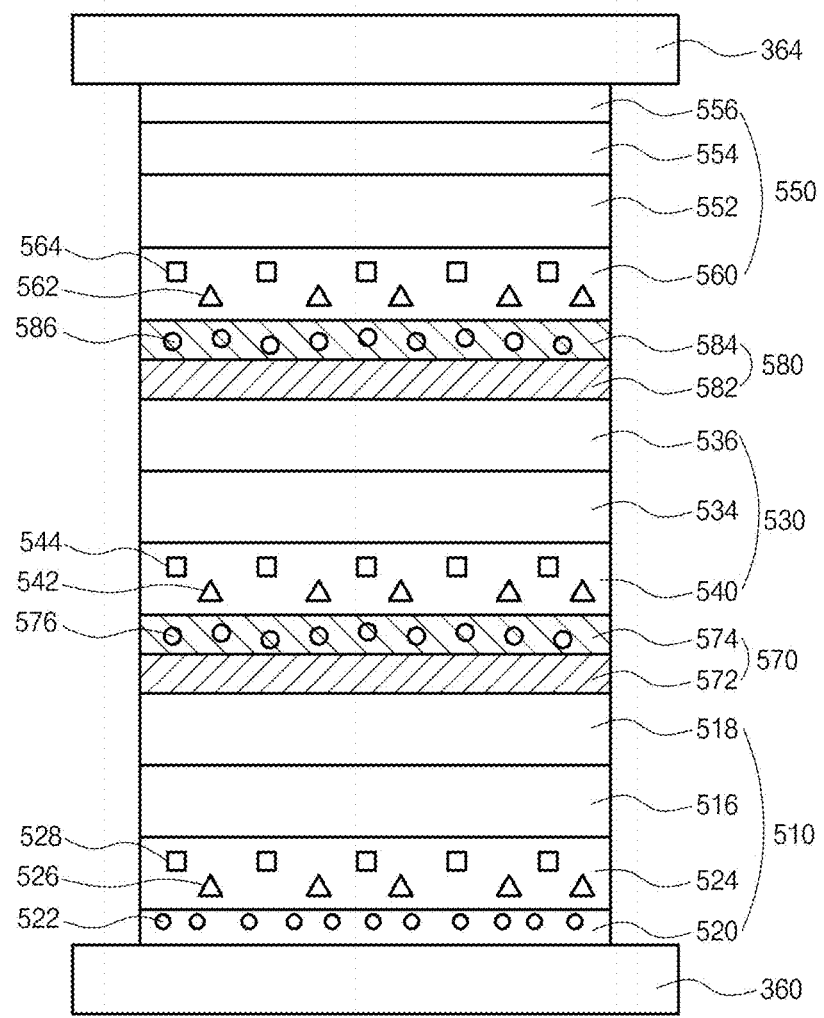
FIG. 6 is a schematic cross-sectional view of an OLED according to a fifth embodiment of the present disclosure.

FIG. 4 is a schematic cross-sectional view of an organic light emitting device according to a third embodiment of the present disclosure. FIG. 5 is a schematic cross-sectional view of an OLED according to a fourth embodiment of the present disclosure, and FIG. 6 is a schematic cross-sectional view of an OLED according to a fifth embodiment of the present disclosure.

As shown in FIG. 4, the organic light emitting display device 300 includes a first substrate 310, where a red pixel BP, a green pixel GP and a blue pixel BP are defined, a second substrate 370 facing the first substrate 310, an OLED D, which is positioned between the first and second substrates 310 and 370 and providing white emission, and a color filter layer 380 between the OLED D and the second substrate 370.

Each of the first and second substrates 310 and 370 may be a glass substrate or a flexible substrate. For example, each of the first and second substrates 310 and 370 may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 320 is formed on the substrate, and the TFT Tr corresponding to each of the red, green and blue pixels RP, GP and BP is formed on the buffer layer 320. The buffer layer 320 may be omitted.

A semiconductor layer 322 is formed on the buffer layer 320. The semiconductor layer 322 may include an oxide semiconductor material or polycrystalline silicon.

A gate insulating layer 324 is formed on the semiconductor layer 322. The gate insulating layer 324 may be formed of an inorganic insulating material such as silicon oxide or silicon nitride.

A gate electrode 330, which is formed of a conductive material, e.g., metal, is formed on the gate insulating layer 324 to correspond to a center of the semiconductor layer 322.

An interlayer insulating layer 332, which is formed of an insulating material, is formed on the gate electrode 330. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 330 to be spaced apart from the gate electrode 330.

A source electrode 340 and a drain electrode 342, which are formed of a conductive material, e.g., metal, are formed on the interlayer insulating layer 332.

The source electrode 340 and the drain electrode 342 are spaced apart from each other with respect to the gate electrode 330 and respectively contact both sides of the semiconductor layer 322 through the first and second contact holes 334 and 336.

The semiconductor layer 322, the gate electrode 330, the source electrode 340 and the drain electrode 342 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 350, which includes a drain contact hole 352 exposing the drain electrode 342 of the TFT Tr, is formed to cover the TFT Tr.

A first electrode 360, which is connected to the drain electrode 342 of the TFT Tr through the drain contact hole 352, is separately formed in each pixel and on the planarization layer 350. The first electrode 360 may be an anode and may be formed of a conductive material, e.g., transparent conductive oxide (TCO), having a relatively high work function. The first electrode 360 may further include a reflection electrode or a reflection layer. For example, the reflection electrode or the reflection layer may be formed of silver (Ag) or aluminum-palladium-copper (APC) alloy. In the top-emission type organic light emitting display device 300, the first electrode 360 may have a triple-layered structure of ITO/Ag/ITO or ITO/APC/ITO.

A bank layer 366 is formed on the planarization layer 350 to cover an edge of the first electrode 360. Namely, the bank layer 366 is positioned at a boundary of the pixel and exposes a center of the first electrode 360 in the pixel. Since the OLED D emits the white light in the red, green and blue pixels RP, GP and BP, the organic emitting layer 162 may be formed as a common layer in the red, green and blue pixels RP, GP and BP without separation. The bank layer 366 may be formed to prevent a current leakage at an edge of the first electrode 360 and may be omitted.

An organic emitting layer 362 is formed on the first electrode 360.

Referring to FIG. 5, the organic emitting layer 362 includes a first emitting part 410, which includes an HIL 420, a first HTL 424 and a first EML 416, a second emitting part 430, which includes a second HTL 440 and a second EML 432, and a charge generation layer (CGL) 450 between the first and second emitting parts 410 and 430.

The CGL 450 is positioned between the first and second emitting parts 410 and 430, and the first emitting part 410, the CGL 450 and the second emitting part 430 are sequentially stacked on the first electrode 360. Namely, the first emitting part 410 is positioned between the first electrode 360 and the CGL 450, and the second emitting part 430 is positioned between the second electrode 364 and the CGL 450.

In the first emitting part 410, the HIL 420 is positioned under the first EML 416, and the first HTL 424 is positioned between the HIL 420 and the first EML 416. Namely, the HIL 420 is positioned between the first electrode 360 and the first EML 416.

The first emitting part 410 may further include a first ETL 418 over the first EML 416.

Although not shown, the first emitting part 410 may further include at least one of an EBL between the first HTL 424 and the first EML 416 and an HBL between the first EML 416 and the first ETL 418. For example, the EBL may include TCTA.

In the second emitting part 430, the second HTL 440 is positioned under the second EML 432.

The second emitting part 430 may further include at least one of an EIL 436 over the second EML 432 and a second ETL 434 between the second EML 432 and the EIL 436.

Although not shown, the second emitting part 430 may further include at least one of an EBL between the second HTL 440 and the second EML 432 and an HBL between the second EML 432 and the second ETL 434. For example, the EBL may include TCTA.

One of the first and second EMLs 416 and 432 provides a light having a wavelength range of about 440 to 480 nm, and the other one of the first and second EMLs 416 and 432 provides a light having a wavelength range of about 500 to 550 nm. For example, the first EML 416 may provide the light having a wavelength range of about 440 to 480 nm, and the second EML 432 may provide the light having a wavelength range of about 500 to 550 nm. Alternatively, the second EML 432 may have a double-layered structure of a first layer emitting red light and a second layer emitting green light. In this instance, the first layer emitting the red light may include a host and a red dopant, and the second layer emitting the green light may include a host and a green dopant.

In the first EML 416 having the wavelength range of 440 to 480 nm, a host may be an anthracene derivative, and a dopant may be a pyrene derivative. For example, in the first EML 416, the host may be 9,10-di(naphtha-2-yl)anthracene, and the dopant may be 1,6-bis(diphenylamino)pyrene. In the second EML 432 having the wavelength range of 500 to 550 nm, a host may be carbazole derivative, and the dopant may be iridium derivative (complex). For example, in the second EML 434, the host may be 4,4'-bis(N-Carbazolyl)-1,1'-biphenyl (CBP), and the dopant may be tris(2-phenylpyridine) Iridium(III) (Ir(ppy)$_3$).

The CGL 450 includes an n-type CGL 452 and a p-type CGL 454. The n-type CGL 452 is positioned between the first ETL 418 and the second HTL 440, and the p-type CGL 454 is positioned between the n-type CGL 452 and the second HTL 440.

The n-type CGL 452 provides the electron toward the first ETL 418, and the electron is transferred into the first EML 416 through the first ETL 418. The p-type CGL 454 provides the hole toward the second HTL 440, and the hole is transferred into the second EML 432 through the second HTL 440. As a result, in the OLED D having a two-stack (double-stack) structure, the driving voltage is reduced, and the emitting efficiency is improved.

The n-type CGL 452 includes an n-type charge generation material and may have a thickness of 100 to 200 Å. For example, the n-type charge generation material may be selected from the group consisting of tris-(8-hydroxyquinoline) aluminum (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1'-biphenyl-4-olato)aluminum (BAlq), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), poly[9,9-bis(3'-((N,N-dimethyl)-N-ethylammonium)-propyl)-2,7-fluorenel-alt-2,7-(9,9-dioctylfluorene)] (PFNBr), tris(phenylquinoxaline (TPQ), and diphenyl-4-triphenylsilyl-phenylphosphine oxide (TSPO1). In one embodiment of the present disclosure, the n-type charge generation material may be phenanthroline derivative, e.g., bathophenanthroline (Bphen).

In addition, the n-type CGL 452 may further include an auxiliary n-type charge generation material. For example, the auxiliary n-type charge generation material may be alkali metal, e.g., Li, Cs, K, Rb, Na or Fr, or alkali earth metal, e.g., Be, Mg, Ca, Sr, Ba or Ra. In the n-type CGL 452, the auxiliary n-type charge generation material may have a weight % of about 0.1 to 20, preferably about 1 to 10.

At least one of the HIL 420 and the p-type CGL 454 includes the organic compound in Formula 1-1. For example, the HIL 420 may include the organic compound in Formula 1-1 as a hole injection material 422, and the p-type CGL 454 may include the organic compound in Formula 1-1 as a p-type charge generation material 456.

The hole injection material 422 in the HIL 420 and the p-type charge generation material 456 in the p-type CGL 454 may be same or different.

The HIL 420 may have a thickness of about 50 to 200 Å. When the HIL 420 includes the organic compound in Formula 1-1 as the hole injection material 422, the HIL 420 may further include a hole injection host material (not shown). Namely, the HIL 420 may be formed of only the hole injection material 422 being the organic compound in Formula 1-1 or may be formed of a mixture of the hole injection material 422 and the hole injection host material.

The hole injection host material may be NPD. In this instance, in the HIL 420, the hole injection material 422 may have a weight % of about 1 to 40, preferably about 5 to 20.

The p-type CGL 454 may have a thickness of about 100 to 200 Å. When the p-type CGL 454 includes the organic compound in Formula 1-1 as the p-type charge generation material 456, the p-type CGL 454 may further include a p-type charge generation host material (not shown). Namely, the p-type CGL 454 may be formed of only the p-type charge generation material 456 being the organic compound in Formula 1-1 or may be formed of a mixture of the p-type charge generation material 456 and the p-type charge generation host material.

For example, the p-type charge generation host material may include at least one of 4,4',4"-tris(3-methylphenylamino)triphenylamine (MTDATA), 4,4',4"-tris(N,N-diphenyl-amino)triphenylamine (NATA), 4,4',4"-tris(N-

(naphthalene-1-yl)-N-phenyl-amino)triphenylamine (1T-NATA), 4,4',4"-tris(N-(naphthalene-2-yl)-N-phenyl-amino) triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPD), 1,4,5,8,9,11-hexaazatriphenylenehexacarbonitrile (dipyrazino[2,34:2'3'-h]quinoxaline-2,3,6,7,10,11-hexacarbonitrile (HAT-CN), 1,3,5-tris[4-(diphenylamino)phenyl] benzene (TDAPB), poly(3,4-ethylenedioxythiophene) polystyrene sulfonate (PEDOT/PSS) and N-(biphenyl-4-yl)-9,9-dimethyl-N-(4-(9-phenyl-9H-carbazol-3-yl)phenyl)-9H-fluoren-2 -amine, but it is not limited thereto. For example, the p-type charge generation host material may be NPD. In this instance, in the p-type CGL 454, the p-type charge generation material 456 may have a weight % of about 1 to 40, preferably about 10 to 30.

When the HIL 420 includes the hole injection host material and the hole injection material 422 in Formula 1-1 and the p-type CGL 454 includes the p-type charge generation host material and the p-type charge generation material 456, a weight % of the p-type charge generation material 456 in the p-type CGL 454 may be equal to or greater than that of the hole injection material 422 in the HIL 420.

At least one of the first and second HTL 424 and 440 includes at least one of a first hole transporting material being the organic compound in Formula 2 and a second hole transporting material being the organic compound in Formula 3. For example, the first HTL 424 may include at least one of a first hole transporting material 426 being the organic compound in Formula 2 and a second hole transporting material 428 being the organic compound in Formula 3, and the second HTL 440 may include at least one of a first hole transporting material 442 being the organic compound in Formula 2 and a second hole transporting material 444 being the organic compound in Formula 3.

Namely, the first HTL 424 may be formed of only the first hole transporting material 426, may be formed of only the second hole transporting material 428, or may be formed of a mixture of the first and second hole transporting materials 426 and 428. The second HTL 440 may be formed of only the first hole transporting material 442, may be formed of only the second hole transporting material 444, or may be formed of a mixture of the first and second hole transporting materials 442 and 444.

When the first and second hole transporting materials 426 and 428 are included in the first HTL 424 and the first and second hole transporting materials 442 and 444 are included in the second HTL 440, the first hole transporting material 426 has a first weight % in the first HTL 424 and the first hole transporting material 442 has a second weight %, which is smaller than the first weight %, in the second HTL 440. In other words, the weight % of the second hole transporting material 444 in the second HTL 440 may be greater than that of the second hole transporting material 428 in the first HTL 424. Since the second HTL 440 is closer to the second electrode 364 as the cathode than the first HTL 424, the weight % of the second hole transporting material 444 in the second HTL 440 is increased such that a shift of an emission zone in the second EML 432 toward the second HTL 440 can be prevented. Accordingly, the emission zone in the second EML 432 can be presented in a center of the second EML 432, and the emitting efficiency and the lifespan of the OLED D can be improved.

A thickness of the first HTL 424 may be greater than that of the second HTL 440. For example, the first HTL 424 may have a thickness of about 500 to 1500 Å, preferably 700 to 1200 Å, and the second HTL 440 may have a thickness of about 200 to 400 Å, preferably 100 to 300 Å.

The OLED D including the first emitting part 410 having the wavelength range of 440 to 480 nm and the second emitting part 430 having the wavelength range of 500 to 550 nm provides the white emission, and the CGL 450 is provided between the first and second emitting parts 410 and 430. As a result, the OLED D has advantages in the driving voltage, the emitting efficiency and the lifespan.

In addition, at least one of the HIL 420 and the p-type CGL 454 includes the organic compound in Formula 1-1, and at least one of the first and second HTLs 424 and 440 includes at least one of the organic compound in Formula 2 and the organic compound in Formula 3. As a result, in the OLED D, the driving voltage is further reduced, and the emitting efficiency and the lifespan are further improved.

Referring to FIG. 6, the organic emitting layer 362 includes a first emitting part 510 including an HIL 520, a first HTL 524 and a first EML 516, a second emitting part 530 including a second HTL 540 and a second EML 534, a third emitting part 550 including a third HTL 560 and a third EML 552, a first CGL 570 between the first and second emitting parts 510 and 530 and a second CGL 580 between the second and third emitting parts 530 and 550.

The first CGL 570 is positioned between the first and second emitting parts 510 and 530, and the second CGL 580 is positioned between the second and third emitting parts 530 and 550. Namely, the first emitting part 510, the first CGL 570, the second emitting part 530, the second CGL 580 and the third emitting part 550 are sequentially stacked on the first electrode 360. In other words, the first emitting part 510 is positioned between the first electrode 360 and the first CGL 570, the second emitting part 530 is positioned between the first and second CGLs 570 and 580, and the third emitting part 550 is positioned between the second CGL 580 and the second electrode 364.

In the first emitting part 510, the HIL 520 is positioned under the first EML 516, and the first HTL 524 is positioned between the HIL 520 and the first EML 516. Namely, the HIL 520 is positioned between the first electrode 360 and the first EML 516.

The first emitting part 510 may further include a first ETL 518 over the first EML 516.

Although not shown, the first emitting part 510 may further include at least one of an EBL between the first HTL 524 and the first EML 516 and an HBL between the first EML 516 and the first ETL 518. For example, the EML may include TCTA.

In the second emitting part 530, the second HTL 540 is positioned under the second EML 534.

The second emitting part 530 may further include a second ETL 536 over the second EML 534.

Although not shown, the second emitting part 530 may further include at least one of an EBL between the second HTL 540 and the second EML 534 and an HBL between the second EML 534 and the second ETL 536. For example, the EML may include TCTA.

In the third emitting part 550, the third HTL 560 is positioned under the third EML 552.

The third emitting part 550 may further include an EIL 556 over the third EML 552 and a third ETL 554 between the third EML 552 and the EIL 556.

Although not shown, the third emitting part 550 may further include at least one of an EBL between the third HTL 560 and the third EML 552 and an HBL between the third EML 552 and the third ETL 554. For example, the EML may include TCTA.

Each of the first and third EMLs 516 and 552 provides a light having a wavelength range of about 440 to 480 nm, and the second EML 534 provides a light having a wavelength range of about 500 to 550 nm. Alternatively, the second EML 534 may have a double-layered structure of a first layer emitting red light and a second layer emitting green light. In addition, the second EML 534 may have a triple-layered structure of a first layer including a host and a red dopant, a second layer including a host and a yellow-green dopant and a third layer including a host and a green dopant.

In each of the first and third EMLs 516 and 552, which provides a light having a wavelength range of about 440 to 480 nm, a host may be an anthracene derivative, and a dopant may be a pyrene derivative. For example, in each of the first and third EMLs 516 and 552, the host may be 9,10-di(naphtha-2-yl)anthracene, and the dopant may be 1,6-bis(diphenylamino)pyrene.

In the second EML 534, which provides a light having a wavelength range of about 500 to 550 nm, a host may be carbazole derivative, and the dopant may be iridium derivative (complex). For example, in the second EML 534, the host may be 4,4'-bis(N-Carbazolyl)-1,1'-biphenyl (CBP), and the dopant may be tris(2-phenylpyridine) Iridium(III) (Ir(ppy)$_3$).

The first CGL 570 includes a first n-type CGL 572 and a first p-type CGL 574. The first n-type CGL 572 is positioned between the first ETL 518 and the second HTL 540, and the first p-type CGL 574 is positioned between the first n-type CGL 572 and the second HTL 540.

The second CGL 580 includes a second n-type CGL 582 and a second p-type CGL 584. The second n-type CGL 582 is positioned between the second ETL 536 and the third HTL 560, and the second p-type CGL 584 is positioned between the second n-type CGL 582 and the third HTL 560.

The first n-type CGL 572 provides the electron toward the first ETL 518, and the electron is transferred into the first EML 516 through the first ETL 518. The first p-type CGL 574 provides the hole toward the second HTL 540, and the hole is transferred into the second EML 534 through the second HTL 540.

The second n-type CGL 582 provides the electron toward the second ETL 536, and the electron is transferred into the second EML 534 through the second ETL 536. The second p-type CGL 584 provides the hole toward the third HTL 560, and the hole is transferred into the third EML 552 through the third HTL 560.

As a result, in the OLED D having a three-stack (triple-stack) structure, the driving voltage is reduced, and the emitting efficiency is improved.

Each of the first and second n-type CGLs 572 and 582 includes an n-type charge generation material and may have a thickness of 100 to 200 Å. For example, the n-type charge generation material may be Bphen. In addition, each of the first and second n-type CGLs 572 and 582 may further include an auxiliary n-type charge generation material. For example, the auxiliary n-type charge generation material may be alkali metal or alkali earth metal.

At least one of the HIL 520, the first p-type CGL 574 and the second p-type CGL 584 includes the organic compound in Formula 1-1. For example, the HIL 520 may include the organic compound in Formula 1-1 as a hole injection material 522. The first p-type CGL 574 may include the organic compound in Formula 1-1 as a first p-type charge generation material 576, and the second p-type CGL 584 may include the organic compound in Formula 1-1 as a second p-type charge generation material 586.

The hole injection material 522 in the HIL 520, and the first p-type charge generation material 576 in the first p-type CGL 574, and the third p-type charge generation material 586 in the second p-type CGL 584 may be same or different.

The HIL 520 may have a thickness of about 50 to 200 Å. When the HIL 520 includes the organic compound in Formula 1-1 as the hole injection material 522, the HIL 520 may further include a hole injection host material (not shown). Namely, the HIL 520 may be formed of only the hole injection material 522 being the organic compound in Formula 1-1 or may be formed of a mixture of the hole injection material 522 and the hole injection host material.

The hole injection host material may be NPD. In this instance, in the HIL 520, the hole injection material 522 may have a weight % of about 1 to 40, preferably about 5 to 20.

Each of the first and second p-type CGLs 574 and 584 may have a thickness of about 100 to 200 Å. When the first and second p-type CGLs 574 and 584 include the organic compound in Formula 1-1 as the first and second p-type charge generation materials 576 and 586, respectively, each of the first and second p-type CGLs 574 and 584 may further include a p-type charge generation host material (not shown). Namely, the first second p-type CGL 574 may be formed of only the first p-type charge generation material 576 being the organic compound in Formula 1-1 or may be formed of a mixture of the first p-type charge generation material 576 and the p-type charge generation host material. The second p-type CGLs 584 may be formed of only the second p-type charge generation material 586 being the organic compound in Formula 1-1 or may be formed of a mixture of the second p-type charge generation material 586 and the p-type charge generation host material.

For example, the p-type charge generation host material may be NPD. In this instance, in each of the first and second p-type CGLs 574 and 584, each of the first and second charge generation materials 576 and 586 may have a weight % of about 1 to 40, preferably about 10 to 30.

When the HIL 520 includes the hole injection host material and the hole injection material 522 in Formula 1-1, the first p-type CGL 574 includes the p-type charge generation host material and the first p-type charge generation material 576, and the second p- type CGL 584 includes the p-type charge generation host material and the second p-type charge generation material 586, a weight % of each of the first and second p-type charge generation materials 576 and 586 in each of the first and second p-type CGLs 574 and 584 may be equal to or greater than that of the hole injection material 522 in the HIL 520.

At least one of the first to third HTL 524, 540 and 560 includes at least one of a first hole transporting material being the organic compound in Formula 2 and a second hole transporting material being the organic compound in Formula 3.

For example, the first HTL 524 may include at least one of a first hole transporting material 526 being the organic compound in Formula 2 and a second hole transporting material 528 being the organic compound in Formula 3, the second HTL 540 may include at least one of a first hole transporting material 542 being the organic compound in Formula 2 and a second hole transporting material 544 being the organic compound in Formula 3, and the third HTL 560 may include at least one of a first hole transporting material 562 being the organic compound in Formula 2 and a second hole transporting material 564 being the organic compound in Formula 3.

Namely, the first HTL 524 may be formed of only the first hole transporting material 526, may be formed of only the second hole transporting material 528, or may be formed of a mixture of the first and second hole transporting materials 526 and 528. The second HTL 540 may be formed of only the first hole transporting material 542, may be formed of only the second hole transporting material 544, or may be formed of a mixture of the first and second hole transporting materials 542 and 544. The third HTL 560 may be formed of only the first hole transporting material 562, may be formed of only the second hole transporting material 564, or may be formed of a mixture of the first and second hole transporting materials 562 and 564.

When the first and second hole transporting materials 526 and 528 are included in the first HTL 524, the first and second hole transporting materials 542 and 544 are included in the second HTL 540, and the first and second hole transporting materials 562 and 564 are included in the third HTL 560, the first hole transporting material 526 has a first weight % in the first HTL 524, and the first hole transporting material 542 has a second weight %, which is smaller than the first weight %, in the second HTL 540. In addition, the first hole transporting material 562 has a third weight %, which is smaller than the first weight %, in the third HTL 560. In other words, each of the weight % of the second hole transporting material 544 in the second HTL 540 and the weight % of the second hole transporting material 564 in the third HTL 560 may be greater than that of the second hole transporting material 528 in the first HTL 524. Accordingly, the emission zone in the second and third EMLs 534 and 552 can be presented in a center of the second and third EMLs 534 and 552, and the emitting efficiency and the lifespan of the OLED D can be improved.

A thickness of the first HTL 524 may be greater than that of each of the second and third HTLs 540 and 560. For example, the first HTL 524 may have a thickness of about 500 to 1500 Å, preferably 700 to 1200 Å, and each of the second and third HTLs 540 and 560 may have a thickness of about 200 to 400 Å, preferably 100 to 300 Å.

The OLED D including the first and third emitting parts 510 and 550 each having the wavelength range of 440 to 480 nm and the second emitting part 530 having the wavelength range of 500 to 550 nm provides the white emission, and the first and second CGLs 570 and 580 are provided between the first and second emitting parts 510 and 530 and between the second and third emitting parts 530 and 550, respectively. As a result, the OLED D has advantages in the driving voltage, the emitting efficiency and the lifespan.

Referring FIG. 4, a second electrode 364 is formed over the first substrate 310 where the organic emitting layer 362 is formed.

In the organic light emitting display device 300, since the light emitted from the organic emitting layer 362 is incident to the color filter layer 380 through the second electrode 364, the second electrode 364 has a thin profile for transmitting the light.

The first electrode 360, the organic emitting layer 362 and the second electrode 364 constitute the OLED D.

The color filter layer 380 is positioned over the OLED D and includes a red color filter 382, a green color filter 384 and a blue color filter 386 respectively corresponding to the red, green and blue pixels RP, GP and BP. The red color filter 382 may include at least one of red dye and red pigment, the green color filter 384 may include at least one of green dye and green pigment, and the blue color filter 386 may include at least one of blue dye and blue pigment.

Although not shown, the color filter layer 380 may be attached to the OLED D by using an adhesive layer. Alternatively, the color filter layer 380 may be formed directly on the OLED D.

An encapsulation film (not shown) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate (not shown) for reducing an ambient light reflection may be disposed over the top-emission type OLED D. For example, the polarization plate may be a circular polarization plate.

In the OLED of FIG. 4, the first and second electrodes 360 and 364 are a reflection electrode and a transparent (or semi-transparent) electrode, respectively, and the color filter layer 380 is disposed over the OLED D. Alternatively, when the first and second electrodes 360 and 364 are a transparent (or semi-transparent) electrode and a reflection electrode, respectively, the color filter layer 380 may be disposed between the OLED D and the first substrate 310.

A color conversion layer (not shown) may be formed between the OLED D and the color filter layer 380. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively. For example, the color conversion layer may include a quantum dot. Accordingly, the color purity of the organic light emitting display device 300 may be further improved.

The color conversion layer may be included instead of the color filter layer 380.

As described above, in the organic light emitting display device 300, the OLED D in the red, green and blue pixels RP, GP and BP emits the white light, and the white light from the organic light emitting diode D passes through the red color filter 382, the green color filter 384 and the blue color filter 386. As a result, the red light, the green light and the blue light are provided from the red pixel RP, the green pixel GP and the blue pixel BP, respectively.

In FIG. 4, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

In the OLED D and the organic light emitting display device 300, at least one of the HIL and the p-type CGL includes the organic compound in Formula 1-1, and at least one of the HTLs includes the organic compound in Formula 2 and the organic compound in Formula 3. As a result, the hole injection/transporting property toward the EML is improved. Accordingly, in the OLED D and the organic light emitting display device 300, the driving voltage is decreased, and the emitting efficiency and the lifespan are improved.

OLED

On the anode (ITO), the HIL (HIL, 100 Å), the HTL (HTL, 900 Å), the EBL (EBL, 150 Å, TCTA), the EML (EML, 200 Å, the host (9,10-di(naphtha-2-yl)anthracene)

and the dopant (1,6-bis(diphenylamino)pyrene, 3 wt %)), the ETL (ETL, 200 Å, 1,3,5-tri(m-pyridin-3-ylphenyl)benzene (TmPyPB)), the EIL (LiF, 10 Å) and the cathode (Al, 1500 Å) were sequentially deposited to form the OLED.

1. COMPARATIVE EXAMPLES (1) Comparative Example 1 (Ref1)

The HIL is formed by using NPD and HATCN (10 wt %), and the HTL is formed by using NPD.

(2) Comparative Example 2 (Ref2)

The HIL is formed by using NPD and HATCN (10 wt %), and the HTL is formed by using the compound H01 in Formula 5.

(3) Comparative Example 3 (Ref3)

The HIL is formed by using NPD and HATCN (10 wt %), and the HTL is formed by using the compound H33 in Formula 6.

(4) Comparative Example 4 (Ref4)

The HIL is formed by using NPD and HATCN (10 wt %), and the HTL is formed by using the compound H01 (50 wt %) in Formula 5 and the compound H33 (50 wt %) in Formula 6.

2. EXAMPLES (1) Example 1 (Ex1)

The HIL is formed by using NPD and the compound S07 (10 wt %) in Formula 5, and the HTL is formed by using the compound H01 in Formula 5.

(2) Example 2 (Ex2)

The HIL is formed by using NPD and the compound S07 (10 wt %) in Formula 5, and the HTL is formed by using the compound H33 in Formula 6.

(3) Example 3 (Ex3)

The HIL is formed by using NPD and the compound S07 (10 wt %) in Formula 5, and the HTL is formed by using the compound H01 (50 wt %) in Formula 5 and the compound H33 (50 wt %) in Formula 6.

(4) Example 4 (Ex4)

The HIL is formed by using NPD and the compound S20 (10 wt %) in Formula 5, and the HTL is formed by using the compound H01 in Formula 5.

(5) Example 5 (Ex5)

The HIL is formed by using NPD and the compound S20 (10wt %) in Formula 5, and the HTL is formed by using the compound H33 in Formula 6.

(6) Example 6 (Ex6)

The HIL is formed by using NPD and the compound S20 (10 wt %) in Formula 5, and the HTL is formed by using the compound H01 (50 wt %) in Formula 5 and the compound H33 (50 wt %) in Formula 6.

(7) Example 7 (Ex7)

The HIL is formed by using NPD and the compound A13 (10 wt %) in Formula 5, and the HTL is formed by using the compound H01 in Formula 5.

(8) Example 8 (Ex8)

The HIL is formed by using NPD and the compound A13 (10 wt %) in Formula 5, and the HTL is formed by using the compound H33 in Formula 6.

(9) Example 9 (Ex9)

The HIL is formed by using NPD and the compound A13 (10 wt %) in Formula 5, and the HTL is formed by using the compound H01 (50 wt %) in Formula 5 and the compound H33 (50 wt %) in Formula 6.

(10) Example 10 (Ex10)

The HIL is formed by using NPD and the compound A13 (10 wt %) in Formula 5, and the HTL is formed by using the compound H15 (50 wt%) in Formula 5 and the compound H26 (50 wt %) in Formula 6.

In the OLEDs of Comparative Examples 1 to 4 (Ref1 to Ref4) and Examples 1 to 10 (Ex1 to Ex10), the properties, i.e., the driving voltage (V), the efficiency (Cd/A), and the lifespan (hr), are measured and listed in Table 1. The HOMO energy level and the LUMO energy level of the organic compounds used in the p-type CGL are measured and listed in Table 2.

TABLE 1

| | HIL | HTL | | V | Cd/A | Lifespan [hr] |
|---|---|---|---|---|---|---|
| Ref1 | HATCN | NPD | — | 6.31 | 2.35 | 31 |
| Ref2 | HATCN | H01 | — | 6.25 | 2.41 | 36 |
| Ref3 | HATCN | — | H33 | 6.28 | 2.29 | 32 |
| Ref4 | HATCN | H01 | H33 | 6.14 | 2.48 | 41 |
| Ex1 | S07 | H01 | — | 4.34 | 4.23 | 55 |
| Ex2 | S07 | — | H33 | 4.36 | 4.19 | 52 |
| Ex3 | S07 | H01 | H33 | 4.15 | 4.46 | 60 |
| Ex4 | S20 | H01 | — | 4.10 | 4.53 | 64 |
| Ex5 | S20 | — | H33 | 4.11 | 4.55 | 65 |
| Ex6 | S20 | H01 | H33 | 4.03 | 4.64 | 72 |
| Ex7 | A13 | H01 | — | 3.94 | 4.75 | 81 |
| Ex8 | A13 | — | H33 | 3.95 | 4.72 | 79 |
| Ex9 | A13 | H01 | H33 | 3.80 | 5.06 | 103 |
| Ex10 | A13 | H15 | H26 | 3.78 | 5.13 | 98 |

TABLE 2

| | HOMO (eV) | LUMO (eV) |
|---|---|---|
| HATCN | −8.55 | −6.07 |
| S07 | −8.21 | −6.34 |
| S20 | −8.27 | −6.46 |
| A13 | −8.22 | −6.32 |
| NPD | −5.45 | −2.18 |
| H01 | −5.46 | −2.19 |
| H15 | −5.38 | −2.12 |
| H26 | −5.51 | −2.25 |
| H33 | −5.59 | −2.28 |
| TCTA | −5.80 | −2.26 |

As shown in Table 1, in comparison to the OLED of Ref1, where NPD is used to form the HTL, the OLEDs of Ref2 to Ref4, where the organic compound in Formula 2 and/or the organic compound in Formula 3 are used to form the HTL, still have a limitation in the driving voltage, the emitting efficiency and the lifespan. Namely, even though the organic compound in Formula 2 and/or the organic compound in Formula 3 are used in the HTL, the energy level between the HIL and the HTL is not matched such that there is a limitation in the properties of the OLEDs of Ref2 to Ref4.

On the other hand, in the OLEDs of Ex1 to Ex10, where the compound in Formula 1-1, i.e., the compound S07, the compound S20 or the compound A13, is used in the HIL and at least one of the compound in Formula 2, i.e., the compound H01 or H15, and the compound in Formula 3, i.e., the compound H26 or H33, is used in the HTL, the driving voltage is significantly decreased, and the emitting efficiency and the lifespan are significantly increased.

In addition, in the OLEDs of Ex3, Ex6, Ex9 and Ex10, where the compound in Formula 2 and the compound in Formula 3 are included in the HTL, the driving voltage is further decreased, and the emitting efficiency and the lifespan are further increased. Moreover, in the OLEDs of Ex 7 to Ex10, where the indacene derivative having an asymmetric structure is included in the p-type CGL, the driving voltage is remarkably decreased, and the emitting efficiency and the lifespan are remarkably increased.

It will be apparent to those skilled in the art that various modifications and variations can be made in the embodiments of the present disclosure without departing from the spirit or scope of the present disclosure. Thus, it is intended that the modifications and variations are covered in this disclosure provided they come within the scope of the appended claims and their equivalents.

What is claimed is:

1. An organic light emitting diode, comprising:
a first electrode;
a second electrode facing the first electrode;
a first emitting part positioned between the first and second electrodes and including a first emitting material layer, a hole injection layer between the first electrode and the first emitting material layer and a first hole transporting layer between the hole injection layer and the first emitting material layer;
a second emitting part including a second emitting material layer and a second hole transporting layer and positioned between the first emitting part and the second electrode, and
a first p-type charge generation layer including a first p-type charge generation material and positioned between the first and second emitting parts,
wherein the hole injection layer includes a hole injection material, and the hole injection material is an organic compound represented in Formula 1-1:

[Formula 1-1]

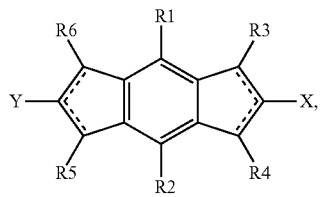

wherein each of R1 and R2 is independently selected from the group consisting of hydrogen (H), deuterium (D), halogen and cyano,
wherein each of R3 to R6 is independently selected from the group consisting of halogen, cyano, malononitrile, C1 to C10 haloalkyl group and C1 to C10 haloalkoxy group, and at least one of R3 and R4 and at least one of R5 and R6 are malononitrile,
wherein each of X and Y is independently phenyl substituted with at least one of C1 to C10 alkyl group, halogen, cyano, malononitrile, C1 to C10 haloalkyl group and C1 to C10 haloalkoxy group,
wherein the first hole transporting layer includes at least one of a first hole transporting material represented in Formula 2 and a second hole transporting material represented in Formula 3:

[Formula 2]

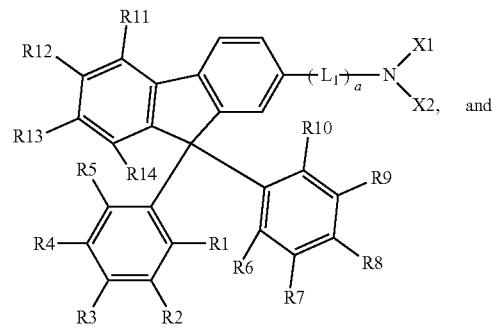

[Formula 3]

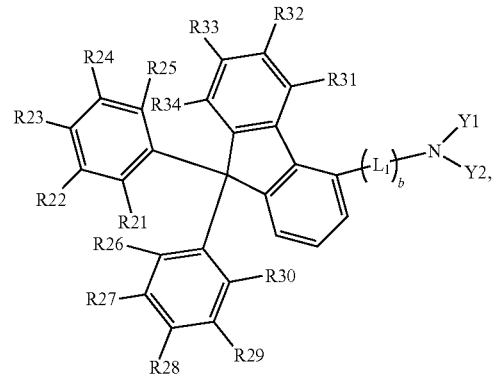

wherein in Formula 2, each of X1 and X2 is independently selected from the group consisting of C6 to C30 aryl group and C5 to C30 heteroaryl group, and L1 is selected from the group consisting of C6 to C30 arylene group and C5 to C30 heteroarylene group,
wherein a is 0 or 1,
wherein each of R1 to R14 is independently selected from the group consisting of H, D, C1 to C10 alkyl group, C6 to C30 aryl group and C5 to C30 heteroaryl group, or adjacent two of R1 to R14 are connected to each other to form a fused ring,
wherein in Formula 3, each of Y1 and Y2 is independently selected from the group consisting of C6 to C30 aryl group and C5 to C30 heteroaryl group, L1 is selected from the group consisting of C6 to C30 arylene group and C5 to C30 heteroarylene group,
wherein b is 0 or 1, and wherein each of R21 to R34 is independently selected from the group consisting of H, D, C1 to C10 alkyl group, C6 to C30 aryl group and C5 to C30 heteroaryl group, or adjacent two of R21 to R34 are connected to each other to form a fused ring.

2. The organic light emitting diode according to claim 1, wherein the hole injection material is represented by one of Formulas 1-2 to 1-4:

[Formula 1-2]

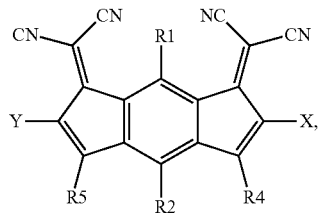

[Formula 1-3]

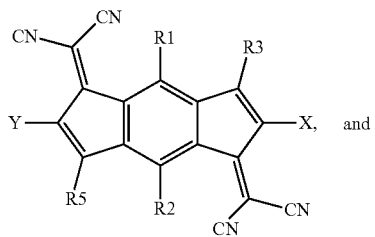

[Formula 1-4]

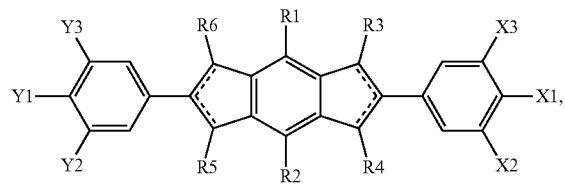

wherein in the Formula 1-4, each of X1 to X3 and each of Y1 to Y3 are independently selected from the group consisting of H, C1 to C10 alkyl group, halogen, cyano, malononitrile, C1 to C10 haloalkyl group and C1 to C10 haloalkoxy group and satisfy at least one of i) X1 and Y1 are different and ii) X2 is different from Y2 and Y3 or X3 is different from Y2 and Y3.

3. The organic light emitting diode according to claim 1, wherein the first hole injection material is one of compounds in Formula 4:

[Formula 4]

S01

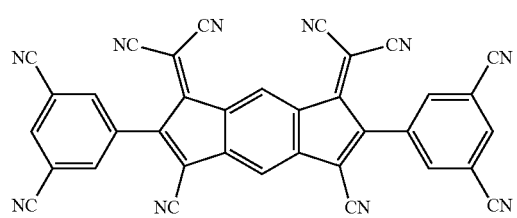

S02

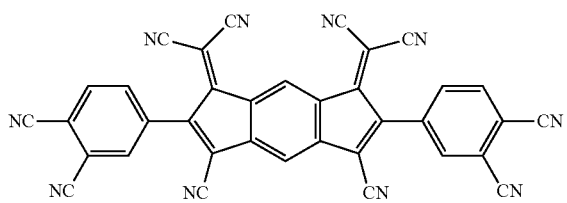

S03

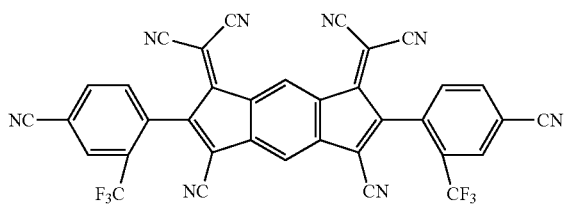

S04

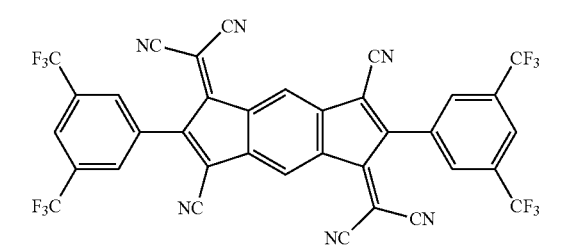

S05

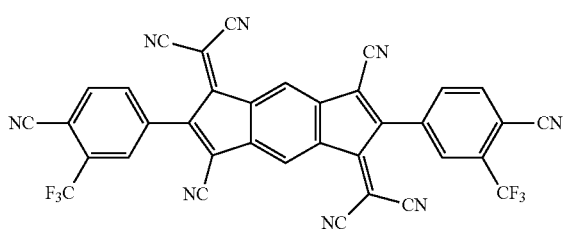

S06

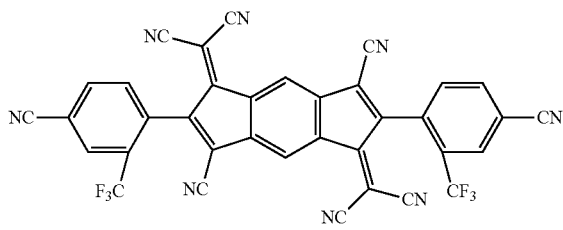

S07

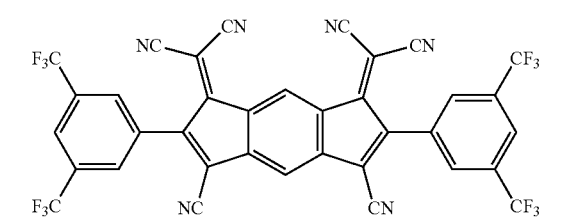

-continued
S08
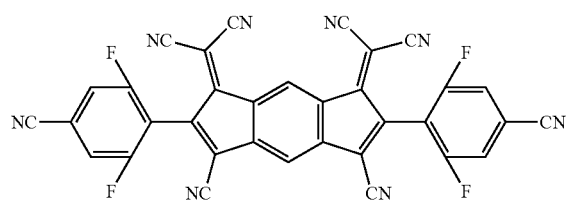
S09
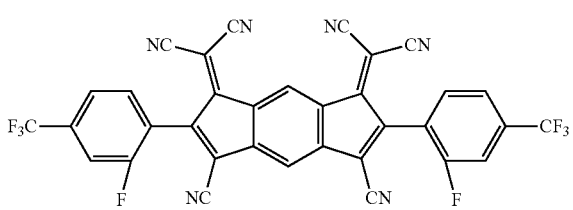
S10
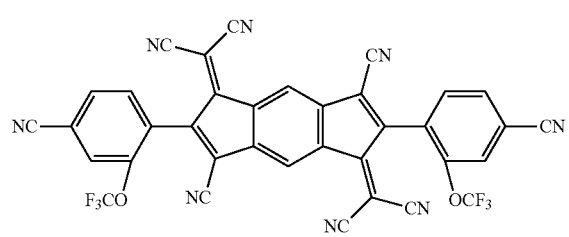
S11
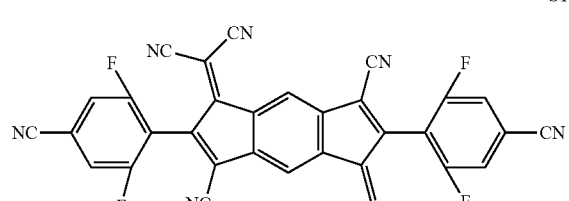
S12
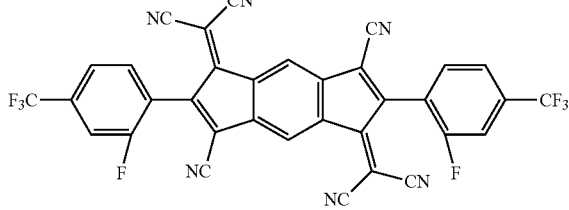
S13
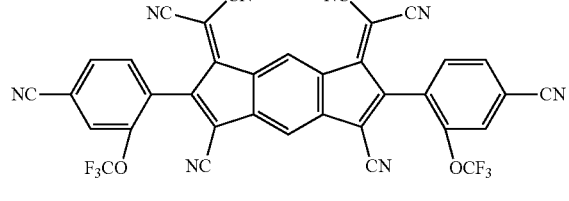
-continued
S14
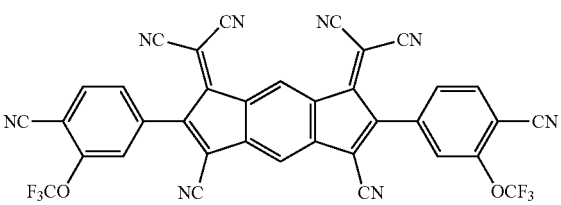
S15
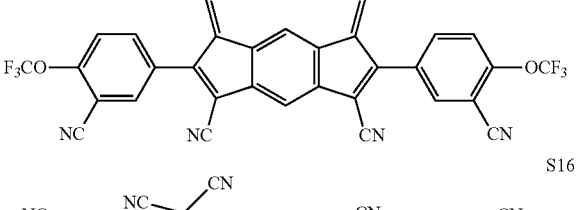
S16
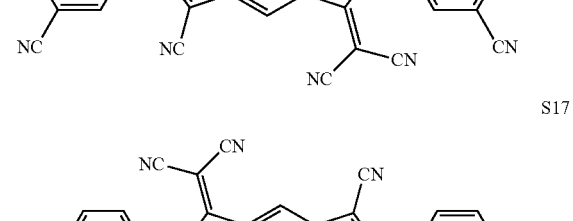
S17
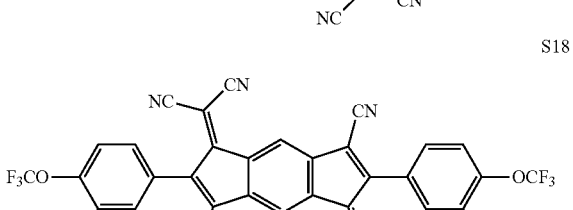
S18
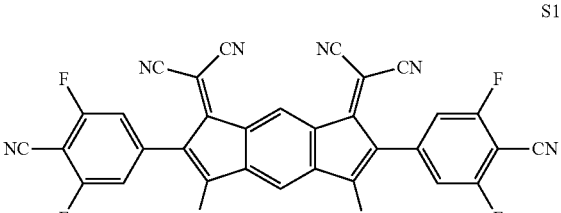
S19
S20
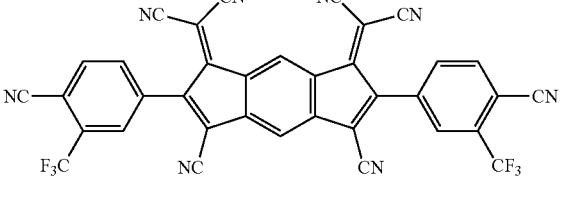

S21
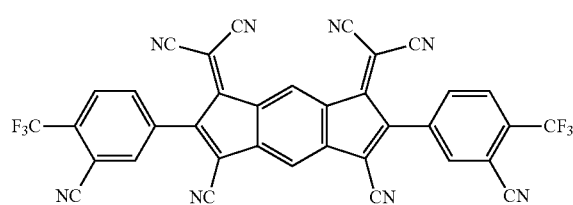
S22
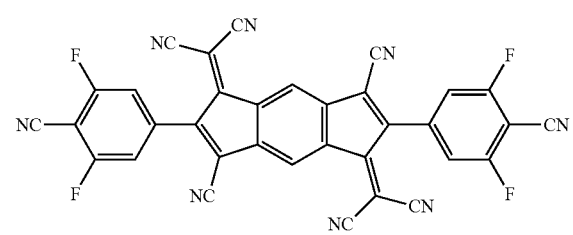
S23
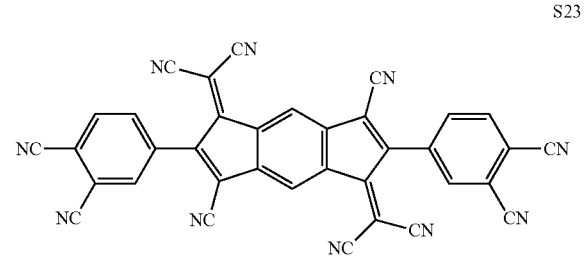
S24
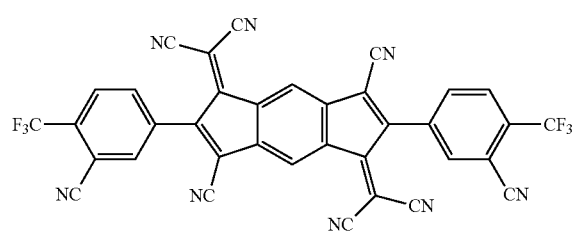
S25
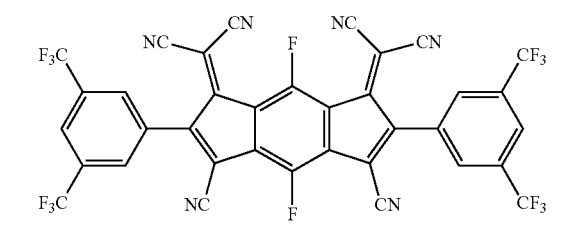
S26
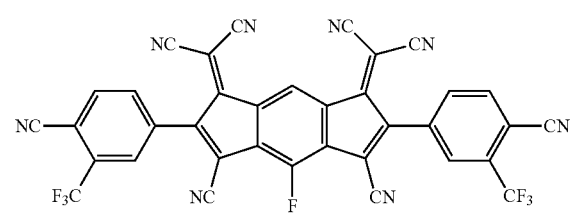
S27
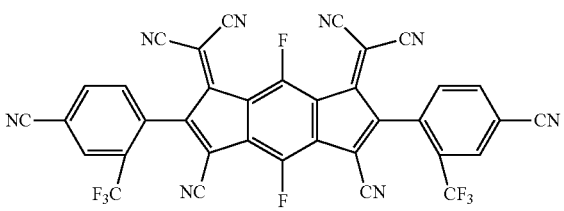
S28
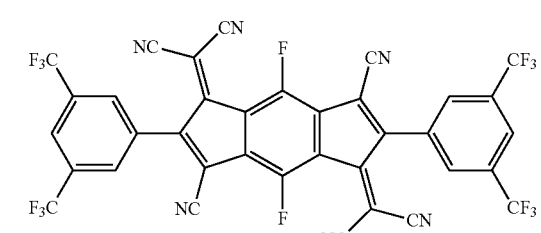
S29
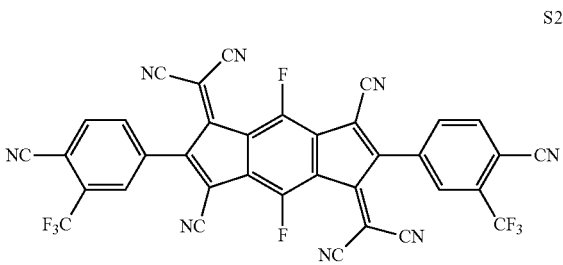
S30
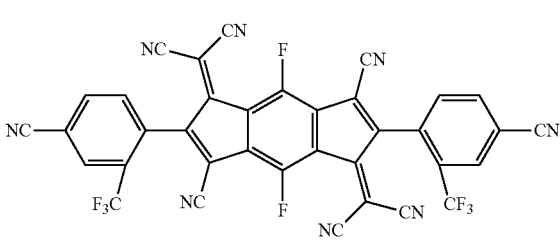
S31
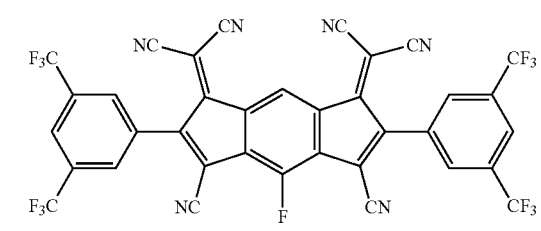
S32
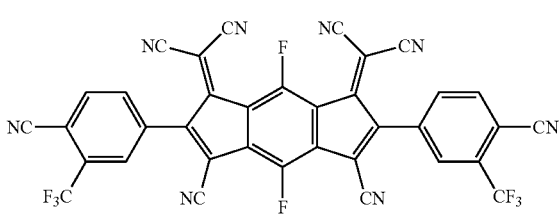

S33
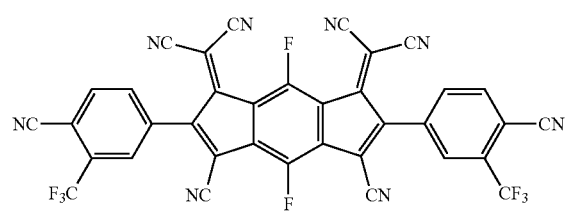
S34
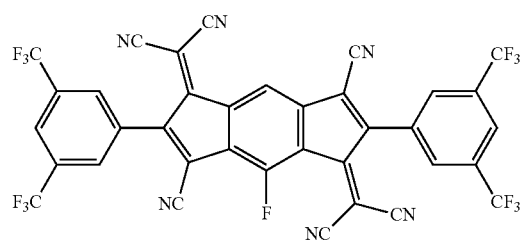
S35
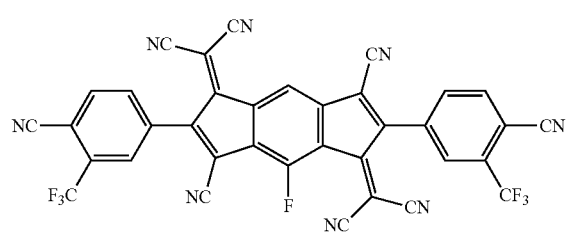
S36
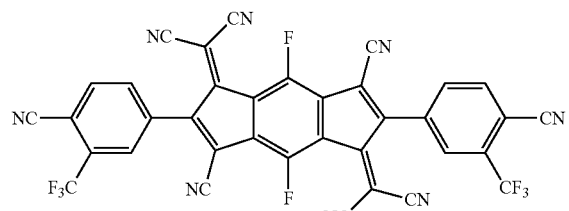
S38
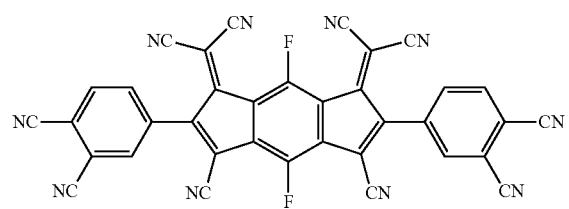
S39
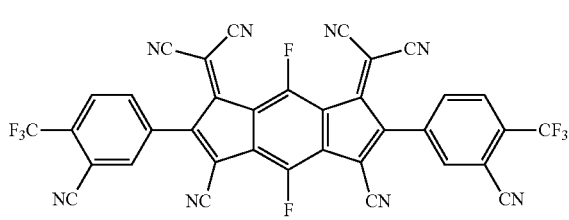
S40
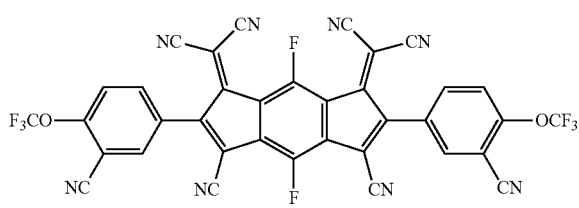
S41
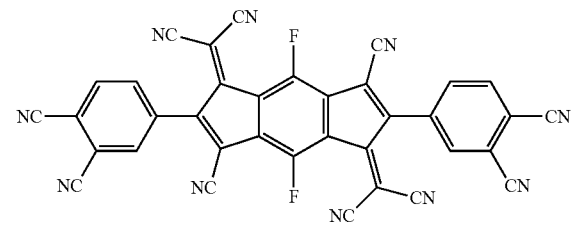
S42
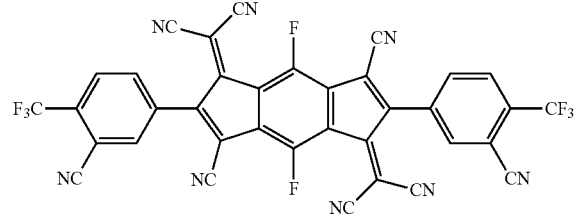
S43
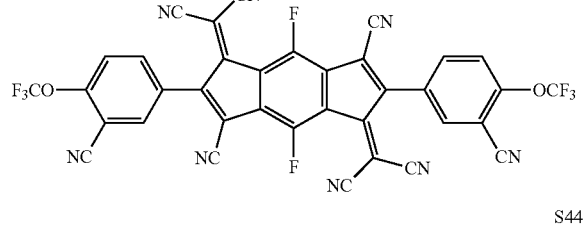
S44
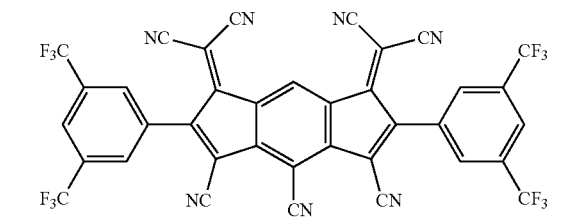
S45
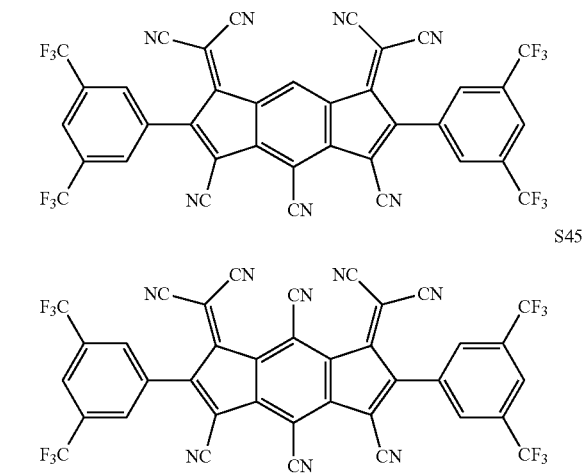

S46
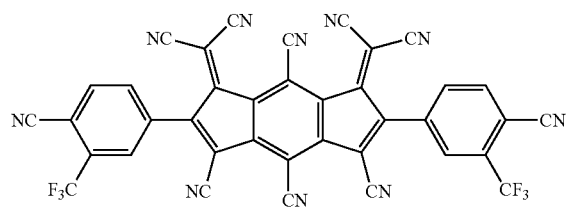
S47
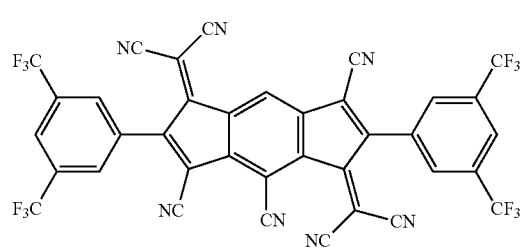
S48
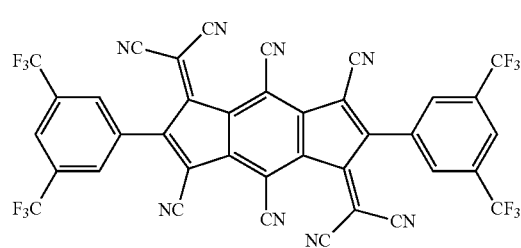
S49
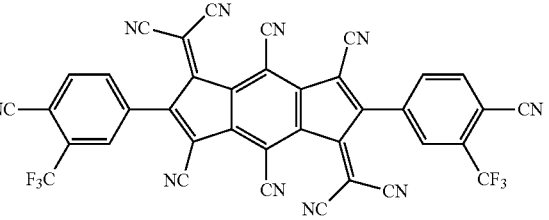
A01
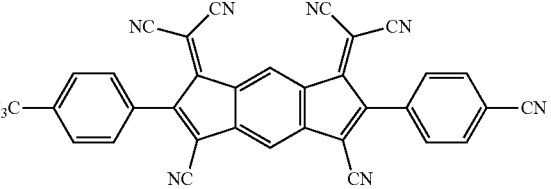
A02
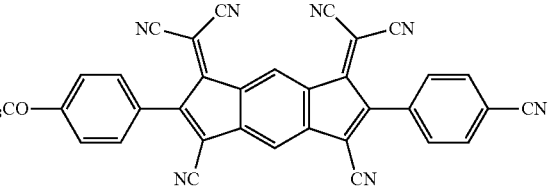
A03
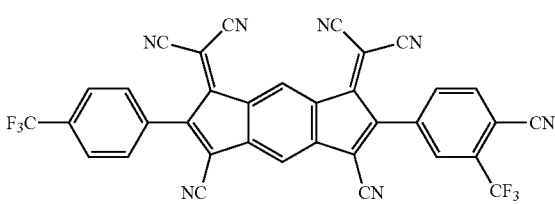
A04
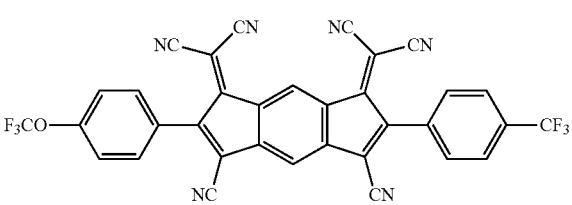
A05
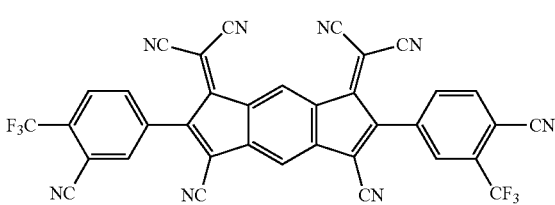
A06
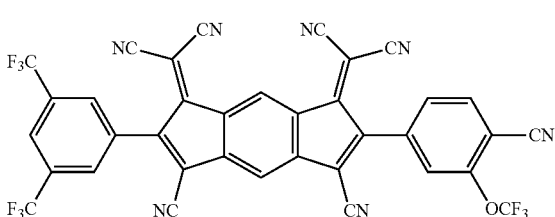
A07
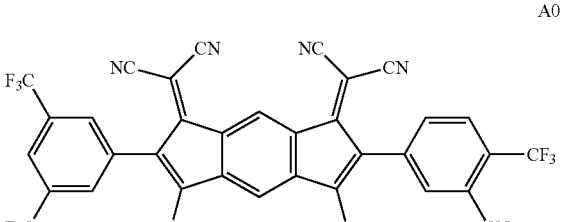
A08
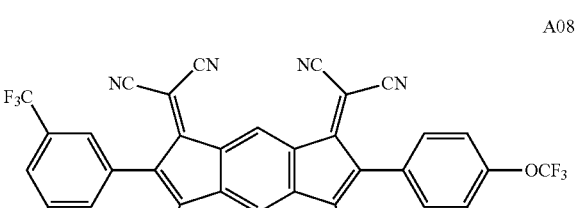
A09
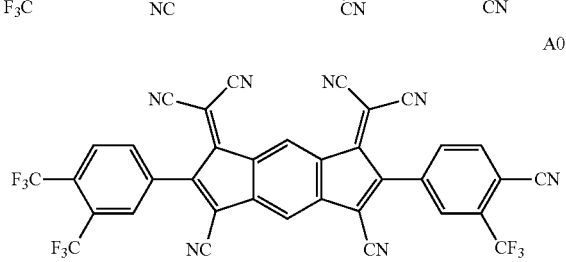

A10 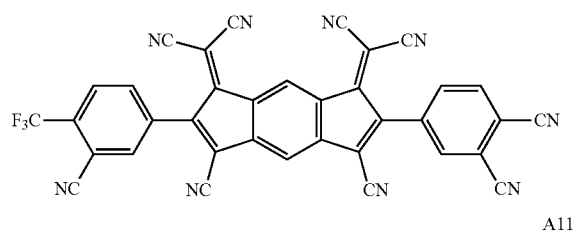
A11 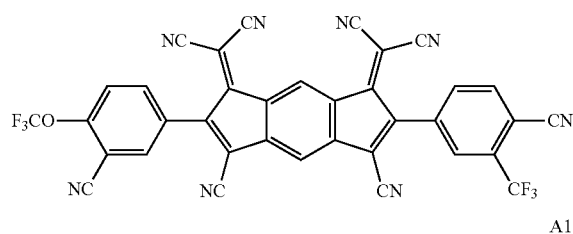
A12 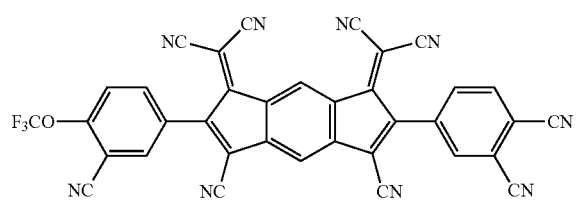
A13 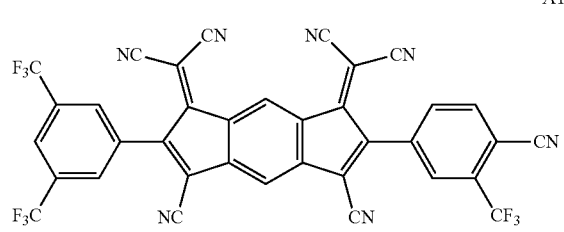
A14 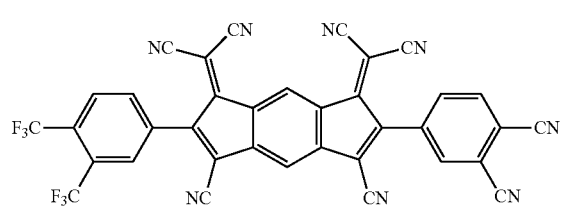
A15 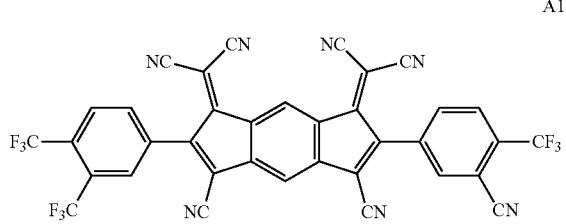
A16 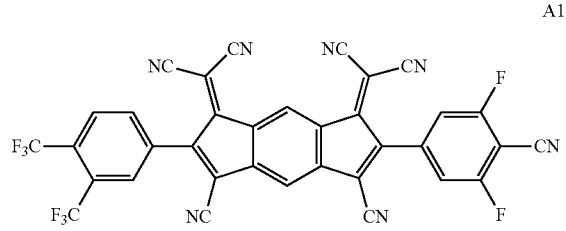
A17 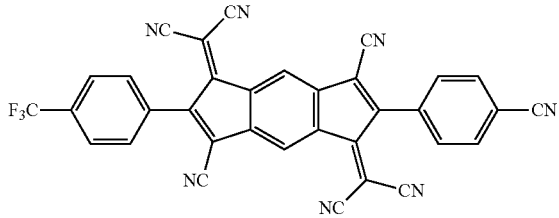
A18 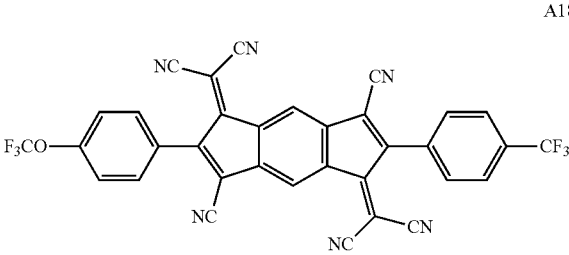
A19 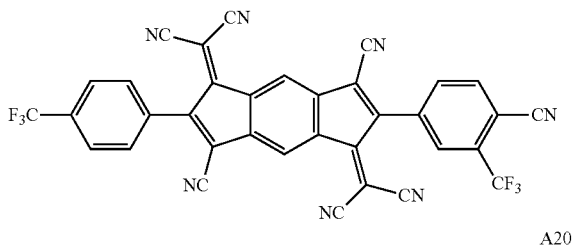
A20 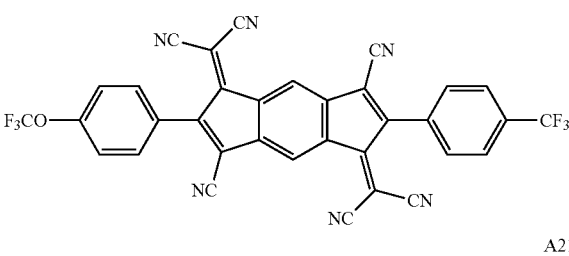
A21 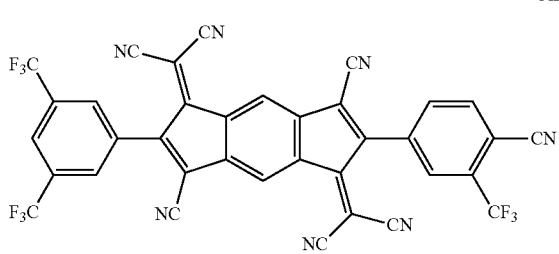
A22 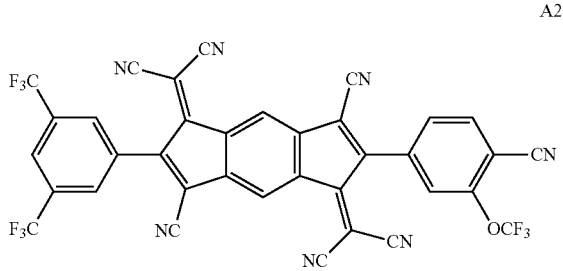

-continued
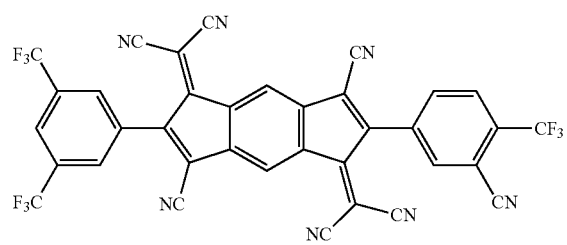
A23
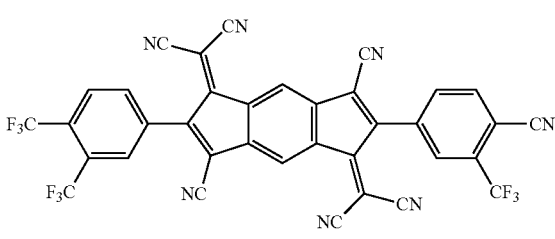
A29
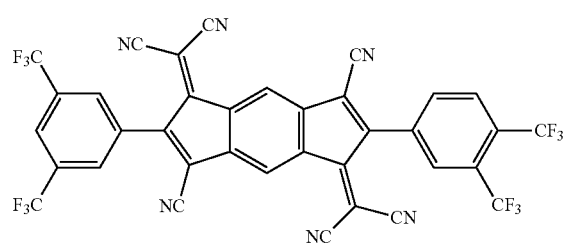
A24
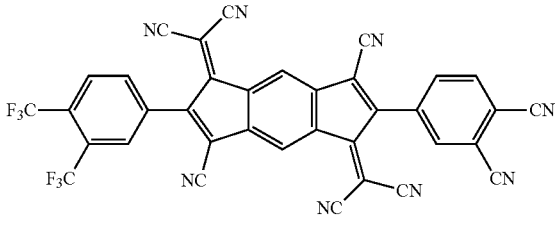
A30
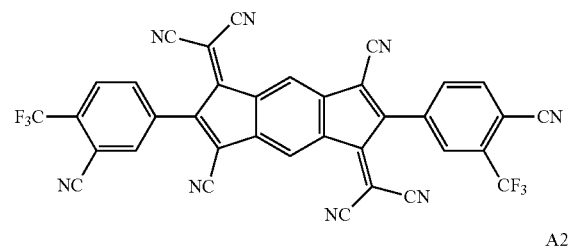
A25
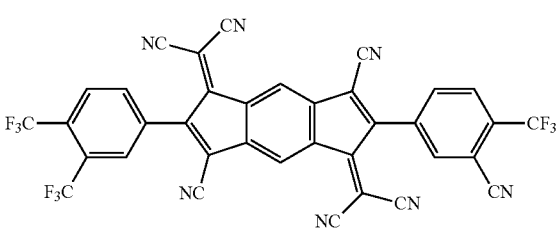
A31
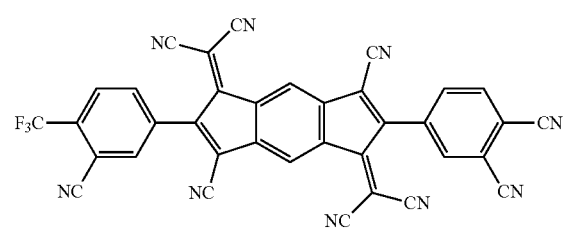
A26
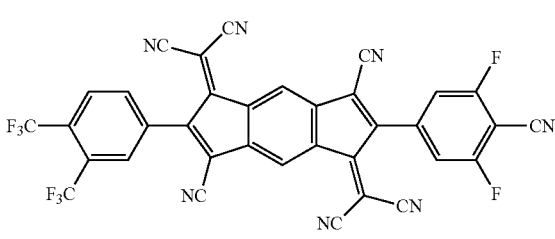
A32
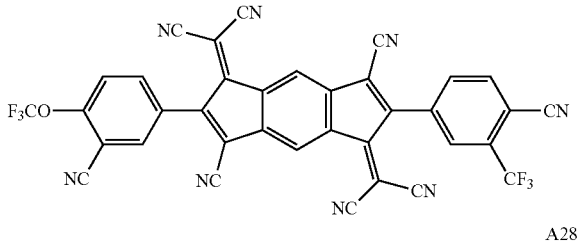
A27
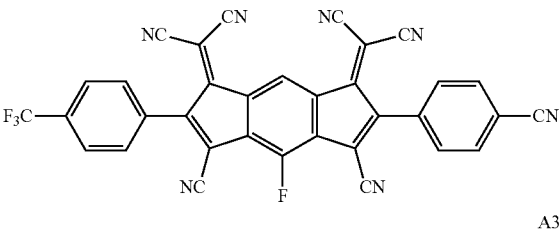
A33
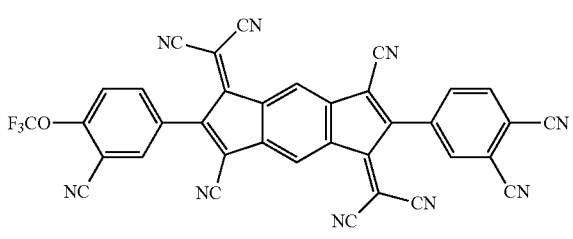
A28
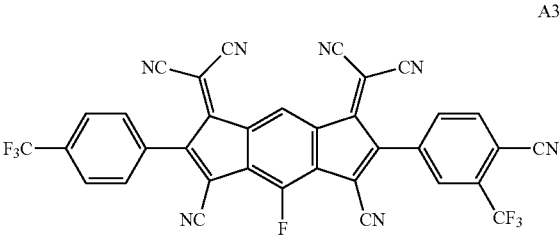
A34

-continued
A35
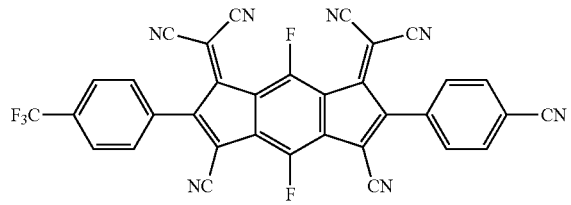
A36
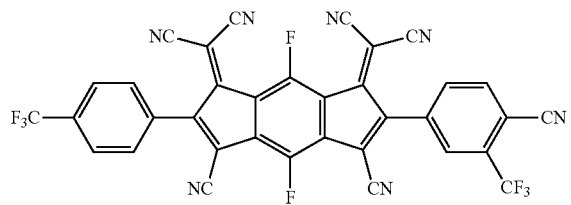
A37
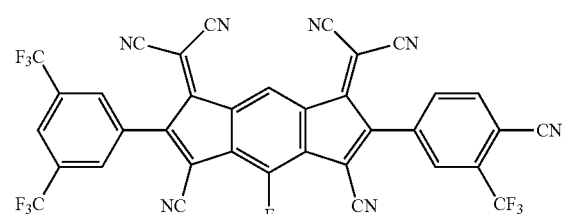
A38
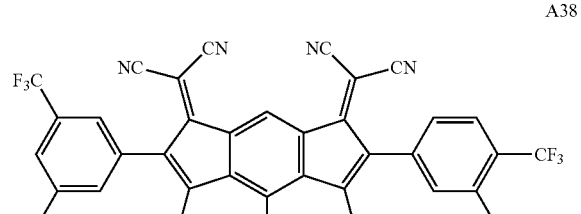
A39
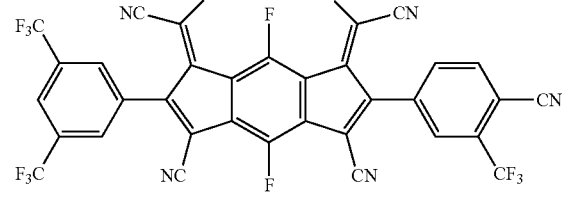
A40
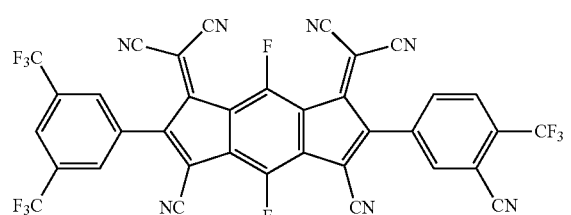
-continued
A41
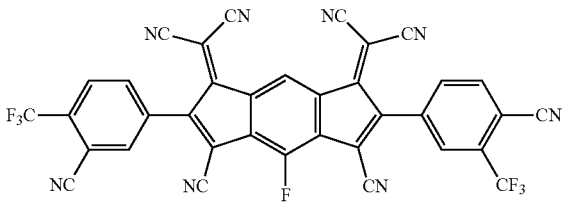
A42
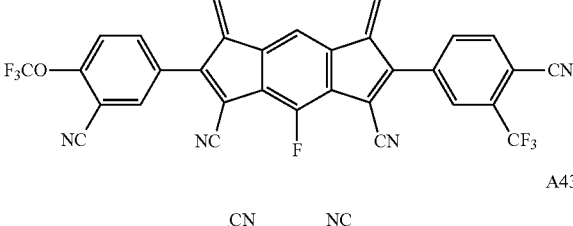
A43
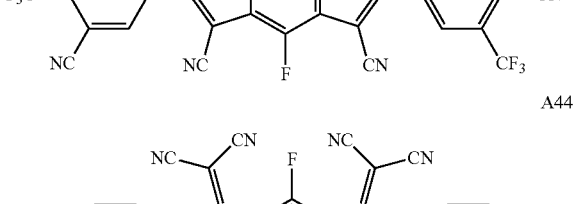
A44
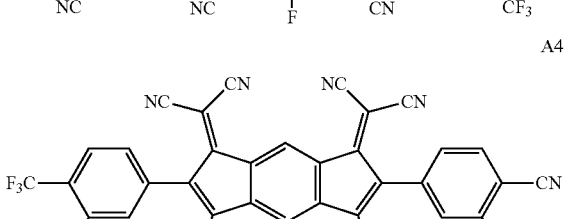
A45
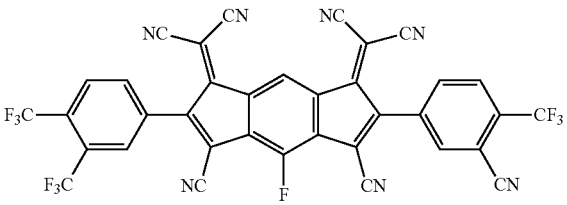
A46
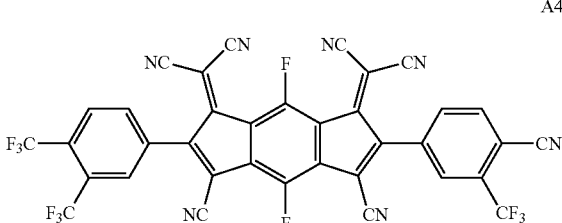
A47

A48
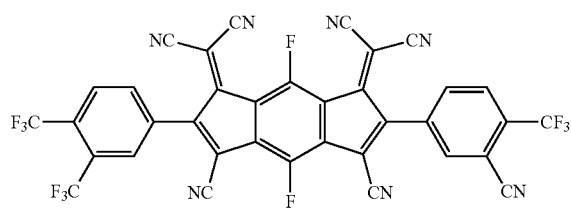
A49
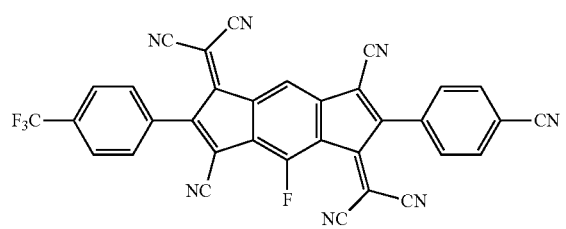
A50
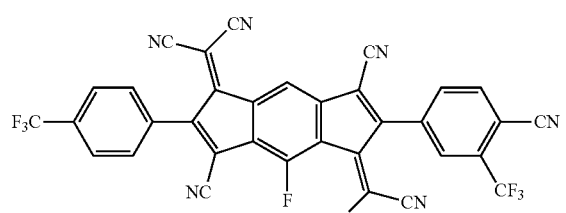
A51
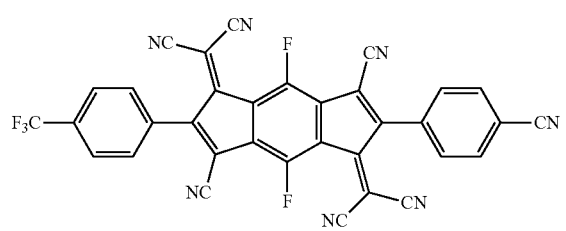
A52
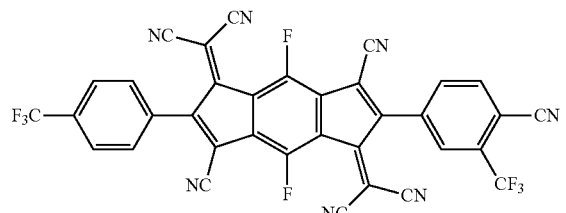
A53
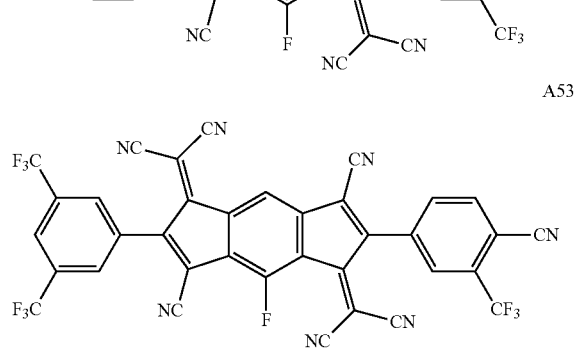
A54
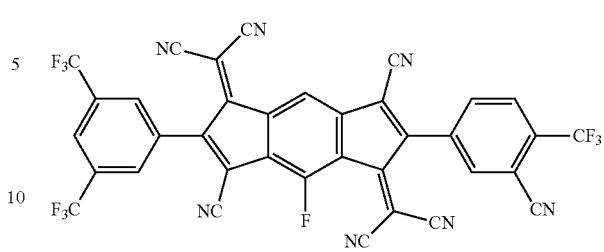
A55
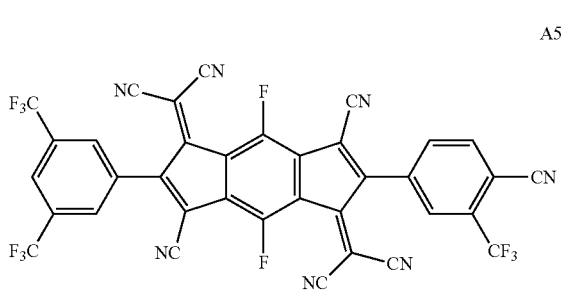
A56
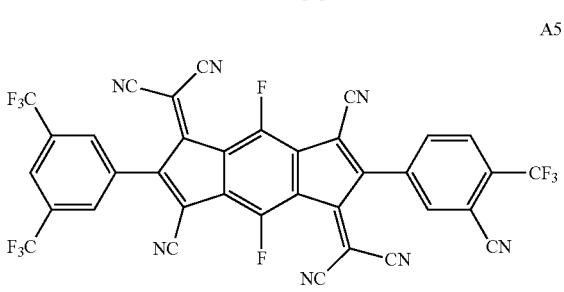
A57
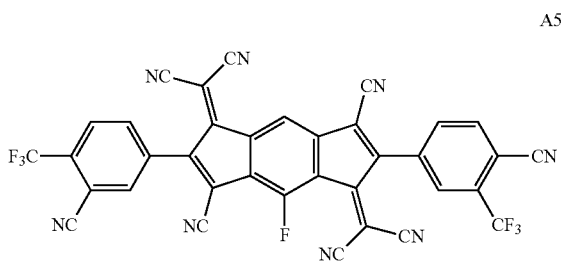
A58
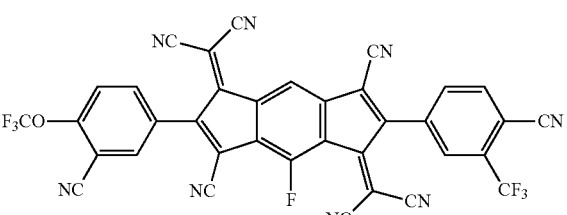
A59
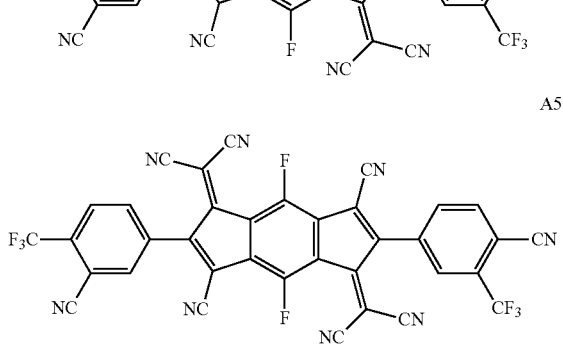

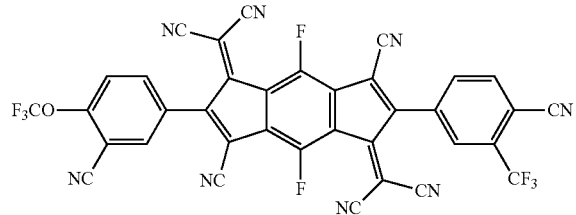

A72 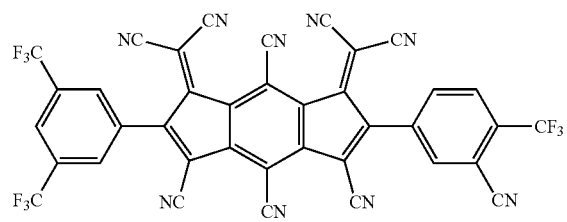
A73 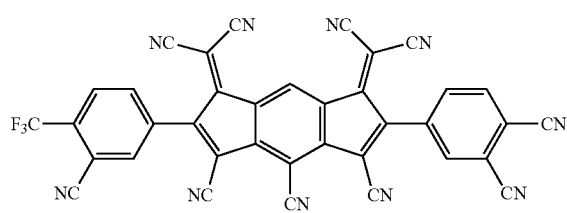
A74 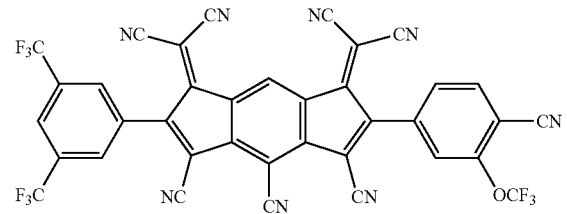
A75 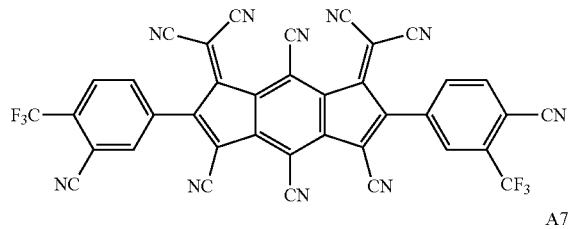
A76 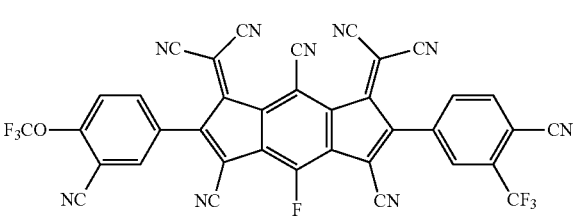
A77 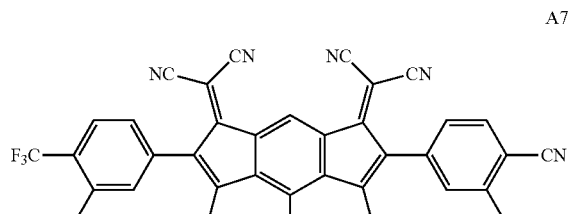
A78 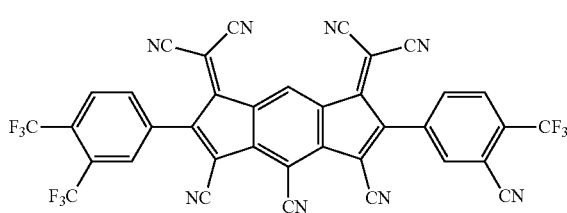
A79 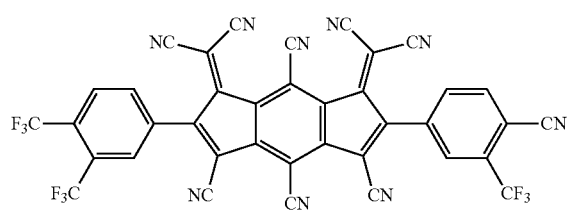
A80 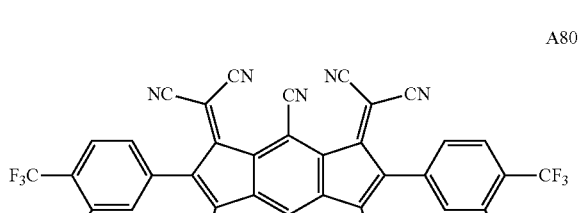
A81 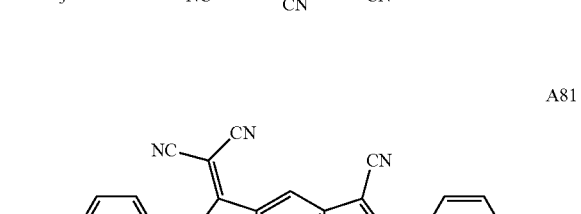
A82 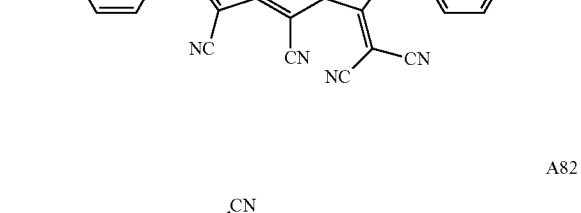
A83 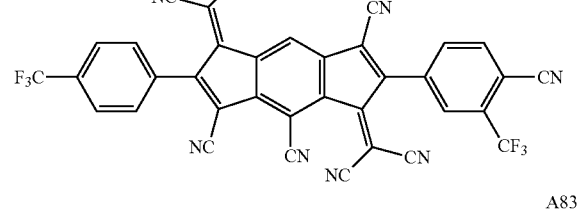
A84 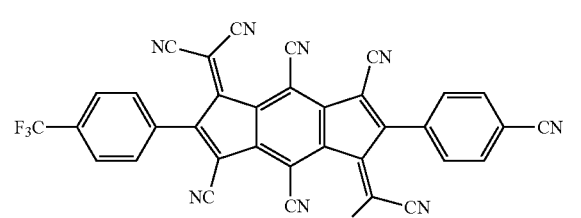

-continued
A85
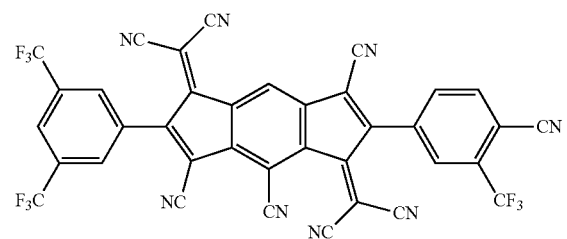
A86
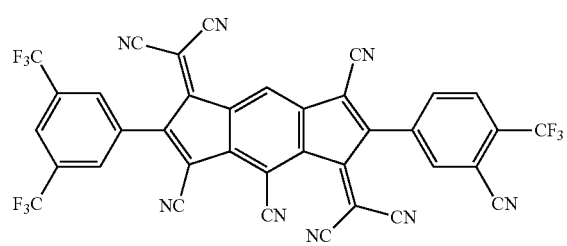
A87
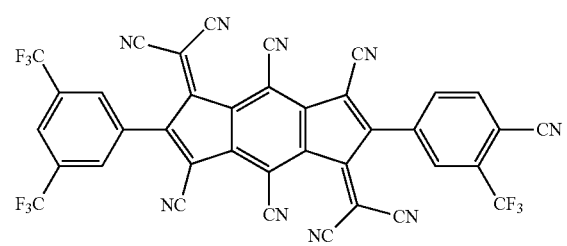
A88
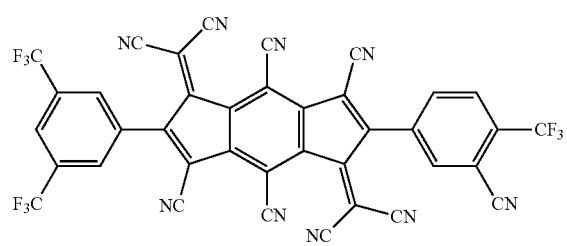
A89
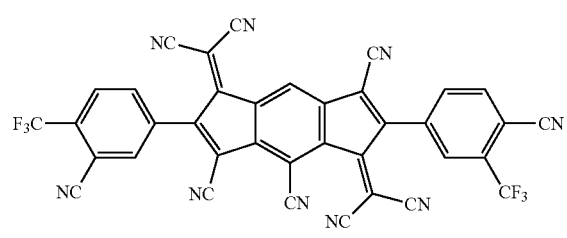
A90
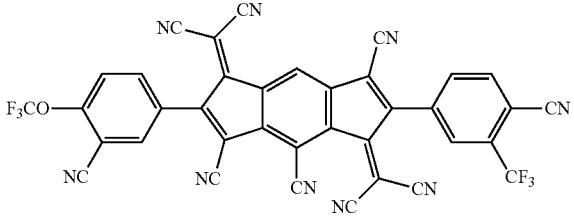
-continued
A91
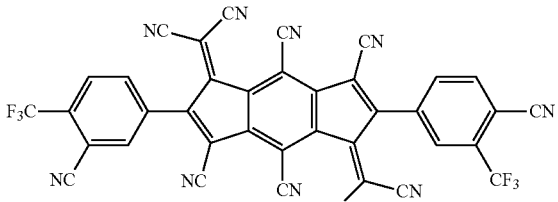
A92
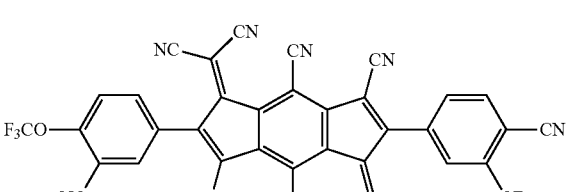
A93
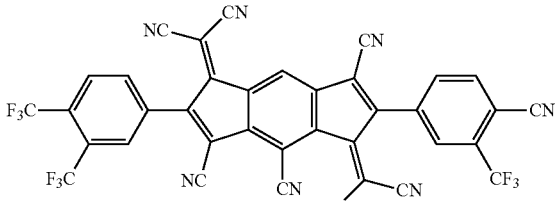
A94
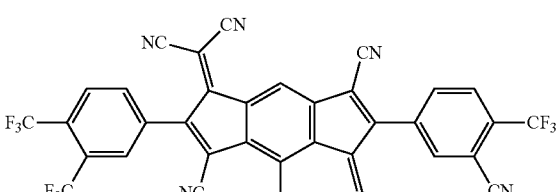
A95
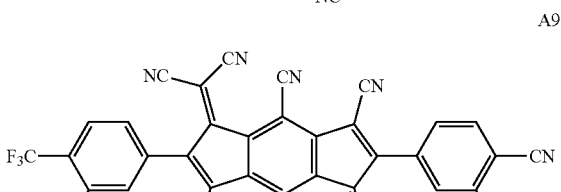
A96
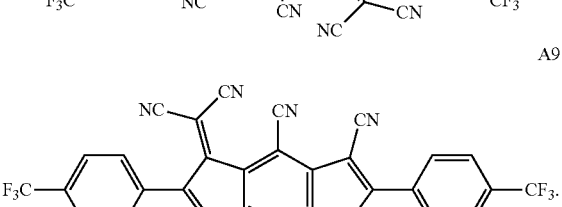
4. The organic light emitting diode according to claim 1, wherein the hole injection layer further includes a hole injection host material, and the hole injection host material is one of 4,4',4"-tris(3-methylphenylamino) triphenylamine (MTDATA), 4,4',4"-tris(N,N-diphenyl-amino)triphenylamine (NATA), 4,4',4"-tris(N-(naphthalene-1-yl)-N-phenylamino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPD), 1,4,5,8,9,11-hexaazatriphenylenehexacarbonitrile(dipyrazino[2,3-f:2'3'-h]quinoxaline-2,3,6,7,10,11-hexacarbonitrile (HAT-CN), 1,3,5-tris[4-(diphenylamino)phenyl]benzene (TDAPB), poly(3,4-ethylenedioxythiphene)polystyrene sulfonate (PEDOT/PSS) and N-(biphenyl-4-yl)-9,9-dimethyl-N-(4-(9-phenyl-9H-carbazol-3-yl)phenyl)-9H-fluoren-2-amine.

5. The organic light emitting diode according to claim 1, wherein the first hole transporting material is one of compounds in Formula 5:

[Formula 5]

H01

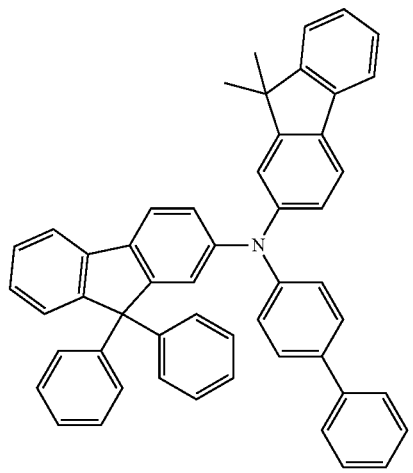

H02

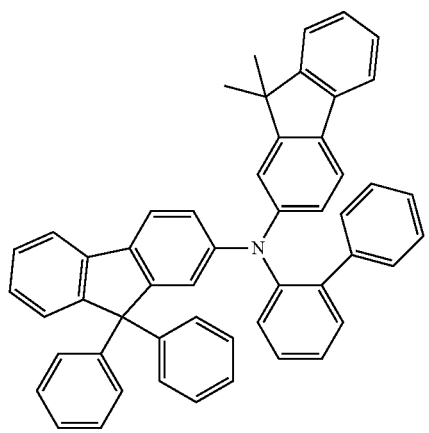

H03

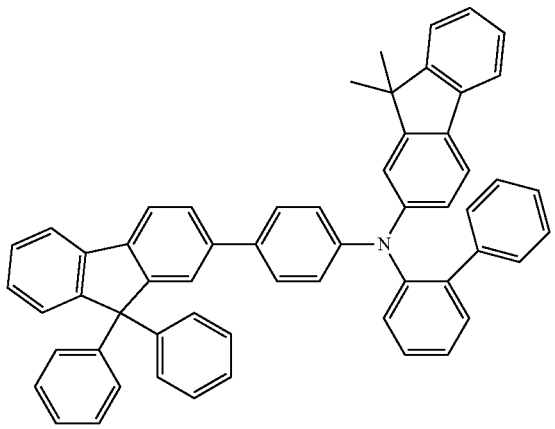

H04

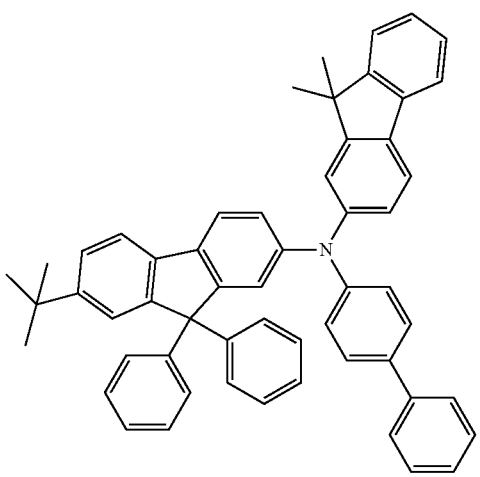

H05

H06
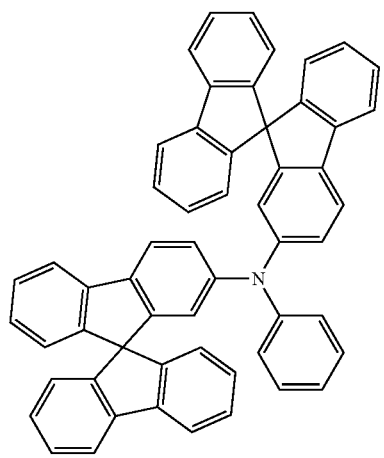
H07
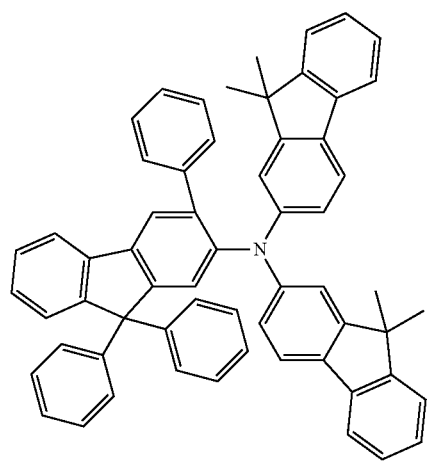
H08
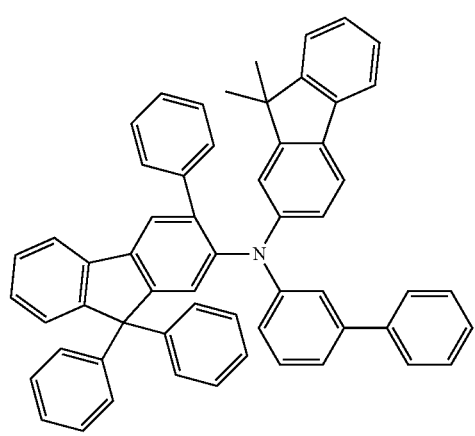
H09
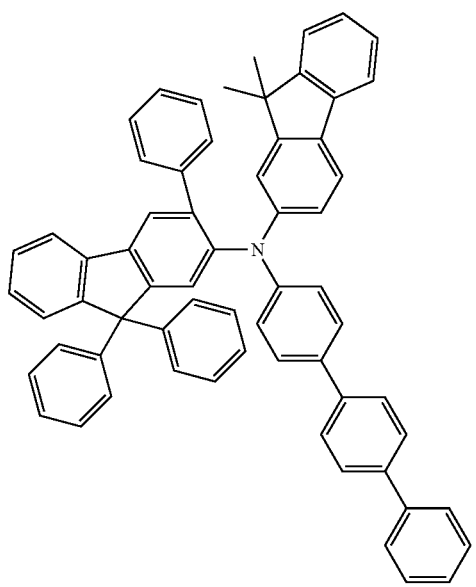
H10
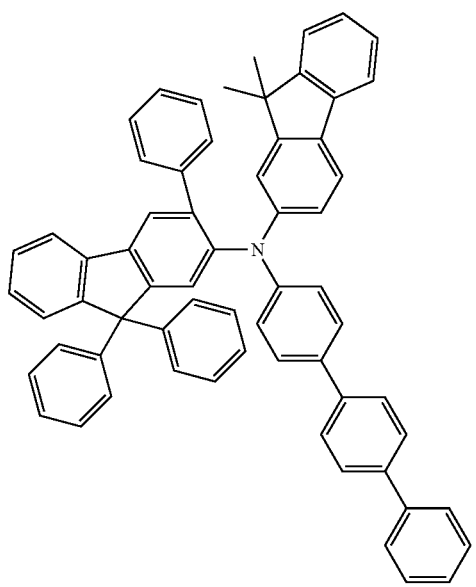
H11
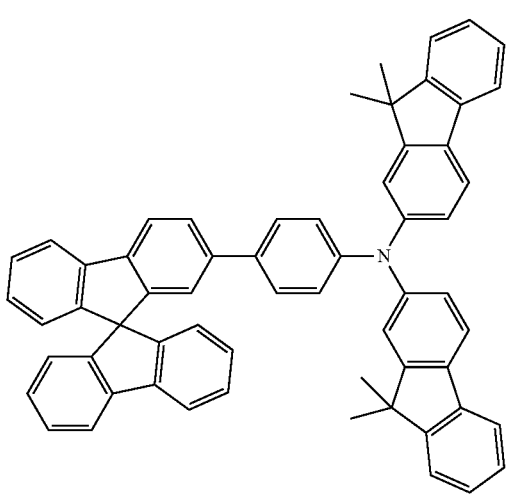

H12
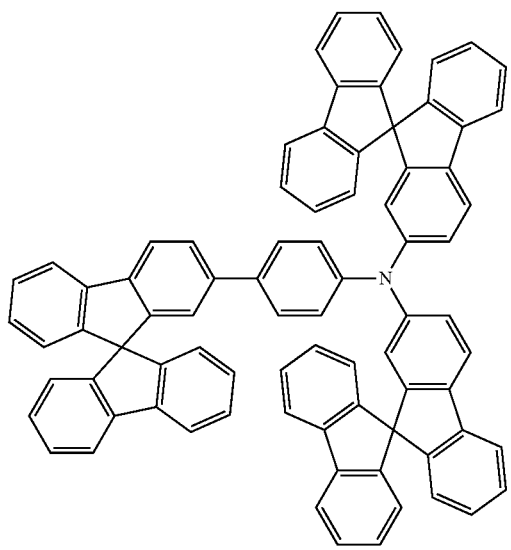
H13
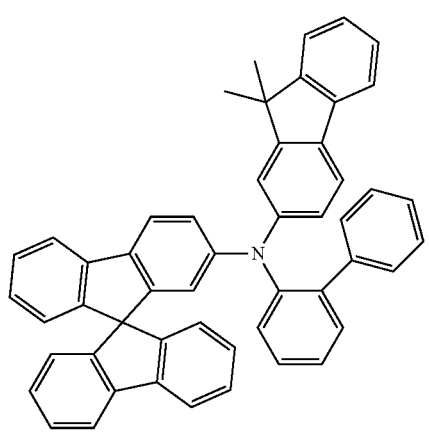
H14
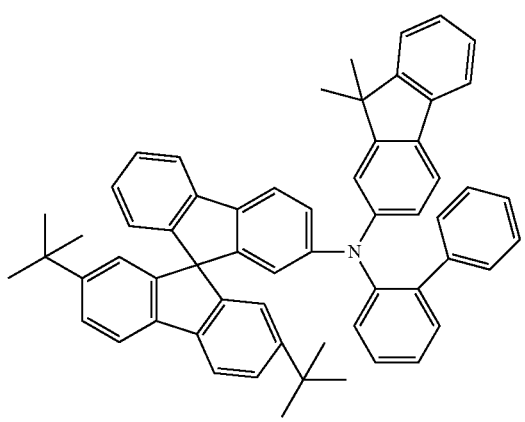
H15
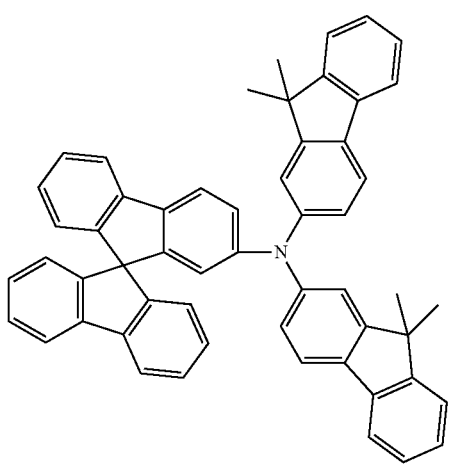
H16
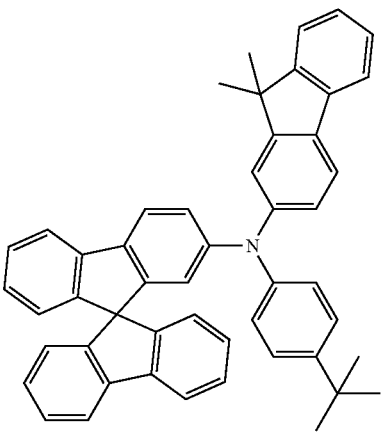
H17
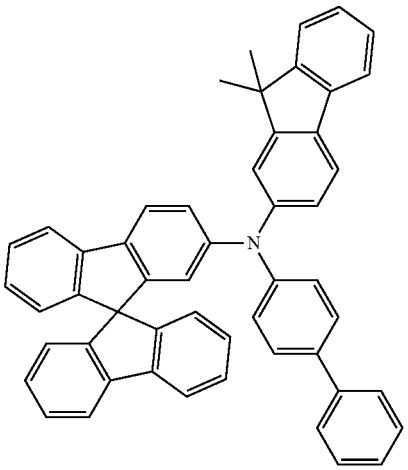

H18
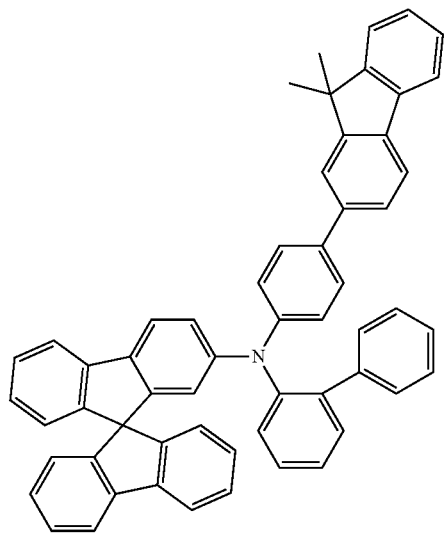
H19
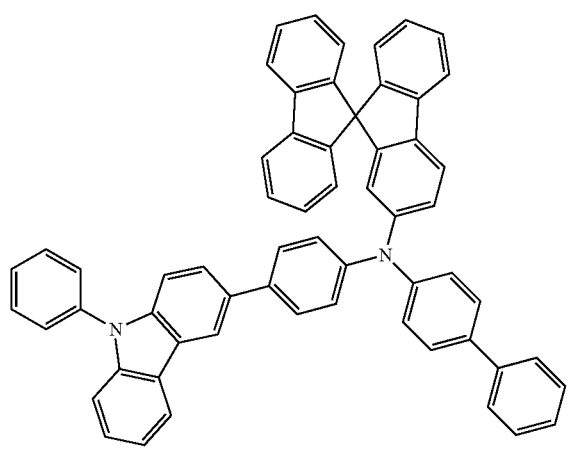
H20
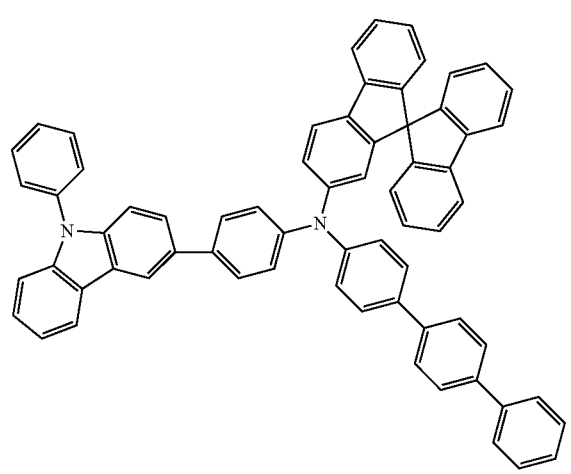
H21
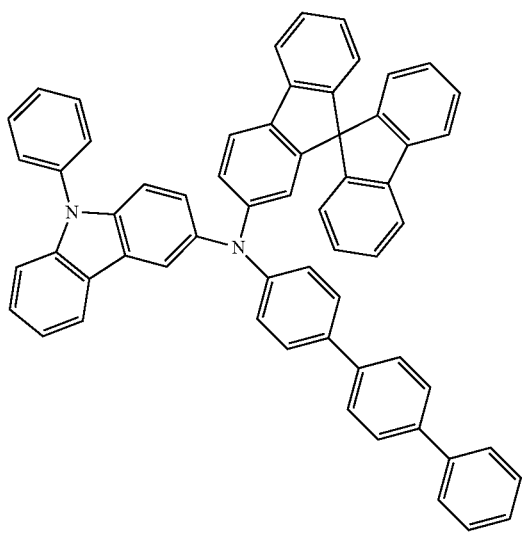
6. The organic light emitting diode according to claim 1, wherein the second hole transporting material is one of compounds in Formula 6:
[Formula 6]
H26
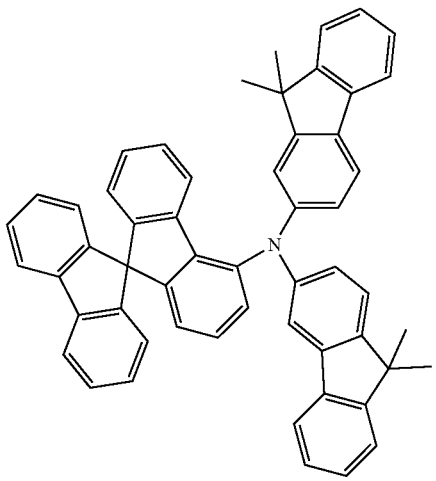
H27
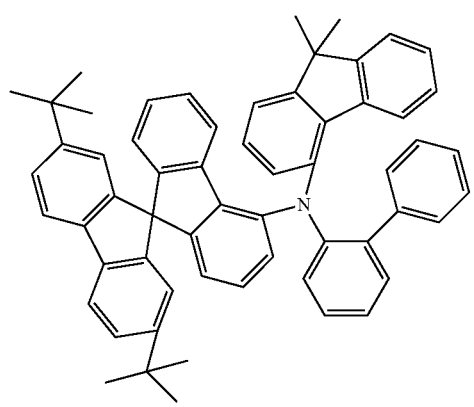

101
-continued
H28
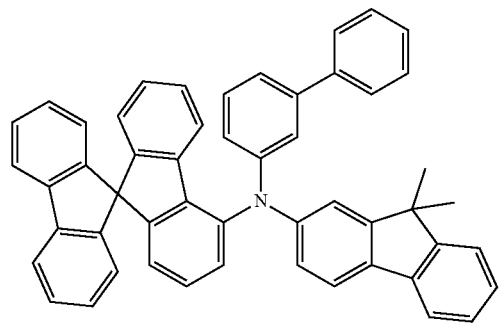
H29
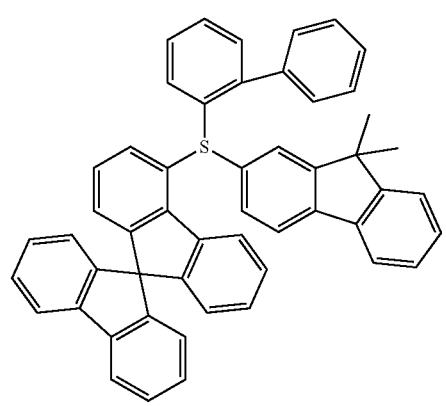
H30
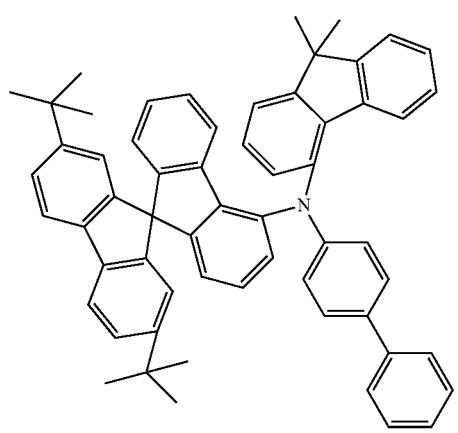
H31
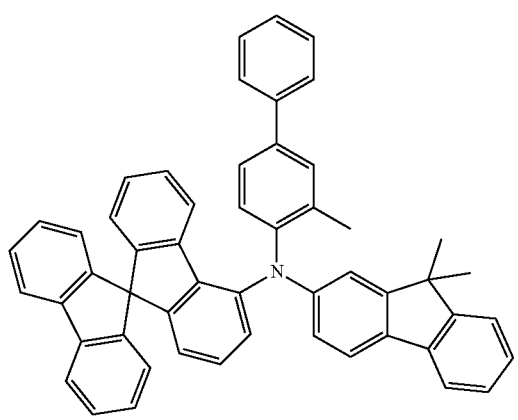
102
-continued
H32
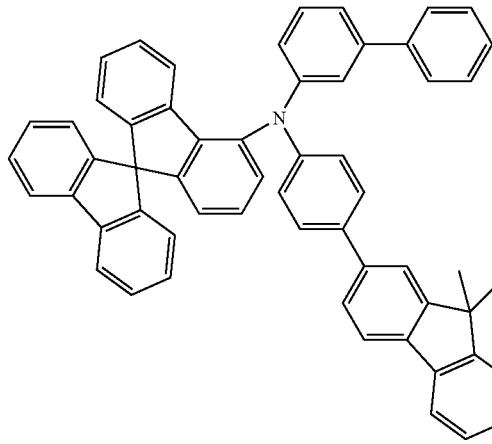
H33
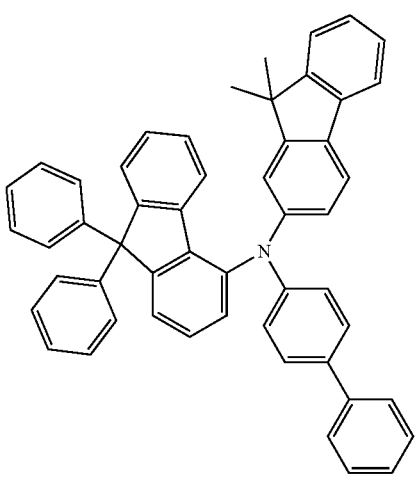
H34
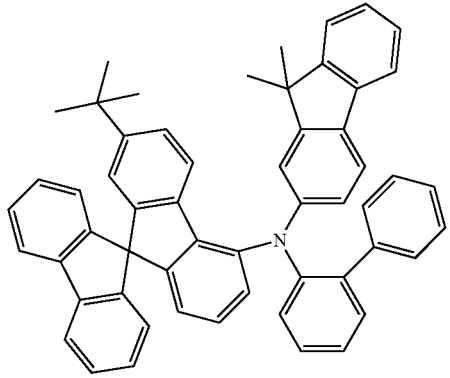

H35

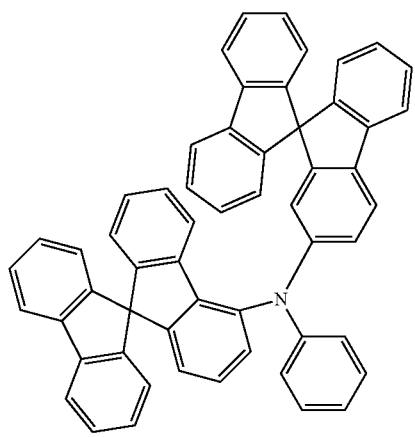

H36

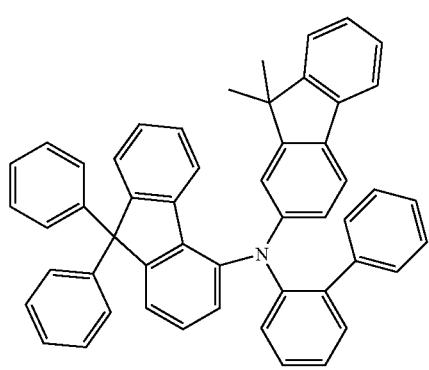

H37

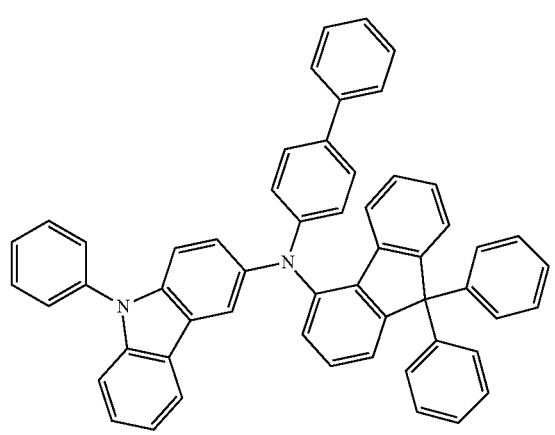

H38

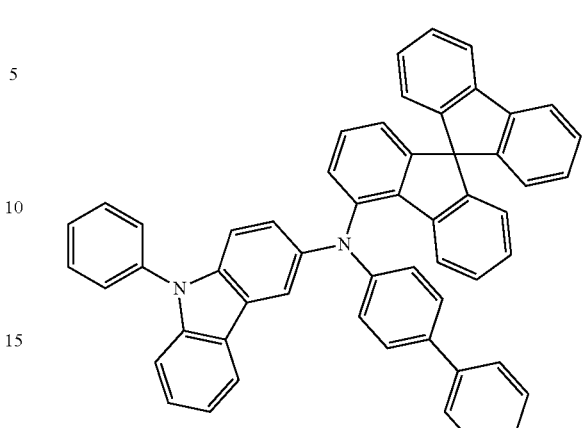

H39

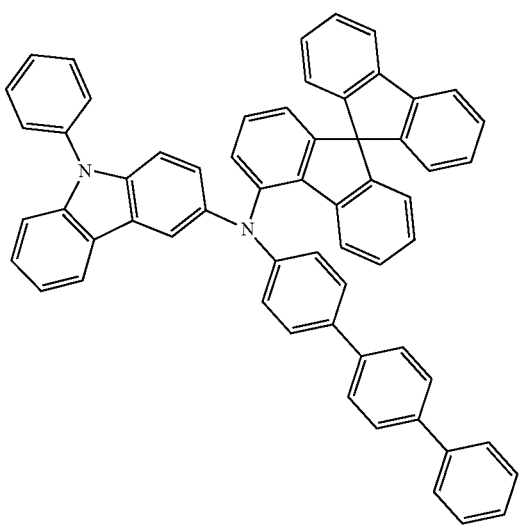

7. The organic light emitting diode according to claim 1, wherein the first hole transporting layer includes the first hole transporting material and the second hole transporting material, and the first and second hole transporting materials have the same weight %.

8. The organic light emitting diode according to claim 1, wherein the second hole transporting layer includes at least one of the first hole transporting material and the second hole transporting material.

9. The organic light emitting diode according to claim 8, wherein the second hole transporting layer includes the first hole transporting material and the second hole transporting material, and the first and second hole transporting materials in the second hole transporting layer have the same weight %.

10. The organic light emitting diode according to claim 1, wherein the first p-type charge generation material is the organic compound in formula 1-1.

11. The organic light emitting diode according to claim 1, wherein the first emitting material layer has an emission wavelength range of 440 to 480 nm, and the second emitting material layer has an emission wavelength range of 500 to 550 nm.

12. The organic light emitting diode according to claim 1, further comprising:

a third emitting part including a third emitting material layer and a third hole transporting layer and positioned between the second emitting part and the second electrode; and a second p-type charge generation layer including a second p-type charge generation material and positioned between the second and third emitting parts.

13. The organic light emitting diode according to claim 12, wherein the third hole transporting layer includes at least one of the first hole transporting material and the second hole transporting material.

14. The organic light emitting diode according to claim 13, wherein the third hole transporting layer includes the first hole transporting material and the second hole transporting material, and the first and second hole transporting materials in the third hole transporting layer have the same weight %.

15. The organic light emitting diode according to claim 12, wherein the second p-type charge generation material is the organic compound in formula 1-1.

16. The organic light emitting diode according to claim 12, wherein each of the first and third emitting material layers has an emission wavelength range of 440 to 480 nm, and the second emitting material layer has an emission wavelength range of 500 to 550 nm.

17. An organic light emitting device, comprising:
a substrate;
an organic light emitting diode of claim 1 positioned on the substrate; and
an encapsulation film covering the organic light emitting diode.

18. The organic light emitting device according to claim 17, wherein a red pixel, a green pixel and a blue pixel are defined on the substrate, and the organic light emitting diode corresponds to each of the red, green and blue pixels, and
wherein the organic light emitting device further includes:
a color filter layer disposed between the substrate and the organic light emitting diode or on the organic light emitting diode and corresponding to the red, green and blue pixels.

* * * * *